United States Patent
Yamaguchi et al.

(10) Patent No.: US 6,696,323 B2
(45) Date of Patent: Feb. 24, 2004

(54) METHOD OF MANUFACTURING SEMICONDUCTOR DEVICE HAVING TRENCH FILLED UP WITH GATE ELECTRODE

(75) Inventors: Hitoshi Yamaguchi, Obu (JP); Toshio Sakakibara, Nishio (JP); Jun Sakakibara, Anjo (JP); Takumi Shibata, Kariya (JP); Toshiyuki Morishita, Iwakura (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/340,746

(22) Filed: Jan. 13, 2003

(65) Prior Publication Data

US 2003/0141514 A1 Jul. 31, 2003

Related U.S. Application Data

(62) Division of application No. 09/688,154, filed on Oct. 16, 2000, now Pat. No. 6,525,375.

(30) Foreign Application Priority Data

| Oct. 19, 1999 | (JP) | 11-297385 |
| Jan. 17, 2000 | (JP) | 2000-10350 |
| Aug. 4, 2000 | (JP) | 2000-237346 |

(51) Int. Cl.$^7$ .......................................... H01L 21/332
(52) U.S. Cl. .................. 438/138; 438/272; 438/589
(58) Field of Search ................... 438/133, 137, 438/138, 212, 270, 271, 272, 589

(56) References Cited

U.S. PATENT DOCUMENTS

| 5,777,346 A | * | 7/1998 | Temple | 438/133 |
| 5,828,101 A | | 10/1998 | Endo | 257/330 |
| 6,174,773 B1 | * | 1/2001 | Fujishima | 438/272 |
| 6,238,981 B1 | * | 5/2001 | Grebs | 438/272 |
| 6,245,615 B1 | | 6/2001 | Noble et al. | 438/270 |
| 6,281,547 B1 | | 8/2001 | So et al. | 257/330 |

FOREIGN PATENT DOCUMENTS

| JP | A-61-125174 | 6/1986 |
| JP | A-63-66963 | 3/1988 |
| JP | A-3-283669 | 12/1991 |
| JP | A-4-162572 | 6/1992 |
| JP | A-5-82782 | 4/1993 |
| JP | A-8-204195 | 8/1996 |
| JP | A-10-214969 | 8/1998 |
| JP | A-11-103058 | 4/1999 |
| JP | A-11-150265 | 6/1999 |
| JP | A-10-09662 | 1/2002 |

* cited by examiner

*Primary Examiner*—Chandra Chaudhari
(74) *Attorney, Agent, or Firm*—Posz & Bethards, PLC

(57) ABSTRACT

In a semiconductor device, a p-type base region is provided in an n$^-$-type substrate to extend from a principal surface of the substrate in a perpendicular direction to the principal surface. An n$^+$-type source region extends in the p-type base region from the principal surface in the perpendicular direction, and an n$^+$-type drain region extends in the substrate separately from the p-type base region with a drift region interposed therebetween. A trench is formed to penetrate the p-type base region from the n$^+$-type source region in a direction parallel to the principal surface. A gate electrode is formed in the trench through a gate insulating film. Accordingly, a channel region can be formed with a channel width in a depth direction of the trench when a voltage is applied to the gate electrode.

9 Claims, 53 Drawing Sheets

FIG. 24A  FIG. 24B
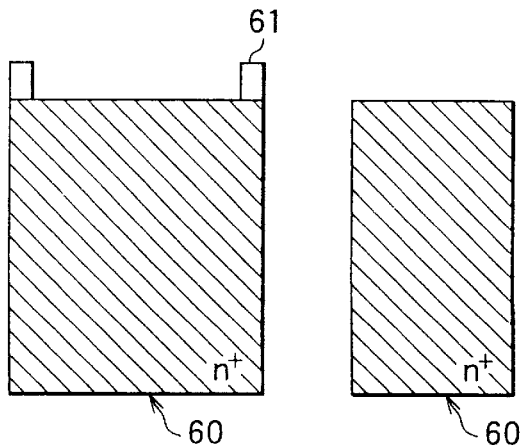
FIG. 24C
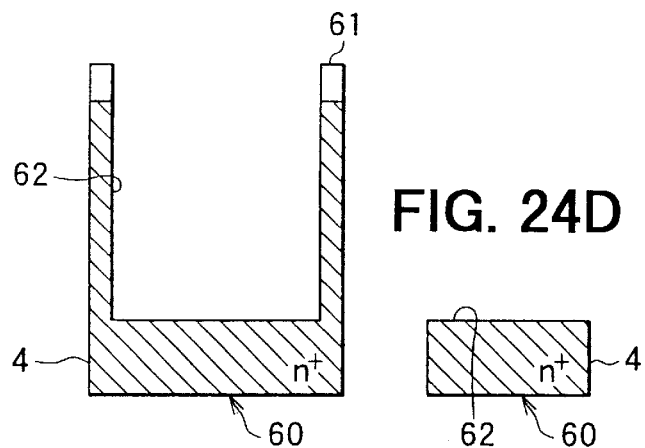
FIG. 24D
FIG. 24E
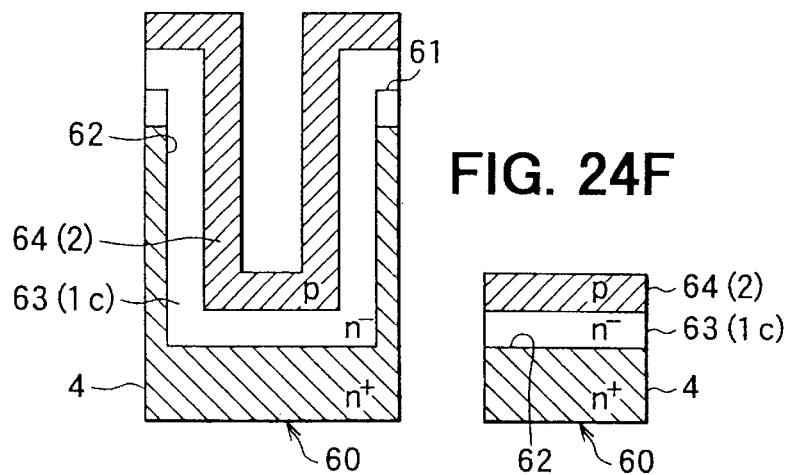
FIG. 24F

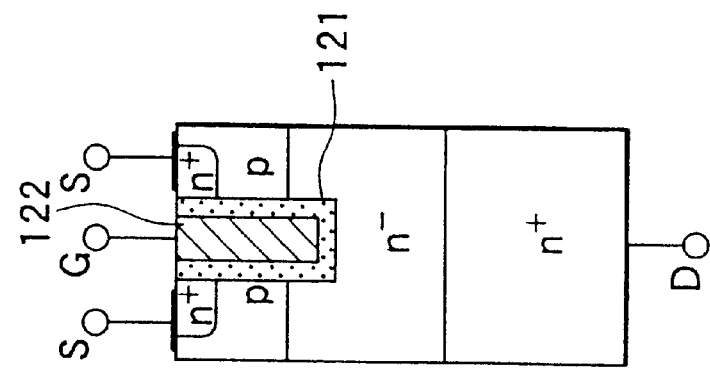
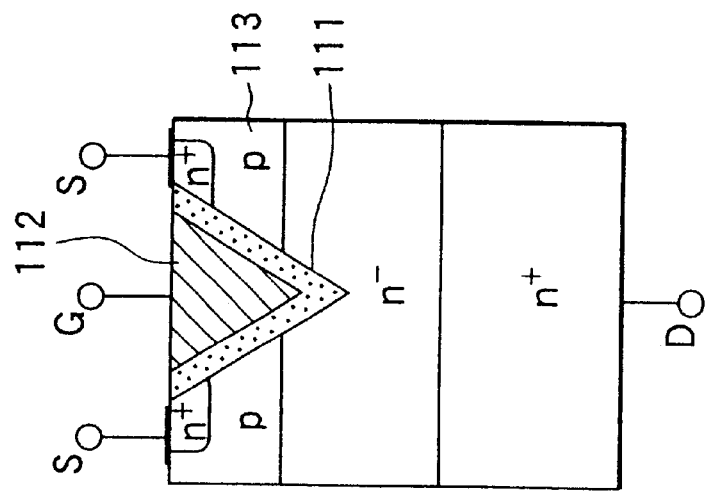
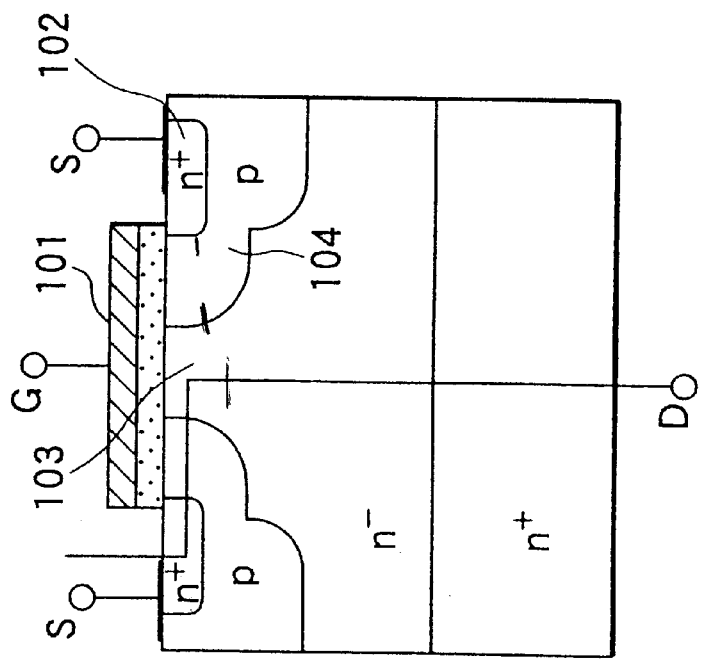

METHOD OF MANUFACTURING SEMICONDUCTOR DEVICE HAVING TRENCH FILLED UP WITH GATE ELECTRODE

CROSS REFERENCE TO RELATED APPLICATIONS

This application is a division of U.S. patent application Ser. No. 09/688,154 filed on Oct. 16, 2000, now U.S. Pat. No. 6,525,375 entitled SEMICONDUCTOR DEVICE HAVING TRENCH FILLED UP WITH GATE ELECTRODE AND METHOD OF MANUFACTURING THE SAME, which is based upon and claims the benefit of Japanese Patent Application Nos.: 11-297385 filed on Oct. 19, 1999, 2000-10350 filed on Jan. 17, 2000 and 2000-237346 filed on Aug. 4, 2000, the contents of which are incorporated herein by reference.

BACKGROUND OF THE INVENTION

1. Field of the Invention

The present invention relates to a semiconductor device of insulated gate type, which is particularly well suited for applications to a power MOS transistor, an IGBT and a thyristor.

2. Description of the Related Art

A planar type MOSFET, a V-groove type MOSFET and a trench type MOSFET have heretofore been known as power MOS transistors, which are shown in FIGS. 52A to 52C, respectively. The planar type MOSFET shown in FIG. 52A is such that a voltage is applied to a gate electrode 101, whereby a current is caused to flow in the lateral direction of a substrate with an inversion type channel being a surface part of a p-type base region 104 between an n-type source region 102 and an n-type drift region 103.

The V-groove type MOSFET shown in FIG. 52B is so constructed that a gate electrode 112 is arranged within a V-shaped groove 111. This V-groove type MOSFET operates similarly to the planar type MOSFET. Since, however, a p-type base region 113 sideward of the V-shaped groove 111 is used as an inversion type channel, a current comes to flow in a depth direction of a substrate. Accordingly, the substrate area of the V-groove type MOSFET required per cell can be reduced to decrease the ON resistance thereof, as compared with that of the planar type MOSFET.

The trench type MOSFET shown in FIG. 52C is so constructed that a gate electrode 122 is arranged within a groove 121 dug substantially perpendicularly to a substrate (Japanese Patent Application Laid-open No. 4-162572). This trench type MOSFET operates similarly to the V-groove type MOSFET. Since, however, the groove 121 is dug substantially perpendicularly to the substrate, the substrate area of the trench type MOSFET required per cell can be more reduced to decrease the ON resistance thereof still further, as compared with that of the V-groove type MOSFET.

In this manner, the decrease of the ON resistance has hitherto been attained by altering the construction wherein the channel region parallel to the surface of the substrate is formed as in the planar type MOSFET, into the construction wherein the channel region for causing the current to flow in the depth direction of the substrate is formed by digging the groove 111 or 121 in the substrate as in the V-groove type MOSFET or the trench type MOSFET.

It is desired, however, to decrease the ON resistance still further. In order to decrease the ON resistance, there has been proposed a method in which a channel region is formed, not only in a principal plane of a substrate, but also in a depth direction thereof. For example, the official gazettes of Japanese Patent Applications Laid-open No. 61-125174 and No. 8-204195 propose methods in each of which a gate is extended in a direction perpendicular to the principal surface of a substrate.

The former of these methods, however, is premised on a logic element which is of a structure having no drift layer, that is, which is not of a structure exhibiting a high withstand voltage, and which cannot be used as a power element. On the other hand, the latter produces a power element which has a semiconductor layer corresponding to a drift layer. Since, however, an insulated gate is formed both in a direction parallel to the principal plane of the semiconductor substrate and in the depth direction of the semiconductor substrate, an area of a source contact region in the principal surface of the substrate and that of a gate region along the principal plane of the substrate are restrained each other, to pose the problem that the restraint is disadvantageous for micrifying the element. Moreover, since individual impurity layers are formed by diffusion, the impurity layer of the channel region has a concentration distribution in the depth direction, and only that part of the channel region at which the gate threshold voltage becomes low functions as the very channel, to pose the problem that the substantial effect of decreasing the ON resistance is low.

Proposed in the official gazettes of Japanese Patent Application Laid-open No. 8-330601 is a semiconductor device in which two opposing trenches are formed in a substrate, and diffused layers (concretely, a base layer, a source layer and a drain layer) are formed so as to extend in the depth direction of the trenches by implanting ions obliquely to the sidewalls of the trenches, whereby the direction perpendicular to the principal surface of the substrate becomes the width direction of a gate. The schematic construction of the semiconductor device having the structure disclosed in this official gazette is shown in FIG. 53.

As shown in the figure, the semiconductor device disclosed in the official gazette is so constructed that the source layer 152 and the drain layer 153 are formed so as to extend along the inner walls of the corresponding trenches 150, that the base layer 151 is formed inside the source layer 152 as viewed from one of the trenches 150, and that a drift layer 154 is provided between the base layer 151 and the drain layer 152. Herein, although no illustration is made in the figure, the respective trenches 150 are filled up with insulating layers, whereby individual elements are isolated by the trenches.

In such a structure, however, concentration distributions are involved in the width directions of the diffused layers 151 to 153 (in a direction parallel to the principal surface of the substrate), and various problems arise.

For example, since the base layer 151 has the concentration distribution in the width direction, the internal resistance of this base layer 151 heightens to pose the problem that a parasitic n-p-n transistor which is constructed of the source layer 152, base layer 151 and drift layer 153 becomes liable to turn ON especially in a region which is deep from the principal surface of the substrate.

Moreover, since the base layer 151 has the concentration distribution in the width direction, a depletion layer becomes liable to elongate and to incur punch-through in a region of low concentration. When it is intended to prevent this drawback, the width of the base layer 151 must be enlarged correspondingly, to pose the problem that the larger width is disadvantageous for micrifying the element.

Further, when the source layer 152 and the drain layer 153 are deepened, the internal resistances thereof heighten in a series relation. Therefore, even when a channel resistance is lowered in a parallel relation with the spread of a channel width, the impedance of the whole element rises, and the normalized ON resistance thereof rises. In this regard, when the source layer 152 and the drain layer 153 have the concentration distributions in the width directions, the magnitudes of increases in the internal resistances enlarge, to pose the problem that the element cannot be formed down to a deep position.

Meanwhile, in the semiconductor device of the above structure, the diffused layers 751 to 153 are formed by the ion implantation oblique to the inner wall surfaces of the trenches 150, and various problems are caused by the oblique ion implantation. For example, the layout of the element must be designed with reference to the trenches 150. This poses the problem that the versatility of design lowers. Besides, the trenches 150 are filled up with the insulating layers after the formation of the diffused layers, thereby to use the trenches 150 for the element isolation. This poses the problem that the density of integration of the elements lowers correspondingly.

SUMMARY OF THE INVENTION

In view of the above, the present invention has for its object to decrease an ON resistance still further in a semiconductor device of insulated gate type.

According to one aspect of the present invention, a semiconductor device has a base region of a first conductivity type provided in a semiconductor substrate and extending from a principal surface of the semiconductor substrate in a first direction perpendicular to the principal surface; a source region of a second conductivity type provided in the base region and extending from the principal surface in the first direction; a drift region provided in the semiconductor substrate at an opposite side of the base region with respect to the source region; a drain region of the second conductivity type provided in the semiconductor substrate at a location remote from the base region; a trench dug from the principal surface and penetrating the base region from the source region in a second direction parallel to the principal surface; a gate insulating film provided on a surface of the trench; a gate electrode filling the trench through the gate insulating film; a source electrode electrically connected to the source region and the base region; and a drain electrode electrically connected to the drain region. The base region and the source region respectively have impurity concentrations, each of which is uniform in both the first direction and the second direction.

According to this construction, when a voltage is applied to the gate electrode, a channel region is formed in a portion of the base region adjoining the trench. The channel region has a channel width in the first direction, i.e., in a depth direction of the semiconductor substrate, and current flows in the channel region in the second direction parallel to the principal surface. Thus, because the channel width is parallel to the depth direction of the substrate, the channel resistance can be lowered, and accordingly the ON resistance of the semiconductor device can be lowered.

Further, because each impurity concentration of the base region and the source region is uniform in both the first and second directions, a parasitic n-p-n transistor that is constructed of the source region, the base region, and the drain region becomes less liable to be turned ON, and a depletion layer is suppressed from extending to make occurrence of punch-through difficult. The drain region may extend from the principal surface in the first direction, and otherwise, may be provided at the side of the back surface of the semiconductor substrate.

BRIEF DESCRIPTION OF THE DRAWINGS

Other objects and features of the present invention will become more readily apparent from a better understanding of the preferred embodiments described below with reference to the following drawings, in which:

FIGS. 24A to 24F are sectional views showing steps for manufacturing the power MOSFET shown in FIG. 20;

FIGS. 52A to 52C are sectional views showing conventional power MOSFETs; and

DETAILED DESCRIPTION OF THE PREFERRED EMBODIMENTS

First Embodiment

Figure 1:
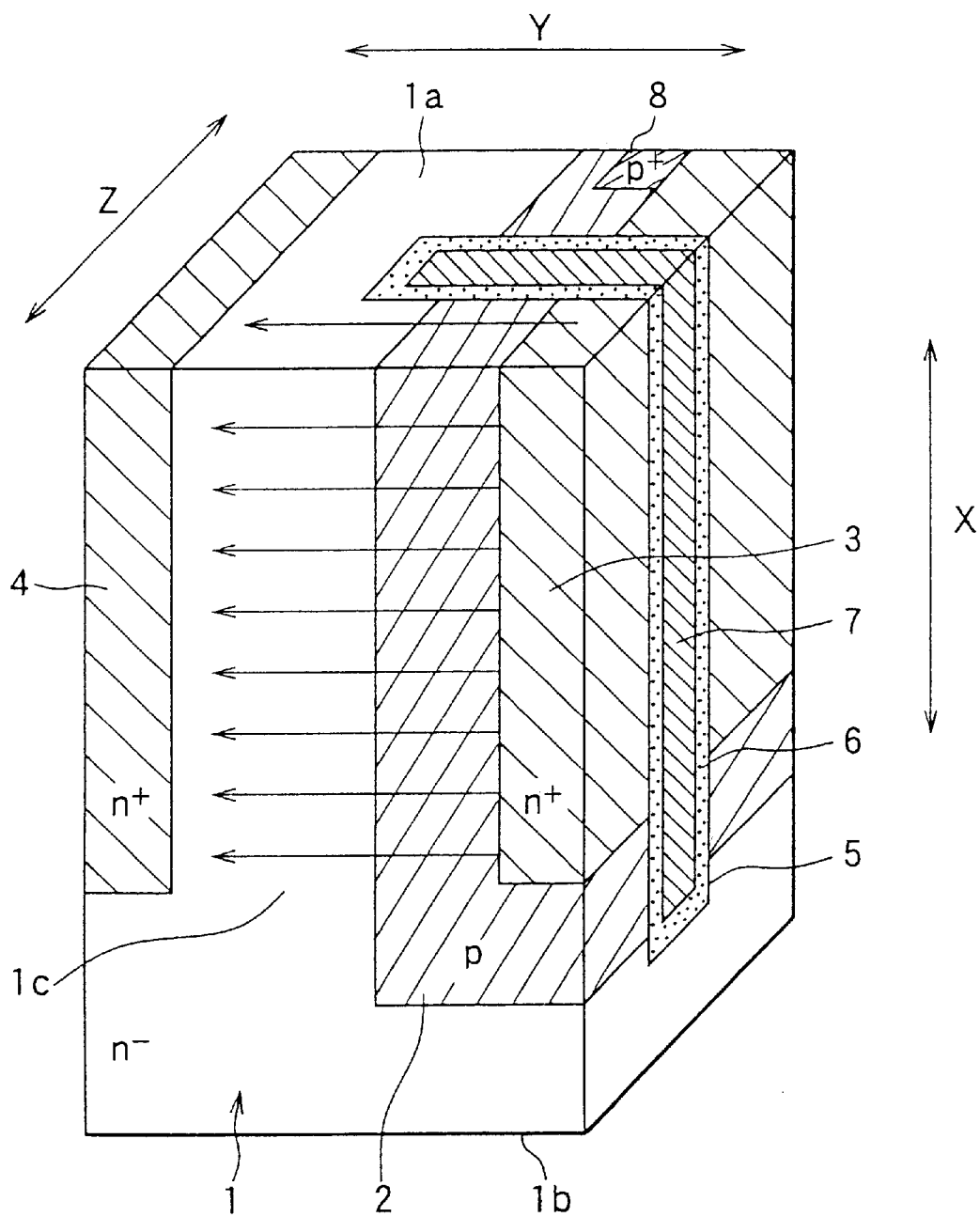
FIG. 1 is a perspective sectional view showing a power MOSFET in a first preferred embodiment of the present invention.

FIG. 1 illustrates a perspective sectional view of the main portions of a power MOSFET in the first embodiment of the present invention. Now, the construction of the power MOSFET will be described with reference to the figure.

An $n^-$-type substrate 1 which has a principal surface $1a$ and a back surface $1b$ opposite to the principal surface $1a$, is employed for the power MOSFET in this embodiment. An X-direction indicated by an arrow in the figure corresponds to the thickness direction of the $n^-$-type substrate 1 (a direction which is perpendicular to the principal surface $1a$ and the back surface $1b$), while a Y-direction and a Z-direction indicated by arrows in the figure correspond to a direction which is parallel to the principal surface $1a$ and the back surface $1b$ of the $n^-$-type substrate 1. Incidentally, the X-direction, Y-direction and Z-direction in the figure are perpendicular to one another.

A p-type base region (p-type well region) 2 is formed down to a predetermined depth from the principal surface $1a$ of the $n^-$-type substrate 1. The depth of the p-type base region 2 set to be on the order of 1 to 100 μm. Boron is employed as an impurity for forming the p-type base region 2, and the impurity concentration of this region 2 is set to be on the order of $1\times10^{14}$ to $1\times10^{19}$ cm$^{-3}$. The impurity concentration of the p-type base region 2 is substantially uniform in both the depth direction (X-direction) and the width direction (Y-direction).

Besides, an $n^+$-type source region 3 is formed in the p-type base region 2 so as to extend from the principal surface $1a$ of the $n^-$-type substrate 1 down to a position shallower than the junction depth of the p-type base region 2. The depth of the $n^+$-type source region 3 is set to be on the order of 1 to 100 μm, and to be somewhat less than that of the p-type base region 2. Phosphorus or arsenic is employed as an impurity for forming the $n^+$-type source region 3, and the impurity concentration of this region 3 is set on the order of $1\times10^{18}$ to $1\times10^{19}$ cm$^{-3}$. The impurity concentration of the $n^+$-type source region 3 is substantially uniform in both the depth direction (X-direction) and the width direction (Y-direction).

Further, an $n^+$-type drain region 4 having a depth and an impurity concentration which are respectively equal to those of the $n^+$-type source region 3 is formed in that position of the $n^-$-type substrate 1 which is spaced from the p-type base region 2. The impurity concentration of the $n^+$-type drain region 4 is substantially uniform in both the depth direction (X-direction) and the width direction (Y-direction).

In addition, a trench 5 is dug to extend vertically, namely, substantially in parallel with the X-direction from the principal surface $1a$ of the $n^-$-type substrate 1. The trench 5 is formed so as to penetrate the p-type base region 2 from the $n^+$-type source region 3 in both the Y-direction parallel to the principal surface $1a$ of the $n^-$-type substrate 1 and the X-direction parallel to the depth direction of this trench 5. The surface of the trench 5 is formed with a gate oxide film 6, through which the interior of the trench 5 is filled up with a gate electrode 7.

Also, a heavily-doped $p^+$-type contact region 8 is formed in the surface layer part of the p-type base region 2. The region $1c$ of the $n^-$-type substrate 1, in which the p-type base region 2, $n^+$-type source region 3, $n^+$-type drain region 4, trench 5, gate oxide film 6, gate electrode 7 and $p^+$-type contact region 8 are not formed, is used as a drift region and shall be termed the "drift region $1c$" below.

Owing to such a construction, in the Y-direction parallel to the principal surface $1a$ of the $n^-$-type substrate 1, the $n^+$-type source region 3, p-type base region 2, drift region $1c$ and $n^+$-type drain region 4 are arrayed in succession, and in the X-direction perpendicular to the principal surface $1a$ of the $n^-$-type substrate 1, this arrayal is formed down to a depth which is substantially equal to that of the trench 5. Incidentally, the respective depths of the p-type base region 2, n+-type source region 3 and n+-type drain region 4 are set in correspondence with the depth of the trench 5, and they are made greater as the trench 5 is deepened more.

By the way, although not shown in FIG. 1, an oxide film is formed not only on the surface of the trench 5 but also on the principal surface 1a of the n−-type substrate 1, and the gate electrode 7 is patterned on this oxide film. Besides, although not shown in FIG. 1, a source electrode and a drain electrode to be explained later are provided through an interlayer insulating film on the gate electrode 7 patterned on the surface of the n−-type substrate 1.

Figure 2A:
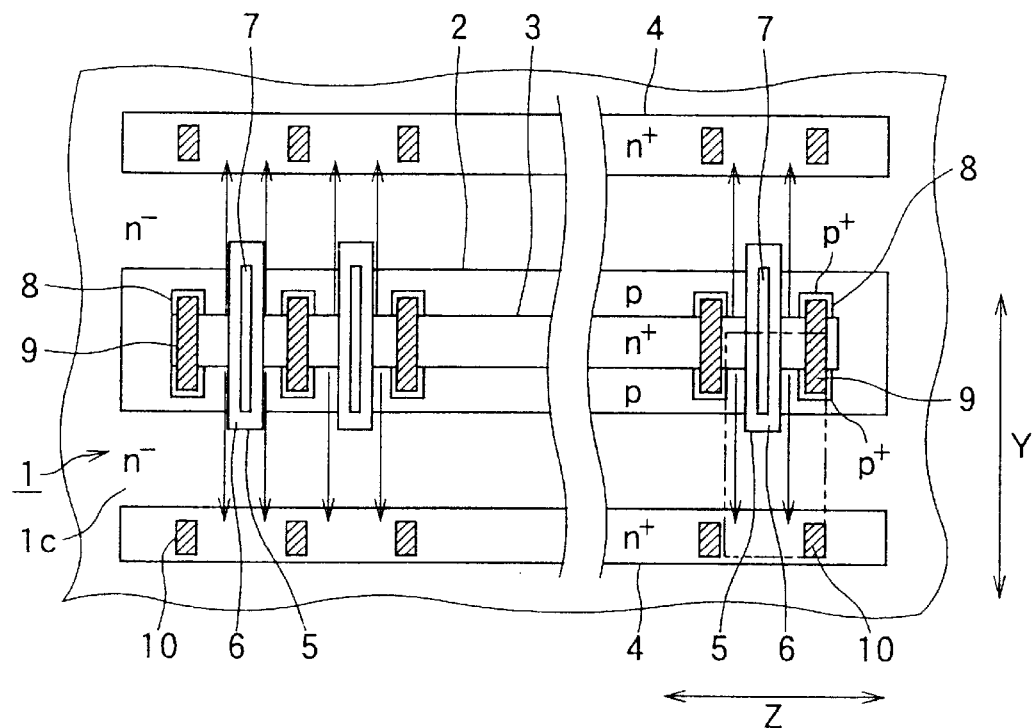
FIGS. 2A and 2B are schematic views showing a layout of the power MOSFET shown in FIG. 1.
Figure 2B:
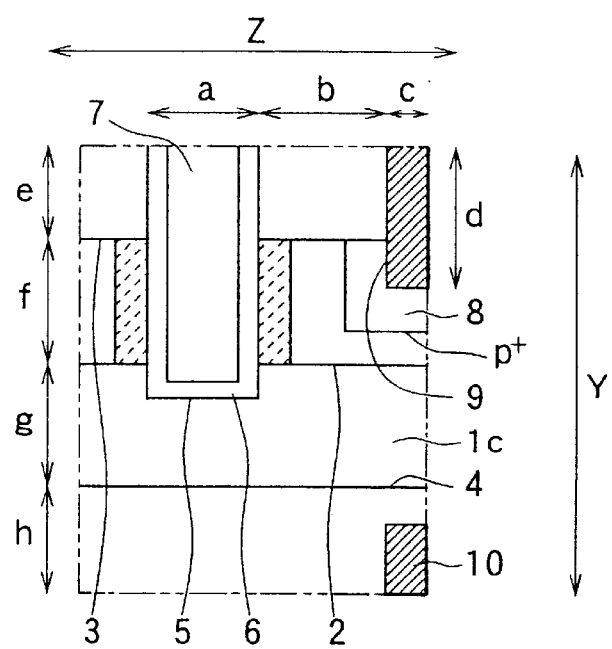

The layout of the constituent elements in the case where the power MOSFET shown in FIG. 1 is seen from the side of the principal surface 1a of the n−-type substrate 1, is illustrated in FIG. 2A. Besides, a partial enlarged view of a domain indicated by a two-dot chain line in FIG. 2A is illustrated in FIG. 2B. Incidentally, the power MOSFET shown in FIG. 1 corresponds to the sectional perspective view of the domain indicated by the two-dot chain line in FIG. 2A, and the Y-direction and Z-direction indicated in FIGS. 2A and 2B correspond respectively to the Y-direction and Z-direction in FIG. 1.

As shown in FIG. 2A, the power MOSFET has a construction in which a plurality of sets of unit cells are aligned in the Z-direction, on condition that each of the sets consists of a unit cell having the sectional construction shown in FIG. 1, and another unit cell arranged in line symmetry to the unit cell shown in FIG. 1, with the line of symmetry parallel to the Z-direction. As shown in FIG. 2A, the source electrode 9 is formed to be electrically connected to both the n+-type source region 3 and the p+-type contact region 8 of the p-type base region 2 in each of the unit cells. Also, the drain electrode 10 is formed to be electrically connected to the n+-type drain region 4.

Next, the dimensions of the constituent elements in one unit cell of the power MOSFET will be explained on the basis of FIG. 2B. In the Z-direction indicated in FIG. 2B, the width a of the trench 5 is set at about 0.1 to 5 μm, a distance b from the trench 5 to the source electrode 9 is set at about 0.1 to 5 μm, and the width c of the source electrode 9 is set at about 0.1 to 5 μm. Besides, in the Y-direction, the length d of the source electrode 9 is set at about 0.1 to 5 μm, the width e of the n+-type source region 3 is set at about 0.1 to 10 μm, the length f of that part of the p-type base region 2 which is held between the n+-type source region 3 and the drift region 1c is set at about 0.1 to 5 μm, the length g of that part of the drift region 1c which is held between the p-type base region 2 and the n+-type drain region 4 is set at about 0.1 to 50 μm, and the width h of the n+-type drain region 4 is set at about 0.1 to 10 μm.

When a positive voltage is applied to the gate electrode 7 of the power MOSFET thus constructed, electrons are induced in the vicinity of the gate oxide film 6 on the whole areas of those parts of the p-type base region 2 adjoining the trench 5, whereby channel regions made of the inversion layers of the p-type base region 2 are formed. That is, channel regions having a channel width direction corresponding to the depth direction of the trench 5 are formed (refer to broken-line hatching in FIG. 2B). Thus, a drain current flows between the source and the drain, laterally in parallel with the Y-direction as indicated by arrows in FIG. 1 and FIG. 2A.

On this occasion, the channel width of each channel region becomes substantially equal to the depth of the trench 5 because the power MOSFET is so constructed that the n+-type source region 3, p-type base region 2, drift region 1c and n+-type drain region 4 are successively arrayed extending down to depths nearly equal to the depth of the trench 5. Therefore, the channel width can be set in accordance with the depth of the trench 5, and it can be broadened more as the depth of the trench 5 is increased more. Here, increasing the depth of the trench 5 in this manner is possible without enlarging a substrate area required per unit cell, so that the channel width of each unit cell can be broadened without increasing the area of the substrate.

Figure 3A:
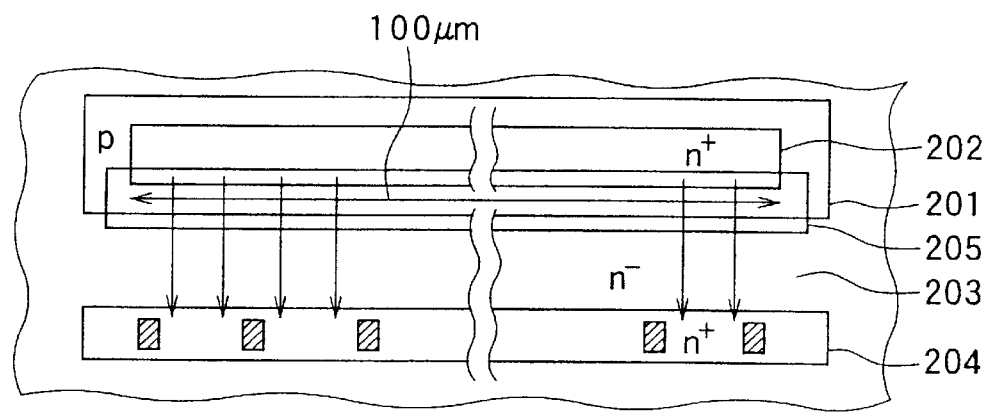
FIGS. 3A and 3B are explanatory views for comparing ON resistances of a conventional lateral type MOSFET and the power MOSFET in the first embodiment.
Figure 3B:
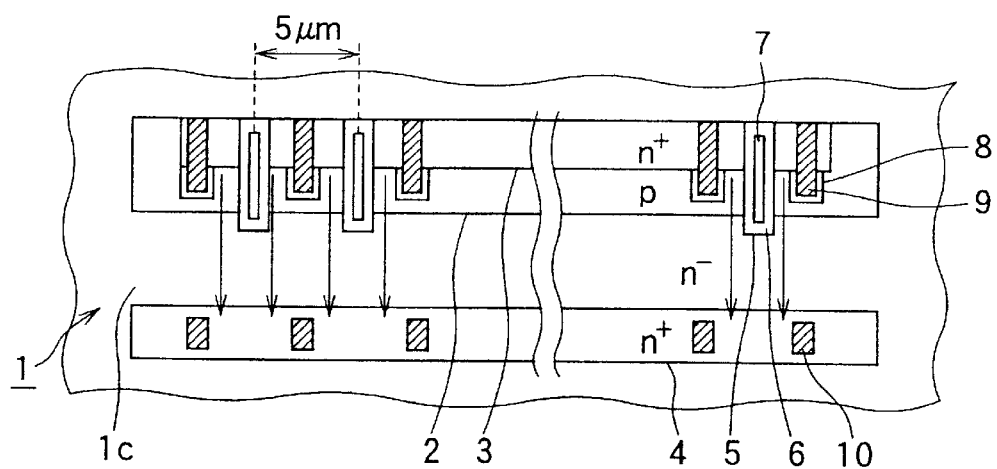

Accordingly, a channel resistance can be lowered to the extent that the channel width can be enlarged, whereby the ON resistance of the power MOSFET can be decreased. FIGS. 3A and 3B illustrate explanatory views for comparing the ON resistances of a lateral type MOSFET in the prior art and the power MOSFET in this embodiment. FIG. 3B depicts a case where the power MOSFET in this embodiment is formed having a substrate area which is equal to a substrate area necessary for the lateral type MOSFET of one unit cell.

FIG. 3A shows the layout of the lateral type MOSFET. As shown in the figure, the lateral type MOSFET includes an n+-type source region 202 in a p-type base region 201, and an n+-type drain region 204 in that position of a drift region 203 of n−-type which is spaced from the p-type base region 201. Besides, a gate electrode 205 is provided through a gate oxide film on that part of the p-type base region 201 which is held between the n−-type drift region 203 and the n+-type source region 202. The lateral MOSFET is so operated that, when a positive voltage is applied to the gate electrode 205, a channel is formed in the surface part of the p-type base region 201 underlying the gate electrode 205, a drain current flows in the surface parts of the p-type base region 201 and the drift region 203 as indicated by arrows in the figure. The channel width of the MOSFET here is set at 100 μm.

On the other hand, FIG. 3B shows the power MOSFET in this embodiment. Here, the interval between the adjacent unit cells, namely, the interval between the gate electrodes 7 of the adjacent unit cells is set at 5 μm. According to the power MOSFET in this embodiment, unit cells in the number of 100/5 are formed in the case where the channel width of the lateral type MOSFET is set at 100 μm. Besides, according to the power MOSFET in this embodiment, the channel width of each channel region corresponds to the depth of the trench 5, and the channel regions are formed on both the sides of the trench 5. Accordingly, the total of the channel widths corresponding to the same substrate area as that of the lateral type MOSFET in the prior art is calculated as given by Formula (1):

$$100/5 \times (\text{Depth of Trench 5}) \times 2 \qquad (1)$$

Therefore, the total channel width increases more as the depth of the trench 5 is enlarged more. For example, the total channel width becomes 400 μm when the depth of the trench 5 is set at 10 μm, the total channel width becomes 800 μm when the depth of the trench 5 is set at 20 μm, and the total channel width becomes 4000 μm when the depth of the trench 5 is set at 100 μm. In the respective examples, the power MOSFETs have the total channel widths which are 4 times, 8 times and 40 times greater than the channel width of the lateral type MOSFET shown in FIG. 3A.

In this manner, the depth of the trench 5 is enlarged more, and the depths of the p-type base region 2, n+-type source region 3 and n+-type drain region 4 are enlarged more in conformity with the depth of the trench 5, whereby the channel width can be broadened to lower the channel resistance per unit area. Thus, the normalized ON resistance of the lateral type power MOSFET can be decreased.

Moreover, the power MOSFET mentioned in this embodiment is so constructed that, as shown in FIG. 2B, the channel regions (inversion layers) are formed sideward of the trench 5, while the contact region 8 for bringing the p-type base region 2 into ohmic contact with the source electrode 9 is formed near one of the channel regions. On the other hand, in each of the prior-art structures (for example, the MOSFETs shown in FIGS. 52A to 52C), a contact region for establishing the ohmic contact of the p-type base region with the source electrode is formed on a side which is remote from the channel region with the n+-type source region held therebetween.

The electrical connection of the p-type base region 2 to the source electrode 9 is done in order to fix the potential of the p-type base region 2 at a source potential. With the prior-art structure, when the diffusion resistance of the p-type base region is high, a considerable potential difference arises across the p-type base region, and the potential fixation near the channel region might fail to become ideal. In contrast, according to this embodiment, the contact region 8 is formed near the channel region without the intervention of the n+-type source region 3, thereby to hold the p-type base region 2 in ohmic contact with the source electrode 9. Therefore, an ideal potential fixation can be attained.

A method of manufacturing the power MOSFET of the above construction will be described with reference to FIG. 1. First, an n−-type substrate 1 is prepared, which has a principal surface 1a as well as a back surface 1b and which exhibits a resistivity of 0.1 to 100 Ωcm. A trench is formed by photo-etching in the part of the n−-type substrate 1 scheduled to form a p-type base region 2, and a p-type semiconductor layer is thereafter epitaxially grown so as to fill up the interior of the trench. Since the p-type semiconductor layer is deposited even outside the trench on this occasion, polishing for flattening is performed to remove the entire part of the p-type semiconductor layer overlying the principal surface 1a. Thus, the p-type base region 2 whose impurity concentration is substantially uniform in both the depth direction and width direction thereof is formed. Incidentally, a contact region 8 is formed in the predetermined region of the surface layer part of the p-type base region 2 later by ion implantation or the like.

Subsequently, trenches are respectively formed by photo-etching in the part of the n−-type substrate 1 scheduled to form an n+-type drain region 4 and in the part of the p-type base region 2 scheduled to form an n+-type source region 3. Further, n-type semiconductor layers are epitaxially grown so as to fill up the interiors of the trenches. Since the n-type semiconductor layers are deposited even outside the trenches on this occasion, polishing for flattening is performed to remove the entire parts of the n-type semiconductor layers overlying the principal surface 1a. Thus, the n+-type source region 3 and n+-type drain region 4 whose impurity concentrations are substantially uniform in both the depth direction and width direction thereof are formed.

Subsequently, a trench 5 that penetrates the p-type base region 2 from the n+-type source region 3 in the X-direction and the Y-direction indicated in FIG. 1 and that reaches a drain region 1c is formed by photo-etching. Besides, an oxide film is formed by thermal oxidation on the surface of the trench 5 and on the principal surface 1a of the n−-type substrate 1 including the surfaces of the p-type base region 2, n+-type source region 3 and n+-type drain region 4. Of the oxide film formed on this occasion, a part lying on the surface of the trench 5 becomes a gate oxide film 6.

Next, a poly-silicon layer is arranged on the whole surfaces of the gate oxide film 6 and the oxide film so as to fill up the trench 5, whereupon it is patterned to form a gate electrode 7. Thereafter, although not shown in FIG. 1, an interlayer insulating film is formed so as to cover the gate electrode 7. Besides, a wiring layer is arranged after forming contact holes in the interlayer insulating film, and it is patterned to form a source electrode 9 electrically connected with the n+-type source region 3 as well as the p+-type contact region 8, and a drain electrode 10 electrically connected with the n+-type drain region 4 (refer also to FIGS. 2A and 2B). Thus, the power MOSFET in this embodiment is finished up.

Second Embodiment

Figure 4:
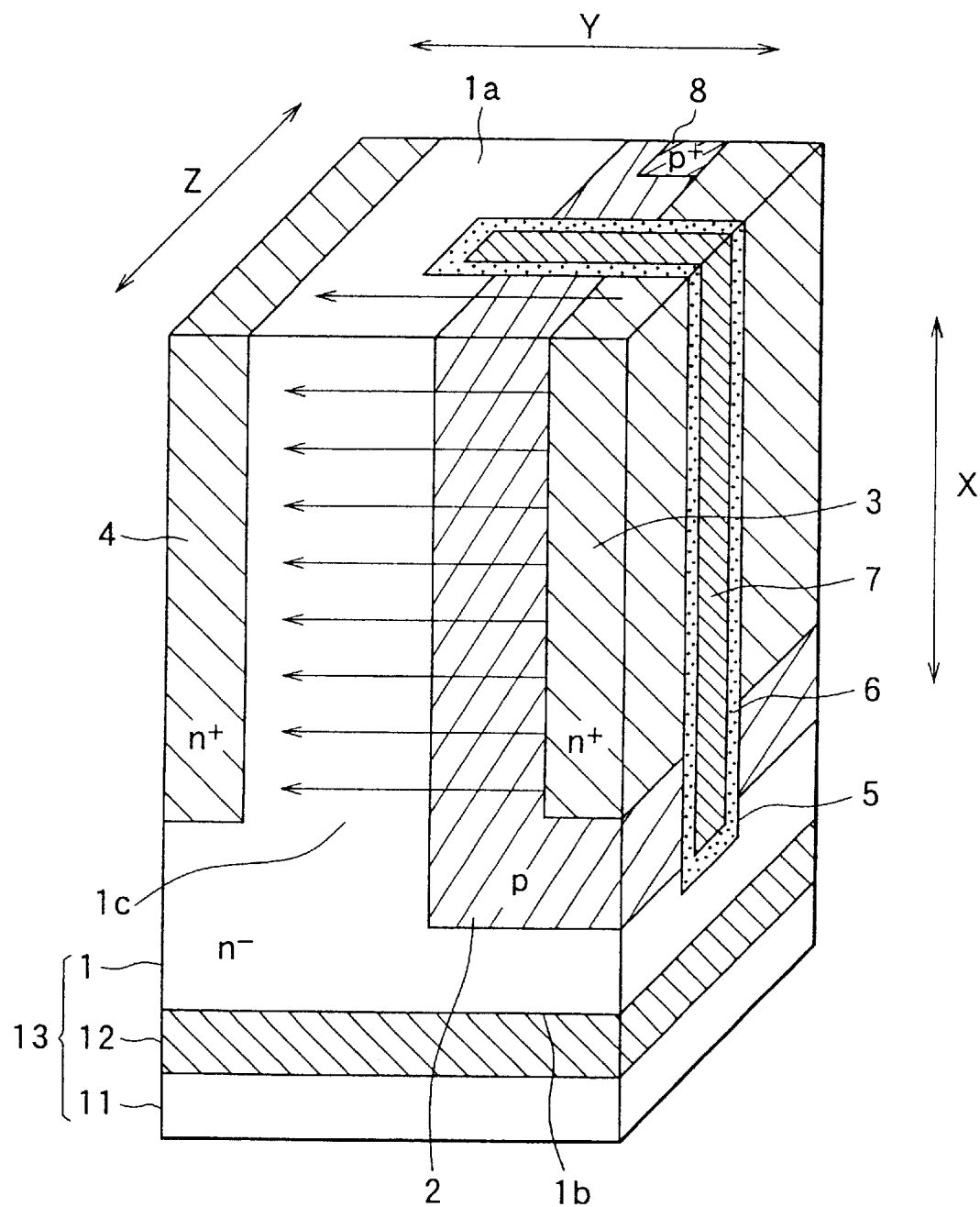
FIG. 4 is a perspective sectional view showing a power MOSFET in a second preferred embodiment.

FIG. 4 illustrates a perspective sectional view of a power MOSFET in the second embodiment of the present invention. This embodiment exemplifies a case where the power MOSFET shown in FIG. 1 is formed on the same substrate as that of the other circuit elements of a control circuit or the like, or a case where a plurality of power MOSFETs are integrated. Accordingly, the power MOSFET of this embodiment has a construction which is nearly the same as that of the power MOSFET in the first embodiment. The same reference numerals as in FIG. 1 are assigned to the same constituents as in the power MOSFET of the first embodiment, and only different portions shall be explained.

As shown in FIG. 4, the power MOSFET of this embodiment employs an SOI substrate 13 in which a buried oxide film 12 is formed on a support substrate 11, and in which an n−-type substrate 1 is formed on the buried oxide film 12. For example, an n-type silicon substrate whose resistivity is on the order of 0.1 to 10 Ωcm is used as the support substrate 11, and it is formed with the buried oxide film 12 having a thickness of about 0.1 to 10 μm by thermal oxidation or CVD. Thereafter, the resulting structure is hydrophilicized, and the n−-type substrate 1 is bonded together, thereby to form the SOI substrate 13. The power MOSFET of the construction shown in FIG. 1 is formed in the n−-type substrate 1 of the SOI substrate 13.

Besides, although not shown, an insulating isolation groove which extends from the surface of the n−-type substrate 1 down to the oxide film 12 is formed between the power MOSFET and the circuit element adjacent to this power MOSFET. Further, the interior of the insulating isolation groove is thermally oxidized to form an oxide film, and an insulating film is buried inside the oxide film formed by the thermal oxidation, thereby to isolate the power MOSFET and the adjacent circuit element.

In this manner, owing to the use of the SOI substrate or the like, the power MOSFET can be formed on the same substrate as that of the other circuit elements into the composite construction, and the plurality of power MOSFETs can also be integrated.

Third Embodiment

Figure 5:
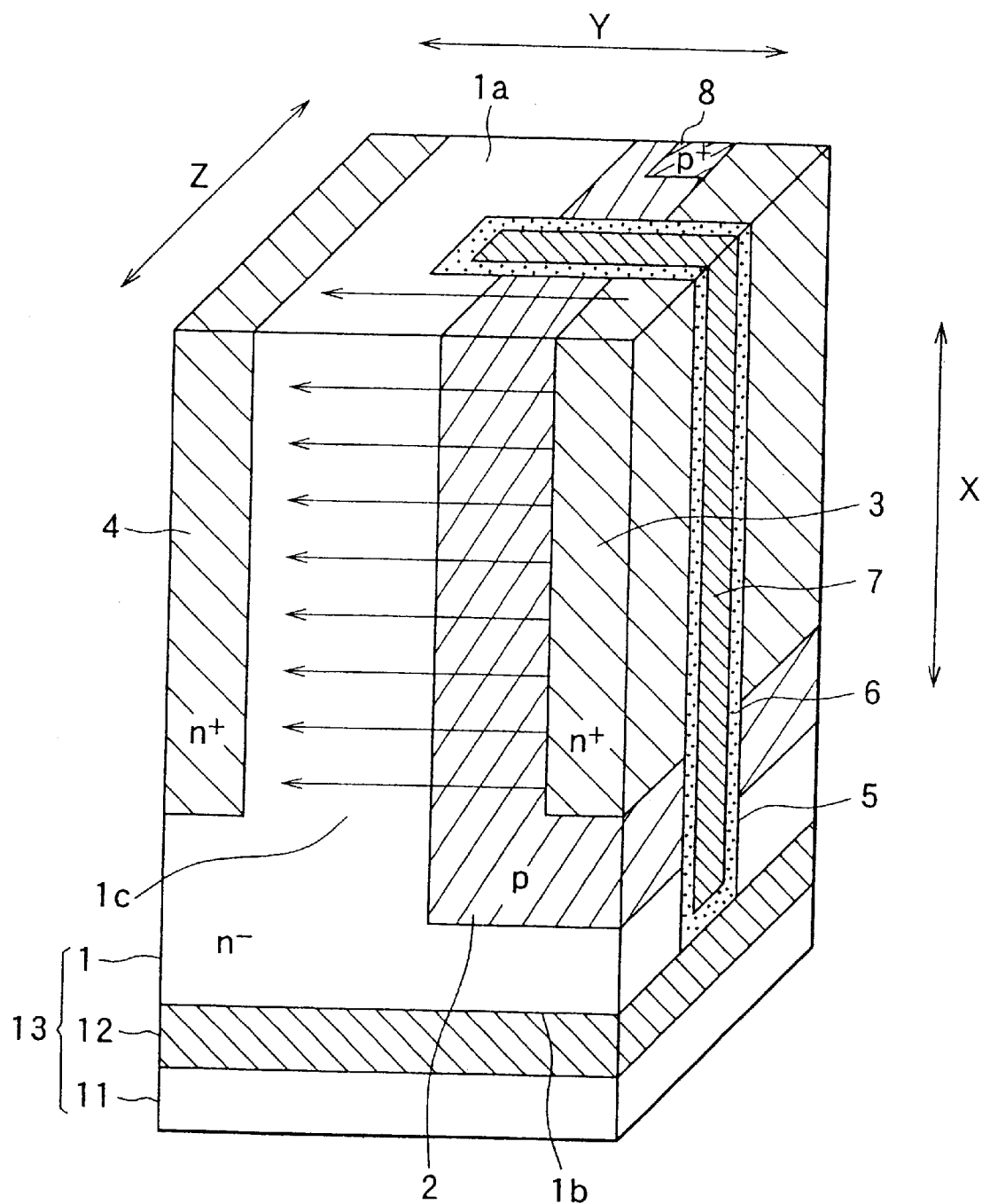
FIG. 5 is a perspective sectional view showing a power MOSFET in a third preferred embodiment.

FIG. 5 illustrates a perspective sectional view of a power MOSFET in the third embodiment of the present invention. This embodiment exemplifies the case of simultaneously forming the insulating isolation groove for the isolation of the individual elements in the second embodiment, and the trench 5 of the power MOSFET. Accordingly, only those portions of the power MOSFET in this embodiment which differ from the second embodiment shall be explained.

As shown in FIG. 5, according to this embodiment, the trench 5 is formed down to a depth at which it reaches an oxide film 12. A gate oxide film 6 which is formed inside the trench 5 is extended so as to contact the oxide film 12. That is, the trench 5 is formed simultaneously with the insulating isolation groove for the isolation between the power MOSFET and the other circuit elements as explained in the second embodiment, and it is formed having the depth equal to that of the insulating isolation groove.

In the case where the trench 5 and the insulating isolation groove are simultaneously formed in this manner, thermal oxidation is performed to form the gate oxide film 6 on the inner wall of the trench 5 and to form an oxide film on the inner wall of the insulating isolation groove. Further, regions scheduled to form the power MOSFET, including the trench 5, are covered with a mask, and thermal oxidation is performed until the oxide film on the inner wall of the insulating isolation groove reaches a thickness required for the element isolation. Also performed are the step of covering the insulating isolation groove with a mask and forming a gate electrode 7 inside the trench 5, and the step of covering the trench 5 with a mask and filling up the interior of the insulating isolation groove with an insulating film. Thus, the power MOSFET simultaneously formed with the trench 5 and the insulating isolation groove can be manufactured.

In this manner, the two grooving steps can be implemented at one time by simultaneously forming the trench 5 and the insulating isolation groove, so that the manufacturing process can be simplified.

Fourth Embodiment

Figure 6:
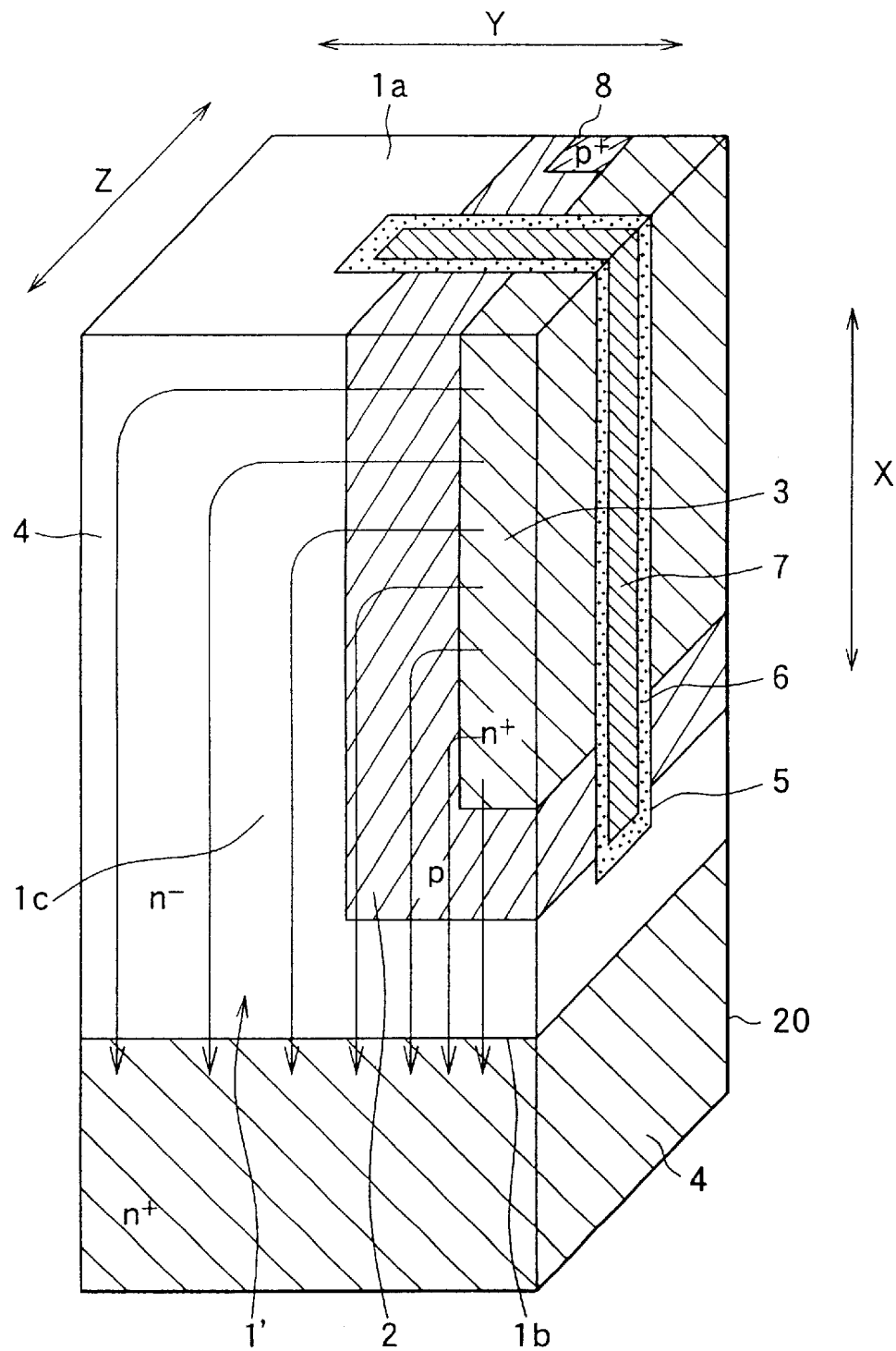
FIG. 6 is a perspective sectional view showing a power MOSFET in a fourth preferred embodiment.

FIG. 6 illustrates a perspective sectional view of a power MOSFET in the fourth embodiment of the present invention. As compared with the first embodiment, this embodiment is such that a position for forming a drain region 4 is changed with the remaining construction being the same. Therefore, the same reference numerals as in FIG. 1 are assigned to the same constituents as in the power MOSFET of the first embodiment, and only different portions shall be explained.

As shown in FIG. 6, according to this embodiment, a structure in which an n$^-$-type layer 1' is grown on an n$^+$-type substrate 20 is employed as a substrate. The n$^-$-type layer 1' is formed with a p-type base layer 2, an n$^+$-type source region 3, a trench 5, a gate oxide film 6 and a gate electrode 7. That is, the power MOSFET in this embodiment is constructed by utilizing the n$^+$-type substrate 20 as the n$^+$-type drain region 4 and forming the other constituents in the n$^-$-type layer 1' which replaces the n$^-$-type substrate 1 in FIG. 1.

Further, although not shown, a source electrode 9 (refer to FIGS. 2A and 2B) which is connected to the n$^+$-type source region 3 and a contact region 8 is connected on the front surface side of the substrate, and a drain electrode 10 (refer to FIGS. 2A and 2B) which is connected to the n$^+$-type drain region 4 is connected on the back surface side of the substrate.

In this manner, the source electrode 9 and the drain electrode 10 can have their contacts established on the side of the principal surface 1a of the substrate and on the side of the back surface 1b thereof, respectively, whereby the source electrode 9 and drain electrode 10 can be arranged on the different surfaces of the substrate. As compared with those in the case of arranging the source electrode 9 and drain electrode 10 on the identical surface side, therefore, margins are left for the respective arrangement spaces of the source electrode 9 and drain electrode 10, and respective wiring widths corresponding to these electrodes can be set wide, so that wiring resistances can be lowered.

Incidentally, the power MOSFET thus constructed operates as a vertical type MOSFET in which, as shown in the figure, a drain current is caused to flow in the vertical direction of the MOSFET with channel regions formed of the whole areas of the parts of the p-type base region 2 adjoining the trench 5. Therefore, the normalized ON resistance of the vertical type power MOSFET can be decreased owing to the lowering of a channel resistance.

Fifth Embodiment

Figure 7:
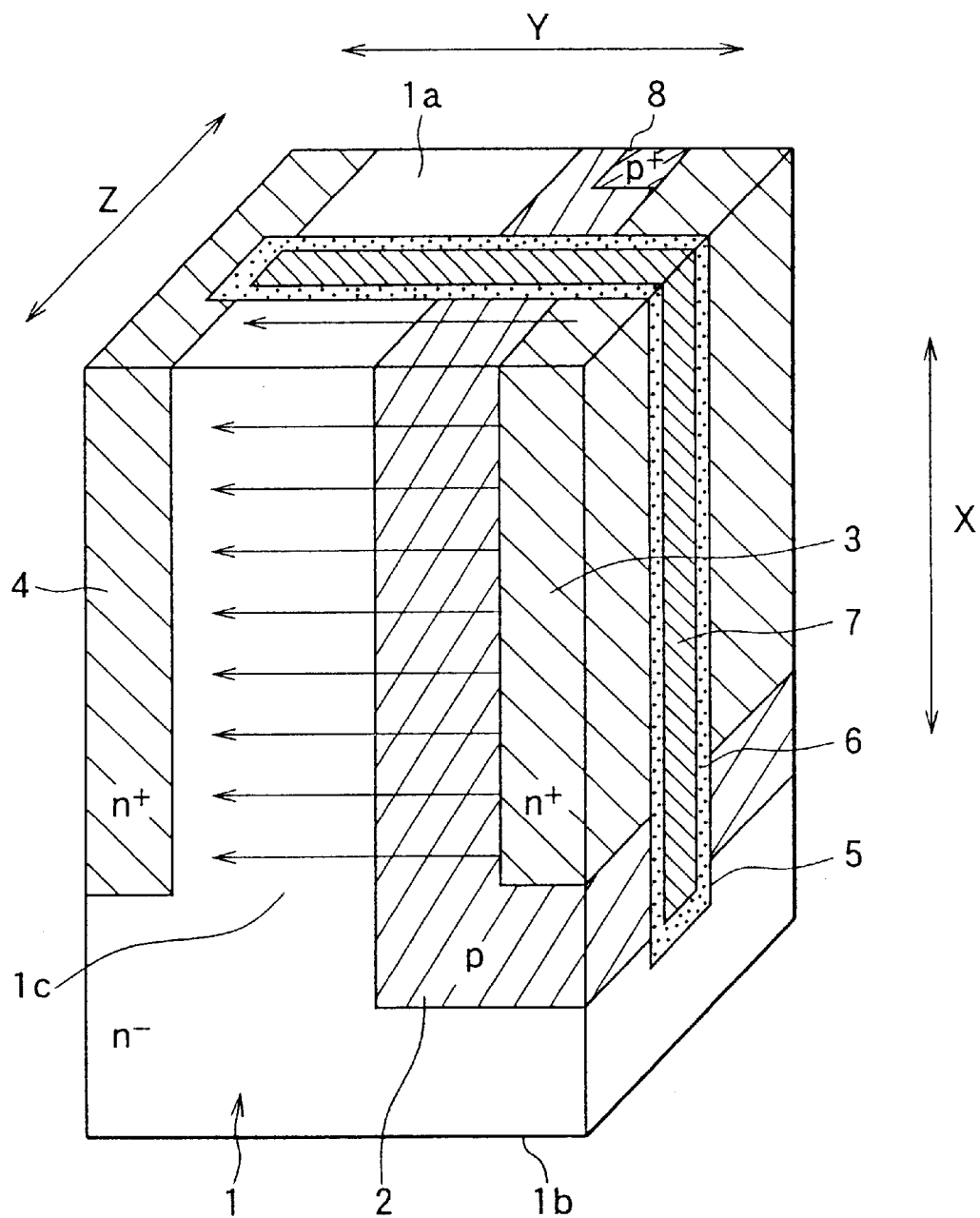
FIG. 7 is a perspective sectional view showing a power MOSFET in a fifth preferred embodiment.

FIG. 7 illustrates a perspective sectional view of a power MOSFET in the fifth embodiment of the present invention. As compared with the first embodiment, this embodiment is such that a trench 5 is changed with the remaining construction being the same. Therefore, only different portions shall be explained.

As shown in FIG. 7, according to this embodiment, the dimension of the trench 5 is enlarged in a Y-direction, and this trench 5 is formed so as to penetrate a p-type base region 2 as well as a drift region 1c and to reach an n$^+$-type drain region 4. When a positive voltage is applied to a gate electrode 7 in the power MOSFET thus constructed, electrons are induced in the parts of the drift region 1c adjoining the trench 5, thereby to form accumulation layers. Since a drift resistance can be lowered by the accumulation layers, the normalized ON resistance of the lateral type power MOSFET can be decreased still further. Incidentally, the power MOSFET in this embodiment can be manufactured by altering a mask for forming the trench 5 shown in the first embodiment.

Sixth Embodiment

Figure 8:
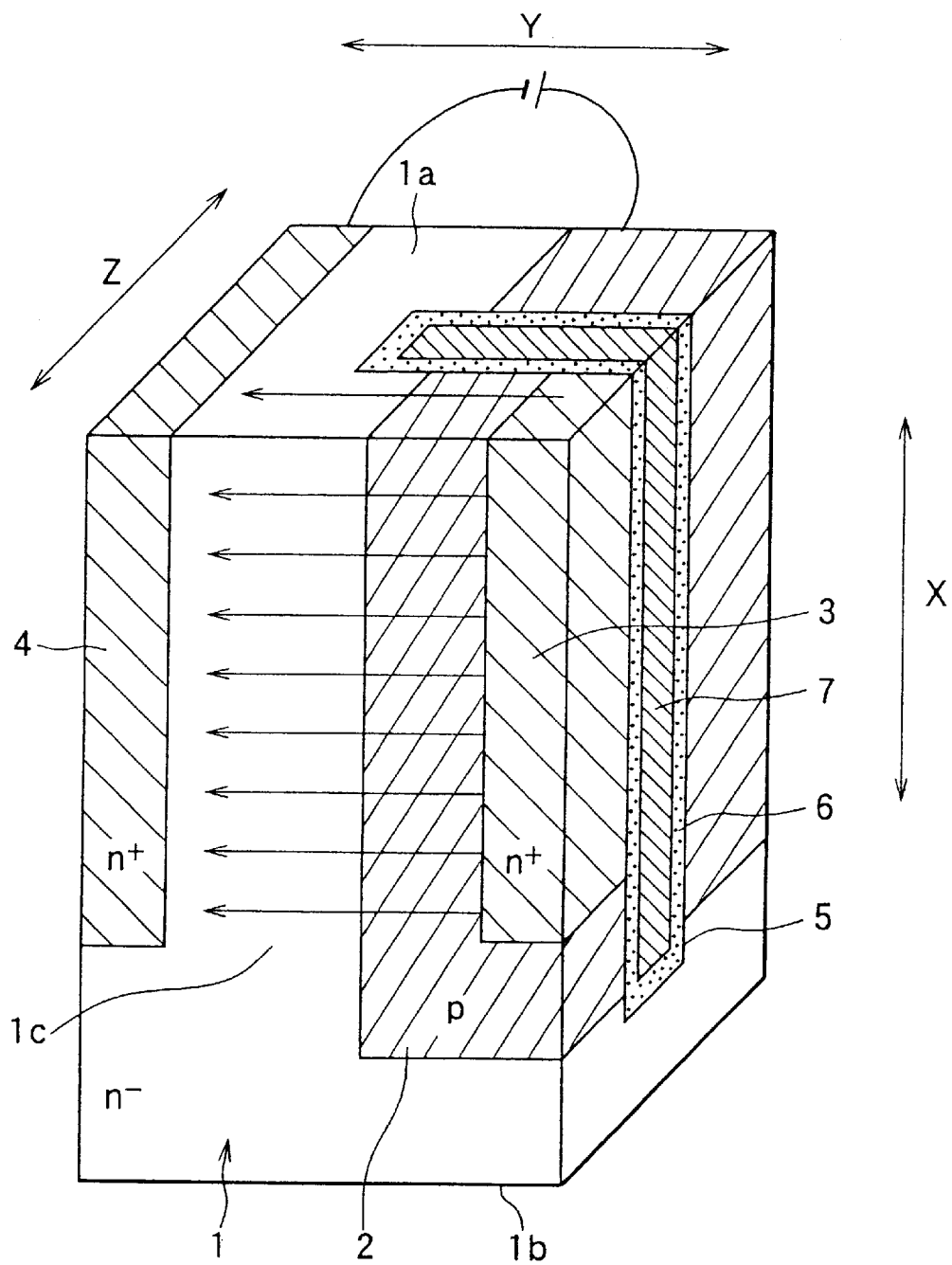
FIG. 8 is a perspective sectional view showing a power MOSFET in a sixth preferred embodiment.

FIG. 8 illustrates a perspective sectional view of a power MOSFET in the sixth embodiment of the present invention. Since this embodiment consists in altering the construction of the power MOSFET from the first embodiment, only portions different from the first embodiment shall be explained.

As shown in FIG. 8, an n$^+$-type source region 3 is formed on only one side of a trench 5, and a p-type base region 2 is extended on the other side without forming the n$^+$-type source region 3. Besides, that part of the p-type base region 2 which lies on the side of the trench 5 not formed with the n$^+$-type source region 3 is endowed with a predetermined potential difference relative to an n$^+$-type drain region 4.

In such a construction, that part of the p-type base region 2 which lies on the side of the trench 5 not formed with the n$^+$-type source region 3 acts as an injection layer for injecting carriers, and the conductivity modulation of a drift region 1c can be caused. More specifically, holes are injected from the p-type base region 2, and electrons are injected from the n$^+$-type drain region 4 in order to neutralize the holes, whereby the resistance of the drift region 1c can be lowered.

In this manner, the resistance of the drift region 1c can be lowered to decrease the ON resistance of the power MOSFET still further by employing the part of the p-type base region 2 as the injection layer for injecting the carriers. Incidentally, the p-type base regions 2 need not be used as the injection layers in all unit cells. For example, the p-type base regions 2 as the injection layers may be formed at intervals of two unit cells in an arrayal which consists of a plurality of unit cells, and they may well be formed at intervals of a predetermined larger number of unit cells.

Seventh Embodiment

Figure 9:
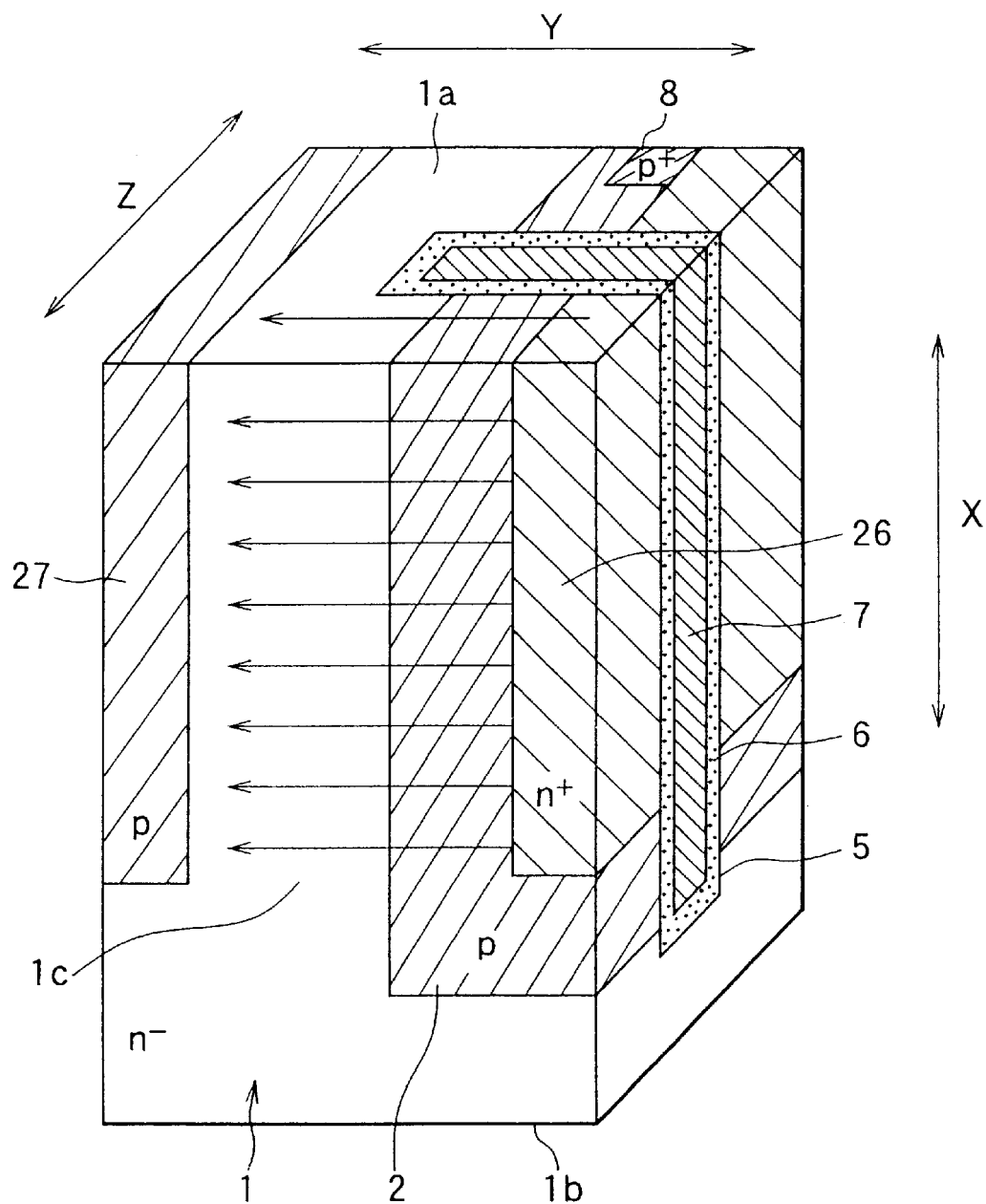
FIG. 9 is a perspective sectional view showing a power MOSFET in a seventh preferred embodiment.

FIG. 9 shows a sectional construction of an IGBT in the seventh embodiment of the present invention. Incidentally, the IGBT mentioned in this embodiment has a construction which is nearly the same as that of the power MOSFET mentioned in the first embodiment. Therefore, the same reference numerals as in FIG. 1 are assigned to the same constituents, and only different portions shall be explained.

As shown in FIG. 9, the IGBT in this embodiment includes an n$^+$-type emitter region 26 which is formed similarly to the n$^+$-type source region 3 of the power MOSFET shown in FIG. 1, and a p+-type collector region 27 which is made of a p-type semiconductor in place of the n+-type drain region 4. The depth of the p+-type collector region 27 is equal to that of the n+-type drain region 4 shown in FIG. 1. Besides, the p-type impurity concentration of the p+-type collector region 27 is set at $1×10^{18}$ to $1×10^{21}$ cm$^{-3}$, and the concentration distribution of this region 27 is uniformalized in the depth direction thereof. In addition, a portion 1c which lies opposite to the n+-type emitter region 26 with a p-type base region 2 held therebetween acts as a lightly-doped collector.

Even in the case of applying the present invention to the IGBT in this manner, channel regions are formed of the whole areas of those parts of the p-type base region 2 which lie near the side surfaces of a trench 5, and an IGBT operation can be performed. Thus, also in the IGBT, a channel resistance can be lowered to decrease an ON resistance.

Although the IGBT has been exemplified in this embodiment, the same effect as in the IGBT can be attained even when the present invention is applied to a thyristor having the same construction as in this embodiment. In this case, a structure (in other words, impurity concentrations and dimensions) may be designed so as to establish a latch-up state. In the case of the thyristor, there is the demerit that a current cannot be cut OFF by the element itself, but a current greater than in the case of the IGBT can be derived.

By the way, in the preceding embodiments, concerning the power MOSFETs, the SOI substrate is employed (refer to the second embodiment), the formation of the insulating isolation groove and that of the trench 5 are made common (refer to the third embodiment), and the injection layer is provided (refer to the sixth embodiment), but these constructions are also applicable to the IGBT or thyristor as in this embodiment. Besides, in the preceding embodiments the n+-type drain region 4 is arranged on the side of the back surface 1b (in the fourth embodiment), and the trench 5 is formed so as to reach the n+-type drain region 4 (in the fifth embodiment), but these constructions may well be applied to the IGBT or thyristor as in this embodiment, thereby to form the trench 5 reaching the p+-type collector region 27 or to arrange the p+-type collector region 27 on the side of the back surface 1b.

Eighth Embodiment

Figure 10:
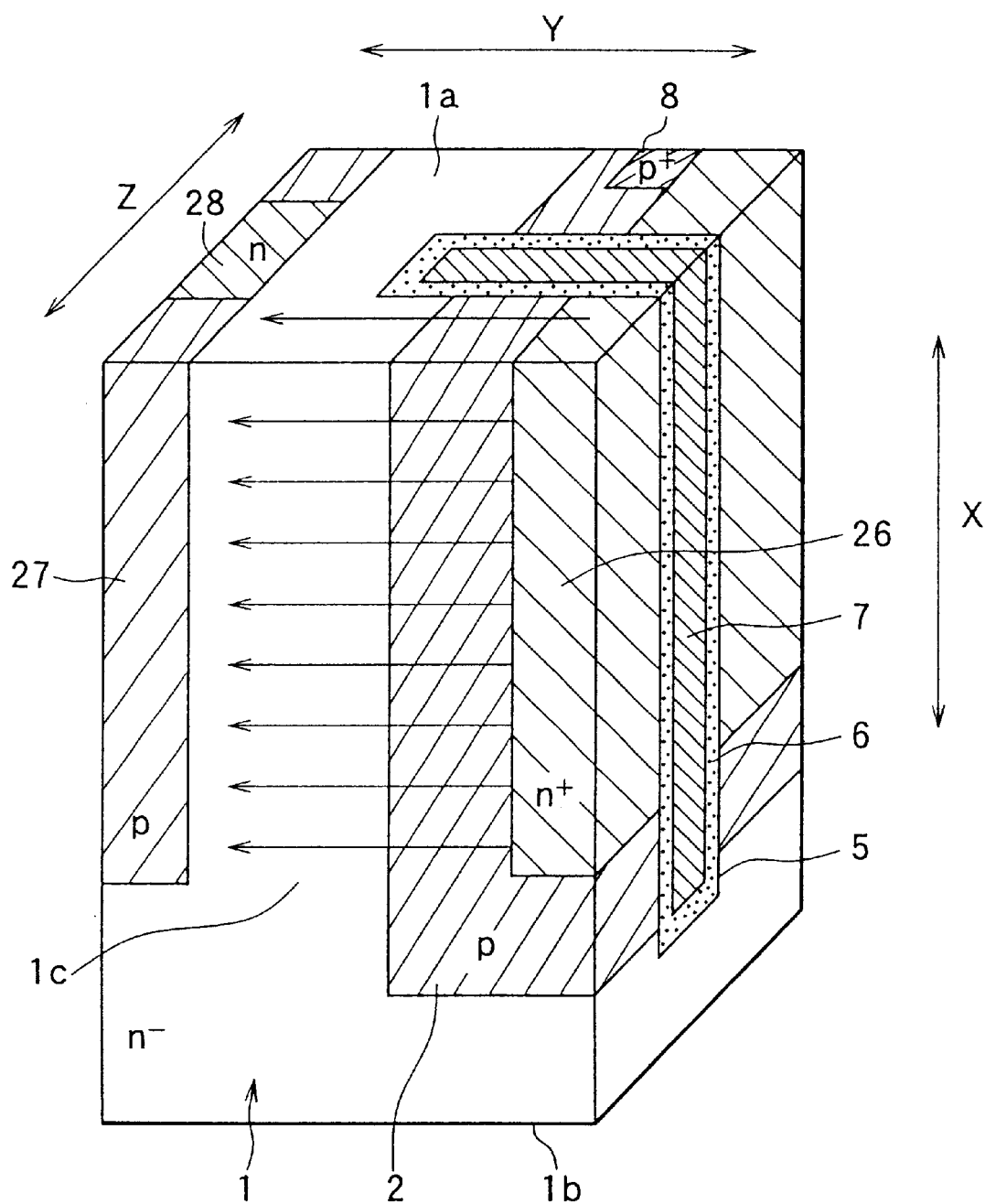
FIG. 10 is a perspective sectional view showing a power MOSFET in an eighth preferred embodiment.

FIG. 10 illustrates a perspective sectional view of a MOSFET in the eighth embodiment of the present invention. In this embodiment, a thyristor having a structure of FIG. 10 is partially formed with a MOS transistor.

Specifically, as shown in FIG. 10, this embodiment has a construction in which an n-type drain region 28 is formed in a part of the p+-type collector region 27. The n+-type drain region 28 is formed on the extension line of the trench 5 in a Y-direction, and the operation of the MOS transistor is executed by the portion of the n+-type drain region 28.

The MOSFET of such a construction operates as stated below. First, in a case where a voltage applied to a gate electrode 7 is lower than the operating voltage (about 0.7 V) of the thyristor, the thyristor does not substantially operate, and the MOS transistor operates. More specifically, a current flows through the path of an n+-type emitter region 26→a p-type base region 2→a drift region 1c→the n+-type drain region 28, with channel regions formed of the whole areas of those parts of the p-type base region 2 which adjoin the side surfaces of the trench 5.

Subsequently, when the applied voltage to the gate electrode 7 has reached the operating voltage of the thyristor, the thyristor comes to operate in addition to the MOS transistor, and a current flows also through the path of the n+-type emitter region 26→the p-type base region 2→the drift region 1c→the p+-type collector region 27, with channel regions formed of the whole areas of those parts of the p-type base region 2 which adjoin the side surfaces of the trench 5.

In general, when the applied gate voltage—current magnitude characteristics of a MOS transistor and a thyristor are compared, the current magnitude of the MOS transistor is larger for the applied gate voltage equal to or lower than the operating voltage of the thyristor, and the current magnitude of the thyristor is larger for the applied gate voltage equal to or higher than the operating voltage of the thyristor.

Therefore, the MOSFET which constructs the thyristor is partially formed with the MOS transistor as stated above, whereby the current can be derived by operating the MOS transistor, when the applied gate voltage is lower than the operating voltage of the thyristor, and the still greater current can be derived by operating the thyristor, when the applied gate voltage is equal to or higher than the operating voltage of the thyristor.

In this manner, the present invention is also applicable to the MOSFET including both the thyristor and the MOS transistor. Here in this case, the n+-type drain region 28 can be formed, for example, in such a way that, after the p+-type collector region 27 has been formed, a trench for forming the n+-type drain region 28 is provided in the p+-type collector region 27 and is filled up with an n-type layer, which is subsequently flattened.

Ninth Embodiment

Figure 11:
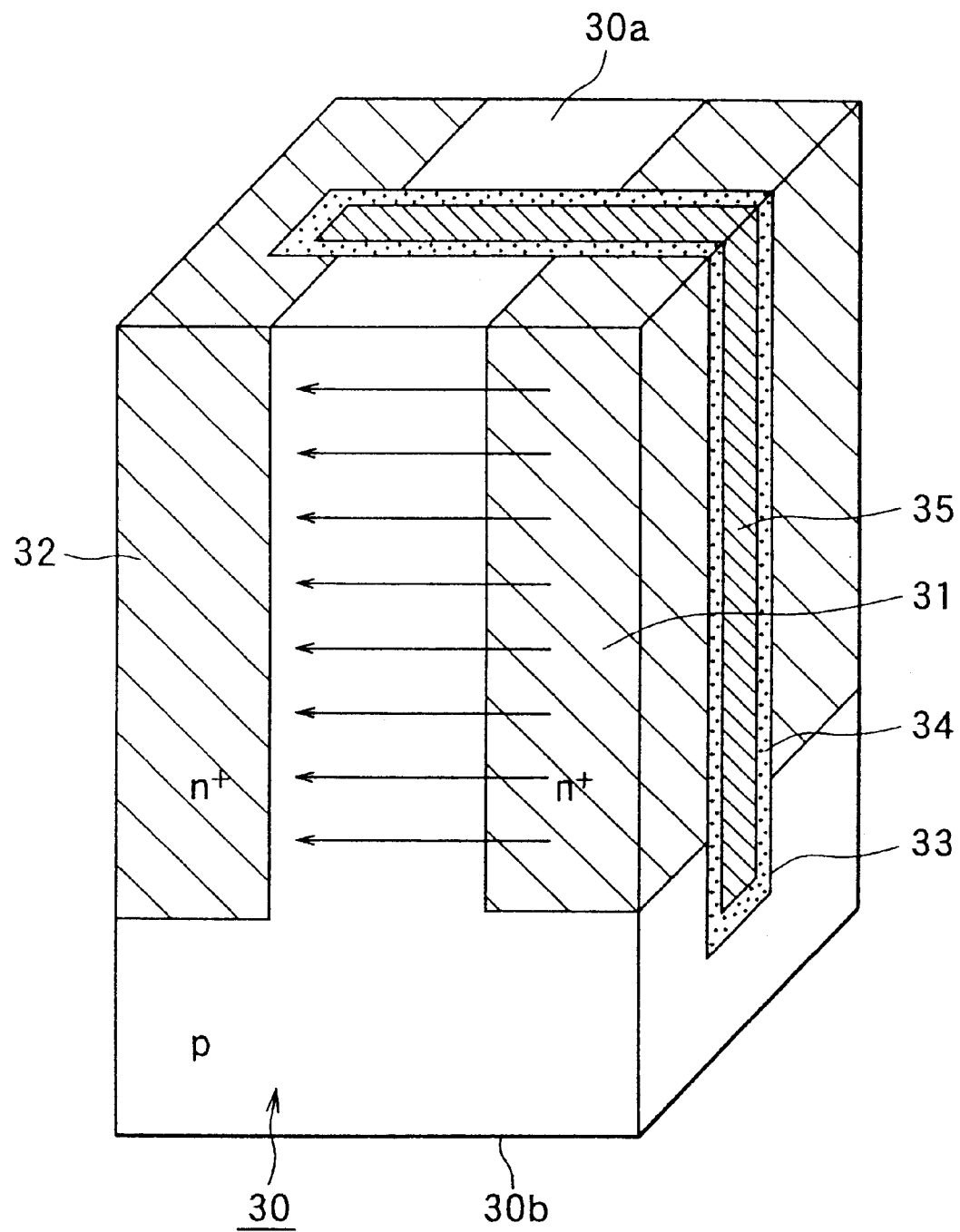
FIG. 11 is a perspective sectional view showing a power MOSFET in a ninth preferred embodiment.

FIG. 11 illustrates a perspective sectional view of a MOSFET in the ninth embodiment of the present invention. This embodiment exemplifies a case where the present invention is applied to a MOS structure having no p-type base region.

As shown in FIG. 11, in surface layer parts of a p-type substrate 30 which has a principal surface 30a and a back surface 30b forming the opposite surface of the principal surface 30a, an n+-type source region 31 and an n+-type drain region 32 which are equally deep from the principal surface 30a are formed in a spaced state. The n+-type source region 31 and the n+-type drain region 32 are extended in a direction perpendicular to the principal surface 30a, and they have substantially uniform concentration distributions in the depth direction of the p-type substrate 30.

Besides, a trench 33, which is perpendicular to the arrayed direction of the n+-type source region 31 and the n+-type drain region 32, is formed so as to reach these regions 31 and 32. The trench 33 is formed deeper than the n+-type source region 31 and the n+-type drain region 32. A gate oxide film 34 is formed on the surface of the trench 33, and a gate electrode 35 is formed on the surface of the gate oxide film 34.

With the MOSFET thus constructed, when a positive voltage is applied to the gate electrode 35, the whole areas of those parts of the p-type substrate 30, which adjoin the side surfaces of the trench 33, are inverted to become carrier regions, and a drain current is caused to flow as indicated by arrows in the figure. In this manner, even in the MOSFET having no p-type base region, the whole areas of those parts of the p-type substrate 30 which adjoin the side surfaces of the trench 33 can act as the carrier regions, so that a carrier resistance can be lowered to decrease an ON resistance.

Tenth Embodiment

Figure 12A:
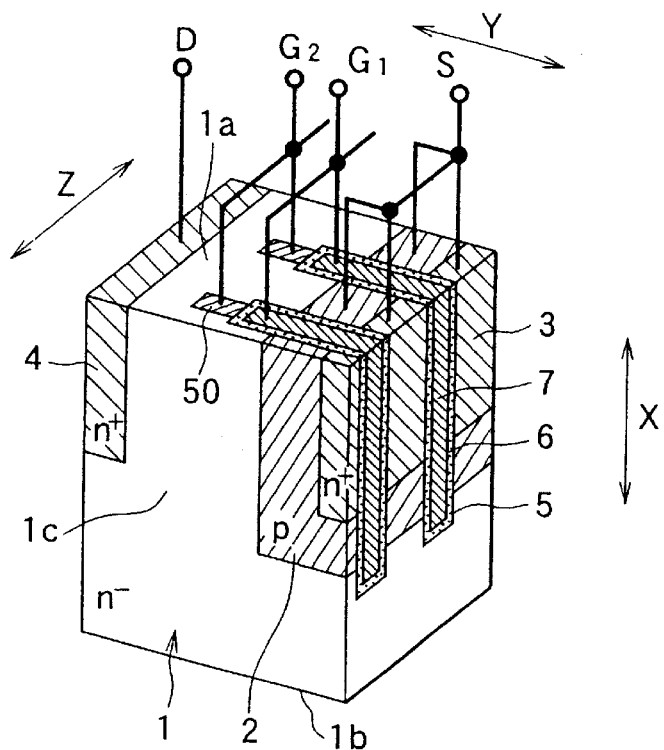
FIG. 12A is a perspective sectional view showing a power MOSFET in a tenth preferred embodiment.
Figure 12B:
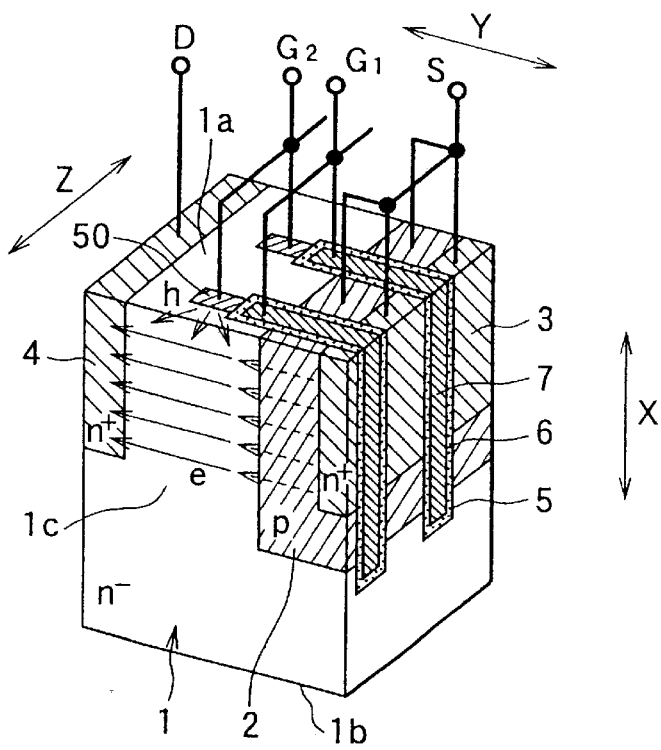
FIG. 12B is a n explanatory view for elucidating the operation of the power MOSFET shown in FIG. 12A.

FIG. 12A illustrates a perspective sectional view of a power MOSFET in the tenth embodiment of the present invention, while FIG. 12B illustrates an explanatory view for elucidating the operation of the power MOSFET. Since this embodiment consists in changing the formed position of an injection layer from the sixth embodiment, only portions different from the sixth embodiment shall be explained.

As shown in FIG. 12A, a p-type region 50 as an injection layer is provided at the distal end position of that part of each trench 5 which penetrates a p-type base region 2 to reach a drift region 1c. That is, the injection layer is formed so as to be spaced from the p-type base region 2 and to avoid channel regions. owing to such a construction, as shown in FIG. 12B, carriers are injected as indicated by arrows from the p-type region 50 being the injection layer, whereby the conductivity modulation of the drift region 1c can be induced.

Here in this embodiment, the injection layers are arranged at the distal end positions of those parts of the trenches 5 that reach the drift region 1c. That is, the injection layers are disposed at the positions that are not parallel to the arrayed direction (Z-direction) of the trenches 5, and an $n^+$-type source region 3 is arranged in the arrayed direction of the trenches 5, whereby channel regions are formed on the side surfaces of the larger number of trenches 5 than that in the sixth embodiment. Owing to such a configuration, the decrease of the channel regions attributed to the provision of the injection layers can be prevented. Thus, a lowered ON resistance can be attained.

By the way, although the p-type regions 50 may well be formed only in the vicinities of the surface of an $n^-$-type substrate 1 as shown in FIGS. 12A and 12B, they may be formed deeper along the trenches 5, more preferably down to a depth equal to that of the channel regions, so as to attain their effect as the injection layers more efficiently. Incidentally, in the case where the p-type regions 50 as the injection layers are shallow, they can be formed by ion implantation or the like. Besides, in the case where the p-type regions 50 are deep, they can be formed in such a way that openings are provided by etching in the parts of the $n^-$-type substrate 1 scheduled to form the p-type regions 50 and are filled up with, for example, poly-silicon doped with a p-type impurity.

Figure 13:
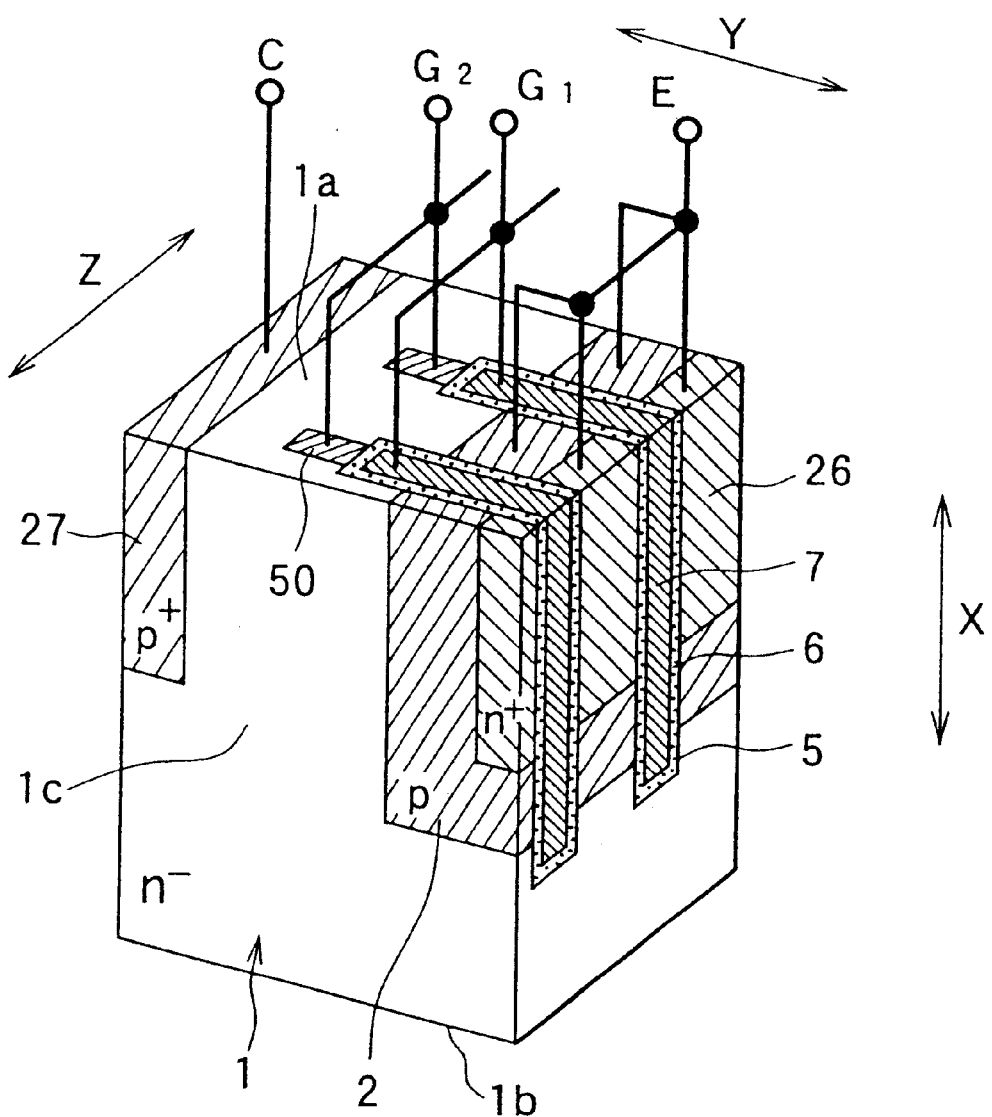
FIG. 13 is a perspective sectional view showing an IGBT adopting the structure explained in the tenth embodiment.

Further, although this embodiment has exemplified the case of applying the present invention to the MOSFET, it is also applicable to an IGBT as shown in FIG. 13, in which the $n^+$-type source region 3 and an $n^+$-type drain region 4 in FIGS. 12A and 12B are respectively altered into an $n^+$-type emitter region 26 and a $p^+$-type collector region 27 as in the seventh embodiment.

Eleventh Embodiment

Figure 14A:
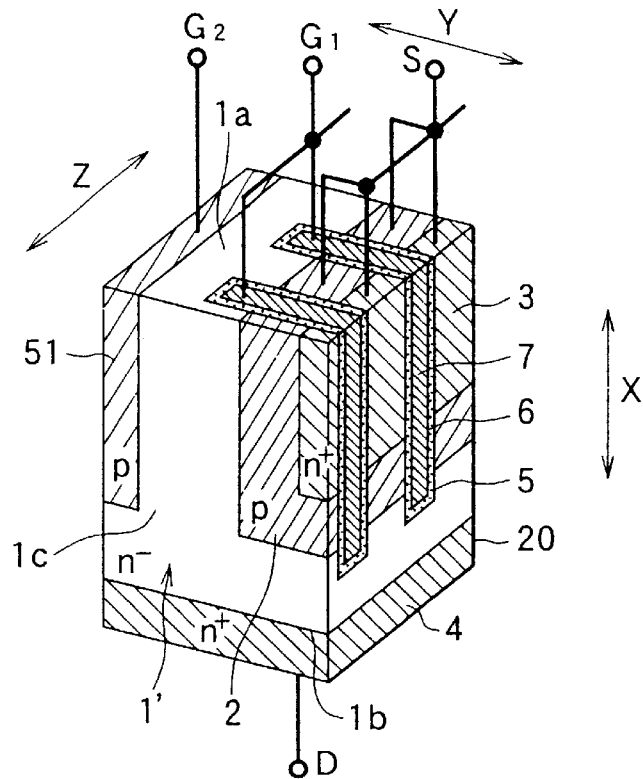
FIG. 14A is a perspective sectional view showing a power MOSFET in an eleventh preferred embodiment.
Figure 14B:
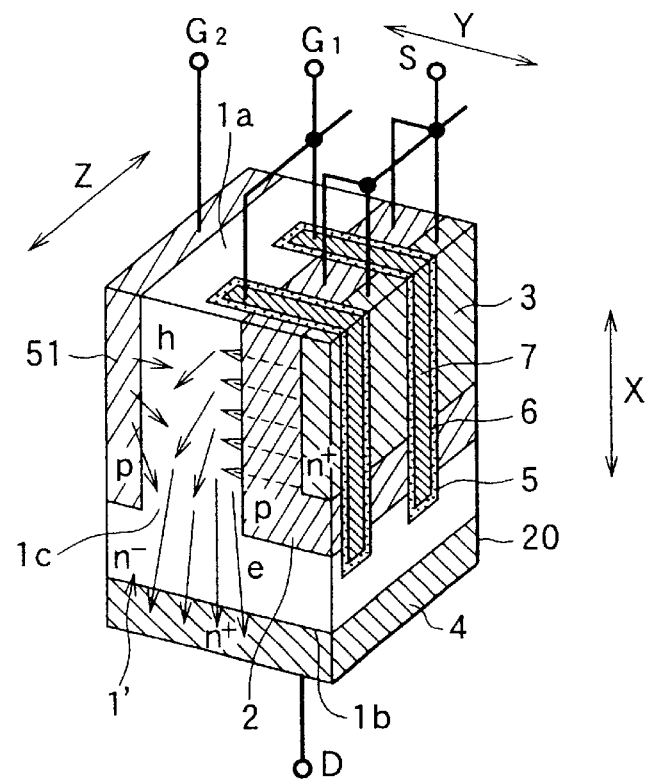
FIG. 14B is an explanatory view for elucidating the operation of the power MOSFET shown in FIG. 14A.

FIG. 14A illustrates a perspective sectional view of a power MOSFET in the eleventh embodiment of the present invention, while FIG. 14B illustrates an explanatory view for elucidating the operation of the power MOSFET. This embodiment exemplifies a case where an injection layer is added to the fourth embodiment.

As shown in FIG. 14A, an $n^+$-type drain region 4 is arranged on the back surface side of an $n^-$-type substrate 1', and a p-type region 51 as an injection layer is provided on the principal surface side of the $n^-$-type substrate 1' so as to oppose to a p-type base region 2 with a drift region 1c held therebetween. Such an injection layer can be formed, for example, simultaneously with the formation of the p-type base region 2. Owing to the construction stated above, as shown in FIG. 14B, carriers are injected as indicated by arrows from the p-type region 51 being the injection layer, whereby the conductivity modulation of the drift region 1c can be induced.

In this manner, in the case of arranging the $n^+$-type drain region 4 on the back surface side of the substrate 1', the injection layer may well be arranged on the side which is remote from the p-type base region 2 with the drift region 1c held therebetween.

Figure 15:
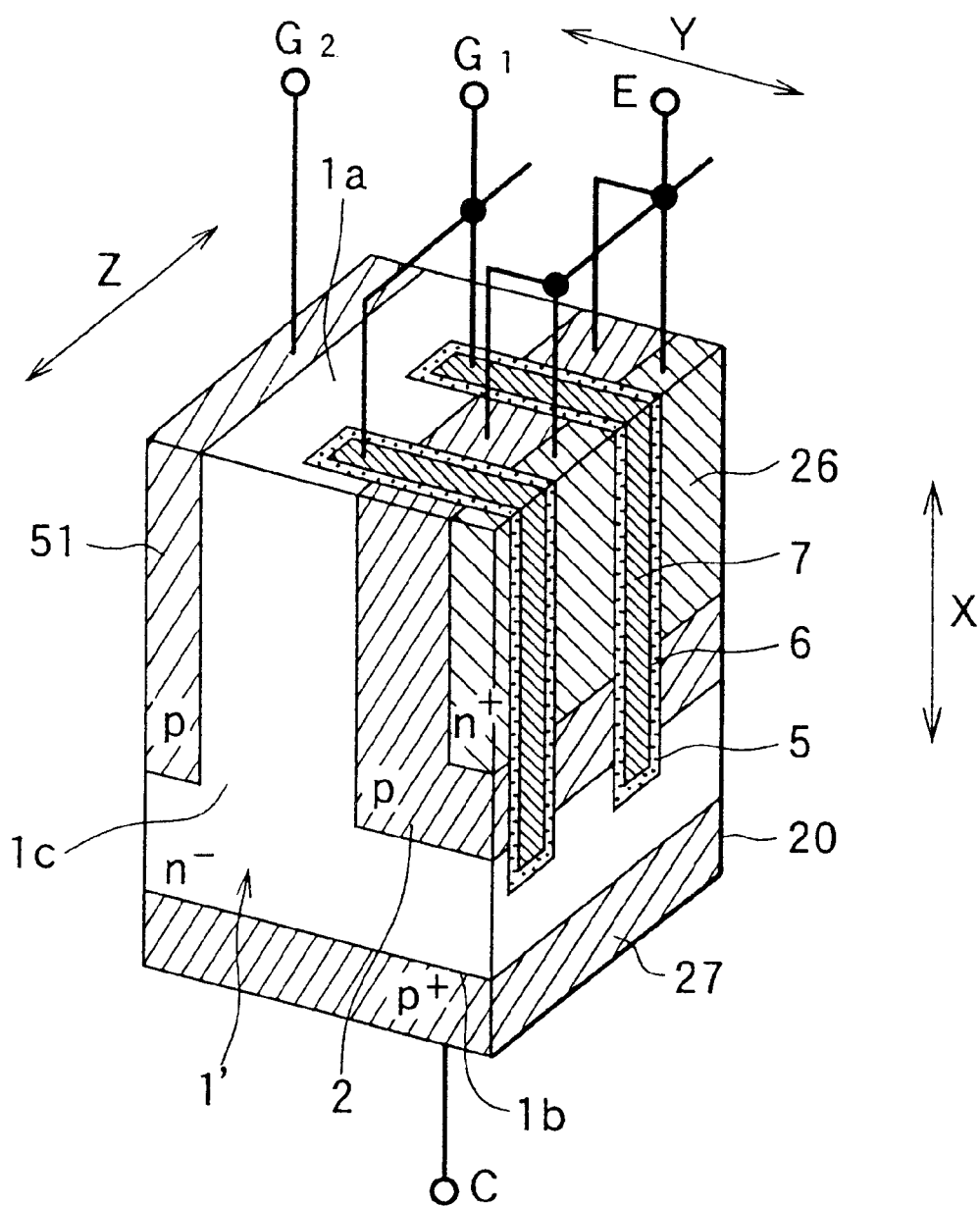
FIG. 15 is a perspective sectional view showing an IGBT adopting the structure explained in the eleventh embodiment.

By the way, when the holes injected from the injection layer reach the p-type base region 2, they are exhausted as a source current, so that the injection layer should desirably be located far from the p-type base region 2. On the other hand, however, when the injection layer is far from the current path, since the effect of the conductivity modulation becomes difficult to be attained, the injection layer should desirably be located near the current path. Therefore, the location of the injection layer should preferably be optimally set in relation to the distances thereof from the p-type base region 2 and the current path. Incidentally, this embodiment is also applicable to an IGBT as shown in FIG. 15, in which an $n^+$-type source region 3 and the $n^+$-type drain region 4 in FIGS. 14A and 14B are respectively altered into an $n^+$-type emitter region 26 and a $p^+$-type collector region 27 as in the seventh or tenth embodiment.

Twelfth Embodiment

Figure 16A:
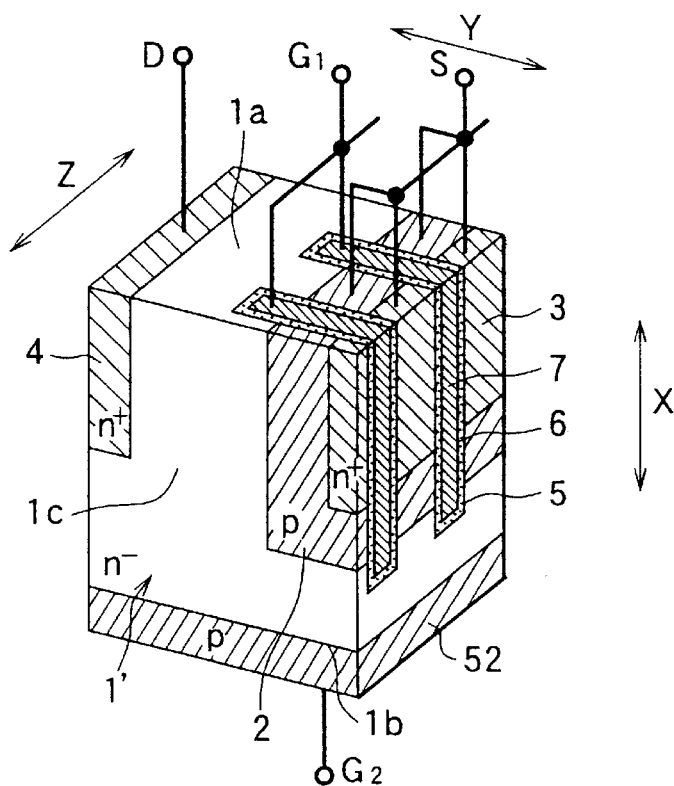
FIG. 16A is a perspective sectional view showing a power MOSFET in a twelfth preferred embodiment.
Figure 16B:
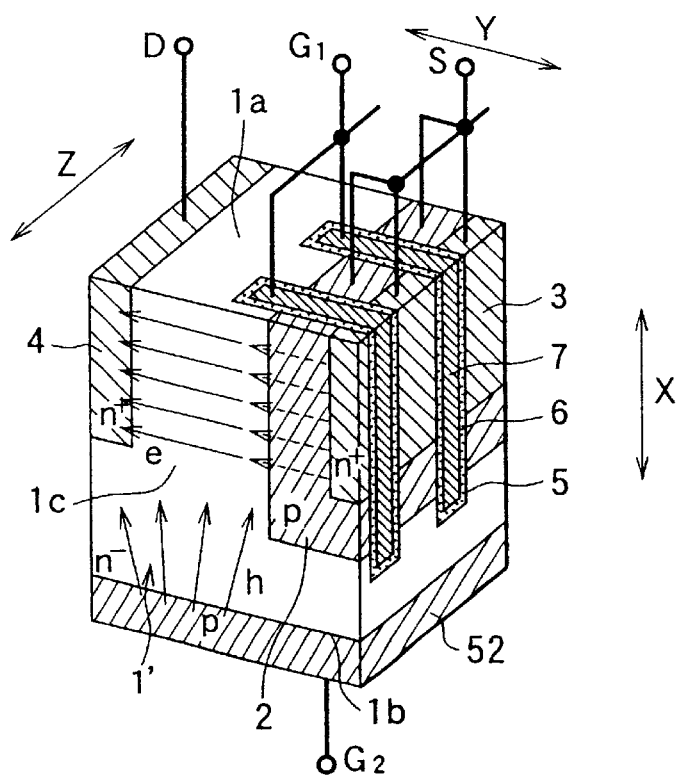
FIG. 16B is an explanatory view for elucidating the operation of the power MOSFET shown in FIG. 16A.

FIG. 16A illustrates a perspective sectional view of a power MOSFET in the twelfth embodiment of the present invention, while FIG. 16B illustrates an explanatory view for elucidating the operation of the power MOSFET. Also this embodiment consists in changing the arranged position of an injection layer from the sixth embodiment.

As shown in FIG. 16A, a p-type region 52 as an injection layer is provided on the back surface side of a substrate. Owing to such a construction, as shown in FIG. 16B, carriers are injected as indicated by arrows from the p-type region 52 being the injection layer, whereby the conductivity modulation of a drift region 1c can be induced.

Figure 17:
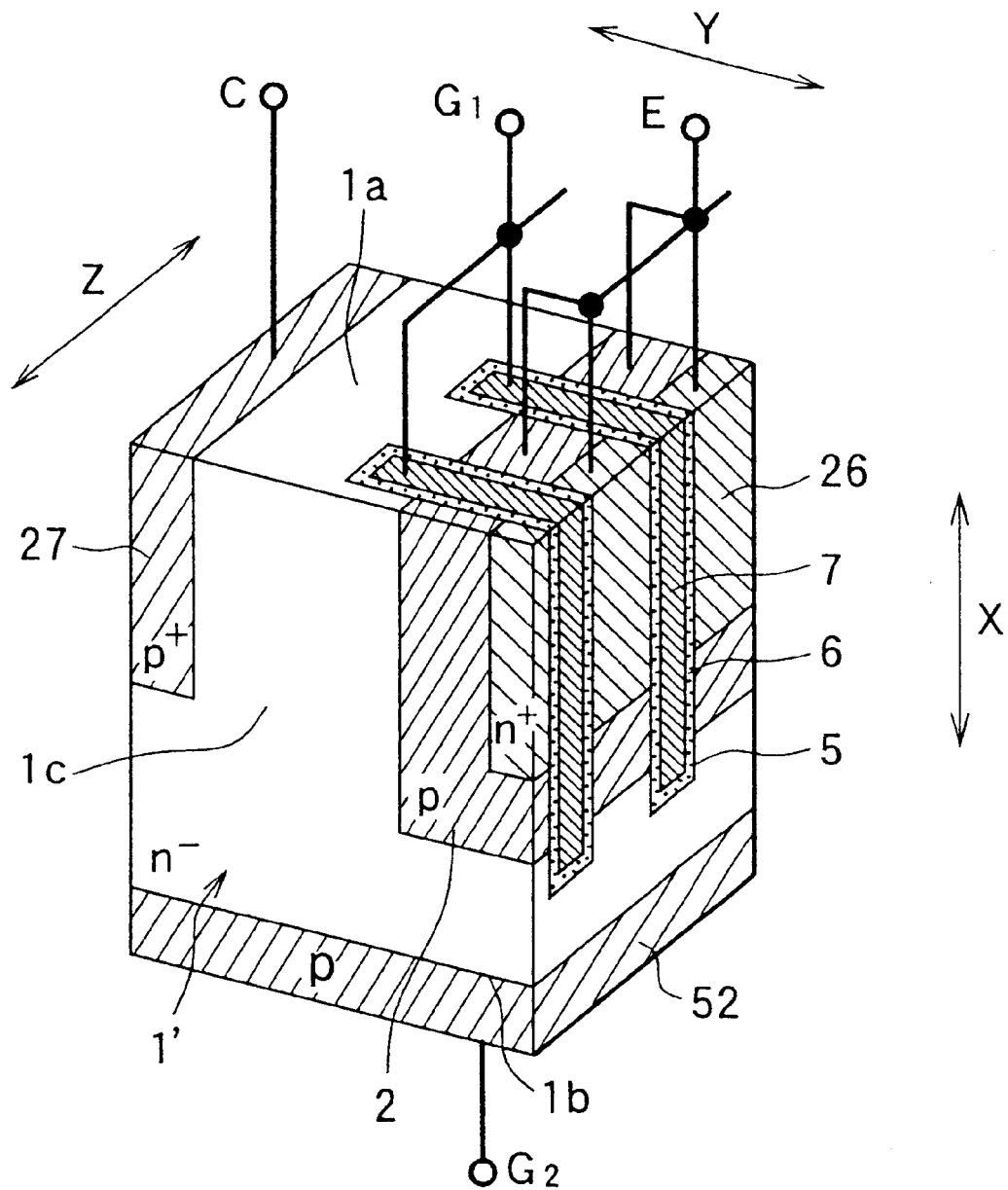
FIG. 17 is a perspective sectional view showing an IGBT adopting the structure explained in the twelfth embodiment.

In this manner, the injection layer may well be provided on the back surface side of the substrate. In this case, the MOSFET constructed similarly to that stated above may be formed by making the injection layer out of the p-type substrate and disposing an $n^-$-type layer 1' on the p-type substrate. Incidentally, this embodiment is also applicable to an IGBT as shown in FIG. 17, in which an $n^+$-type source region 3 and an $n^+$-type drain region 4 in FIGS. 16A and 16B are respectively altered into an $n^+$-type emitter region 26 and a $p^+$-type collector region 27 as in the seventh embodiment or the like.

Thirteenth Embodiment

Figure 18:
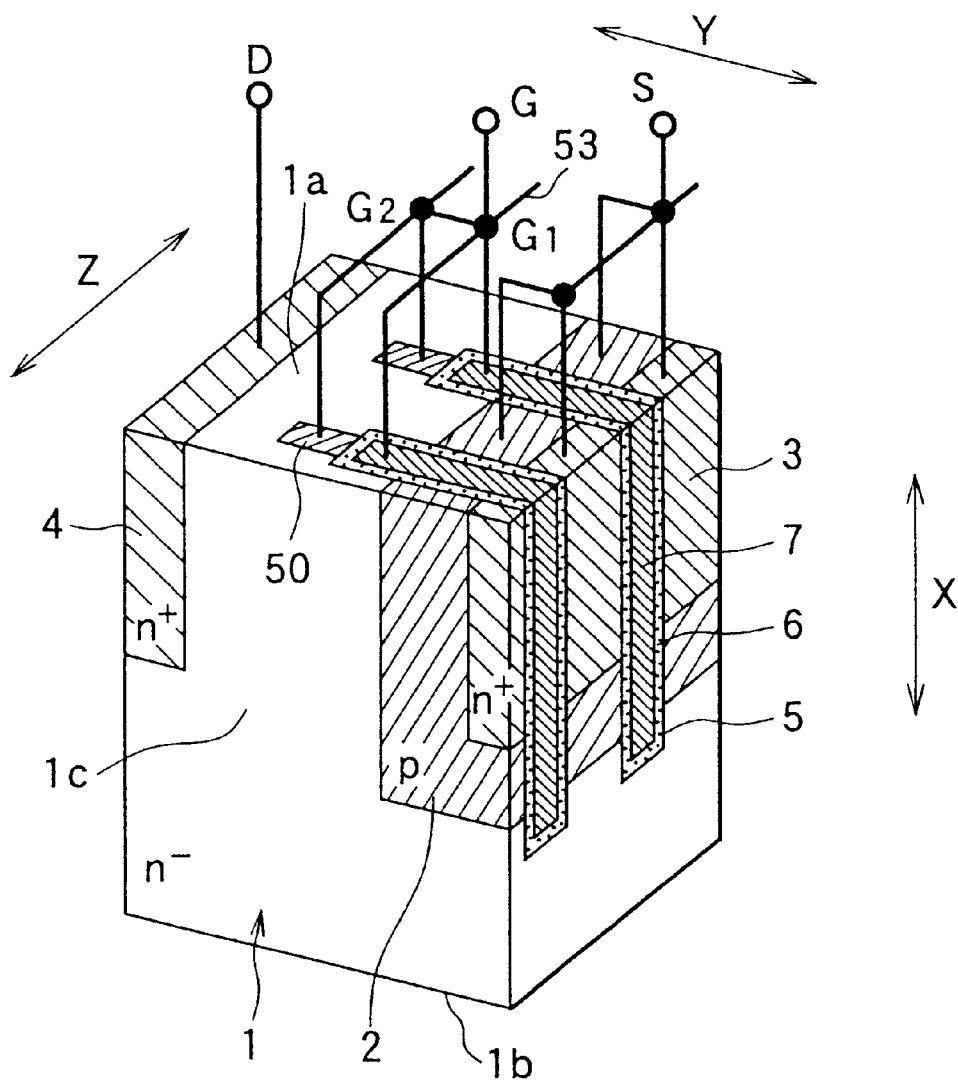
FIG. 18 is a perspective sectional view showing a power MOSFET in a thirteenth preferred embodiment.

FIG. 18 illustrates a perspective sectional view of a power MOSFET in the thirteenth embodiment of the present invention. As shown in this embodiment, the p-type regions 50 as the injection layers in the structure of the tenth embodiment may well be connected to a gate wiring line 53, thereby to electrically connect the p-type regions 50 and gate electrodes 7. Thus, carriers can be injected only in the ON state of the MOSFET. Therefore, a wasteful injection current can be controlled so as not to flow in the OFF state of the MOSFET.

Fourteenth Embodiment

Figure 19:
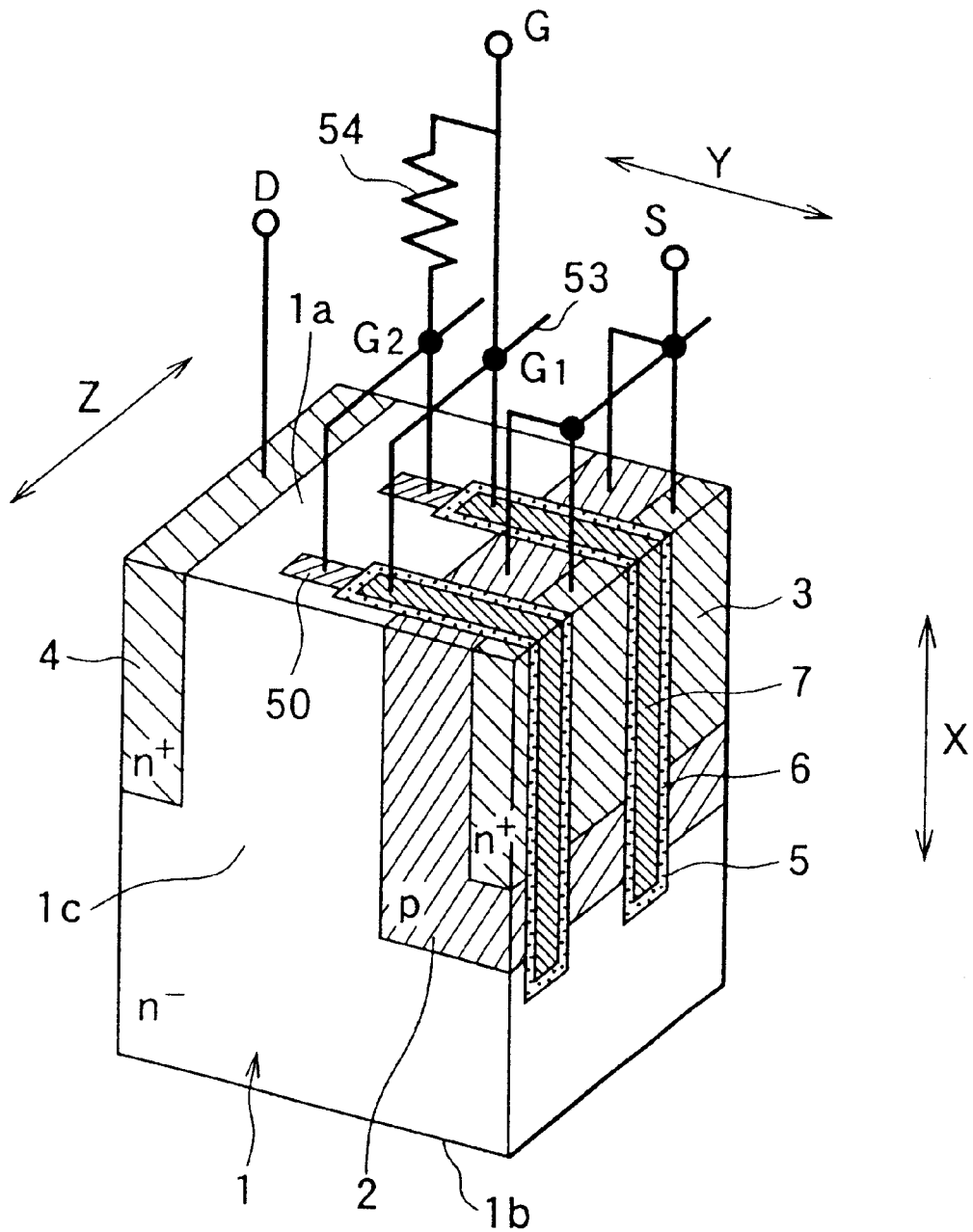
FIG. 19 is a perspective sectional view showing a power MOSFET in a fourteenth preferred embodiment.

FIG. 19 illustrates a perspective sectional view of a power MOSFET in the fourteenth embodiment of the present invention. According to this embodiment, the power MOSFET in the thirteenth embodiment is modified into a structure in which a potential difference is bestowed between voltages respectively applied to the p-type regions 50 as the injection layers and to the gate electrodes 7.

As shown in FIG. 19, the p-type regions 50 are connected to the gate wiring line 53 through a resistor 54. A voltage drop arises across the resistor 54, so that the voltage (for example, 0.7 to 1.2 V), which is lower than the voltage (for example, 5 to 15 V) applied to the gate electrodes 7, is applied to the p-type regions 50. Thus, the same effect as in the thirteenth embodiment is attained, and the desired voltages can be respectively applied to the p-type regions 50 and the gate electrodes 7.

Fifteenth Embodiment

Figure 20:
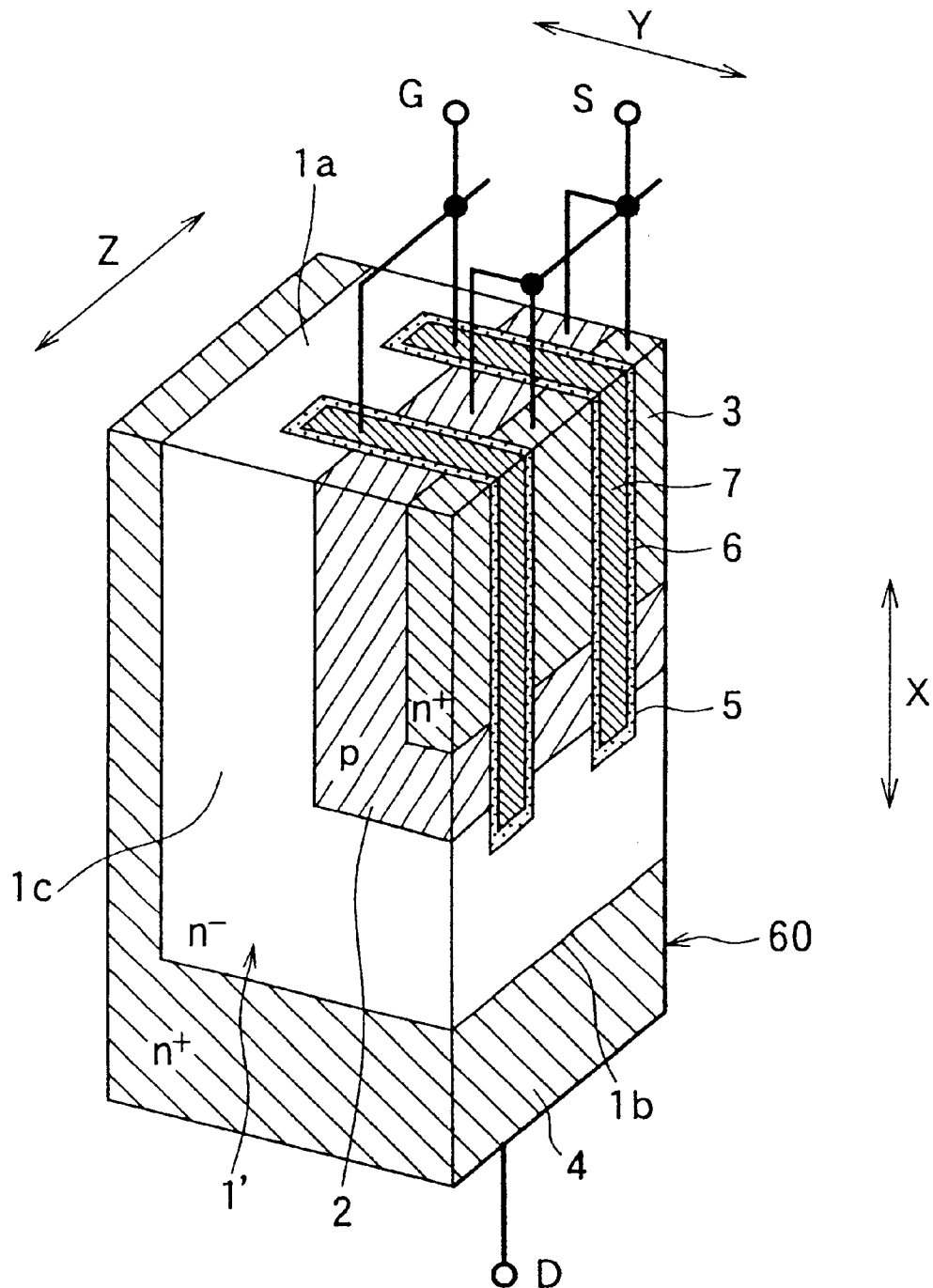
FIG. 20 is a perspective sectional view showing a power MOSFET in a fifteenth preferred embodiment.

FIG. 20 illustrates a perspective sectional view of a power MOSFET in the fifteenth embodiment of the present invention. Besides, FIG. 21 illustrates a schematic plan view of an example of layout adopted for the power MOSFETs in this embodiment.

This embodiment consists in the combination of the structures of the power MOSFETs in the first and fourth embodiments. As shown in FIG. 20, an n$^+$-type drain region 4 is extended in the X-direction and is also formed on the back surface of a substrate. The n$^+$-type drain region 4 has uniform concentration distributions in both its part extended in the X-direction and in its part formed on the back surface of the substrate. This n$^+$-type drain region 4 is made of an n$^+$-type substrate 60. As will be described later, the power MOSFET in this embodiment is manufactured in such a way that a recess is formed in the n$^+$-type substrate 60 and is thereafter filled up with the drift region 1c, p-type base region 2 and n$^+$-type source region 3. Besides, the n$^+$-type drain region 4 and a drain electrode are electrically connected on the back side of the substrate.

Figure 21:
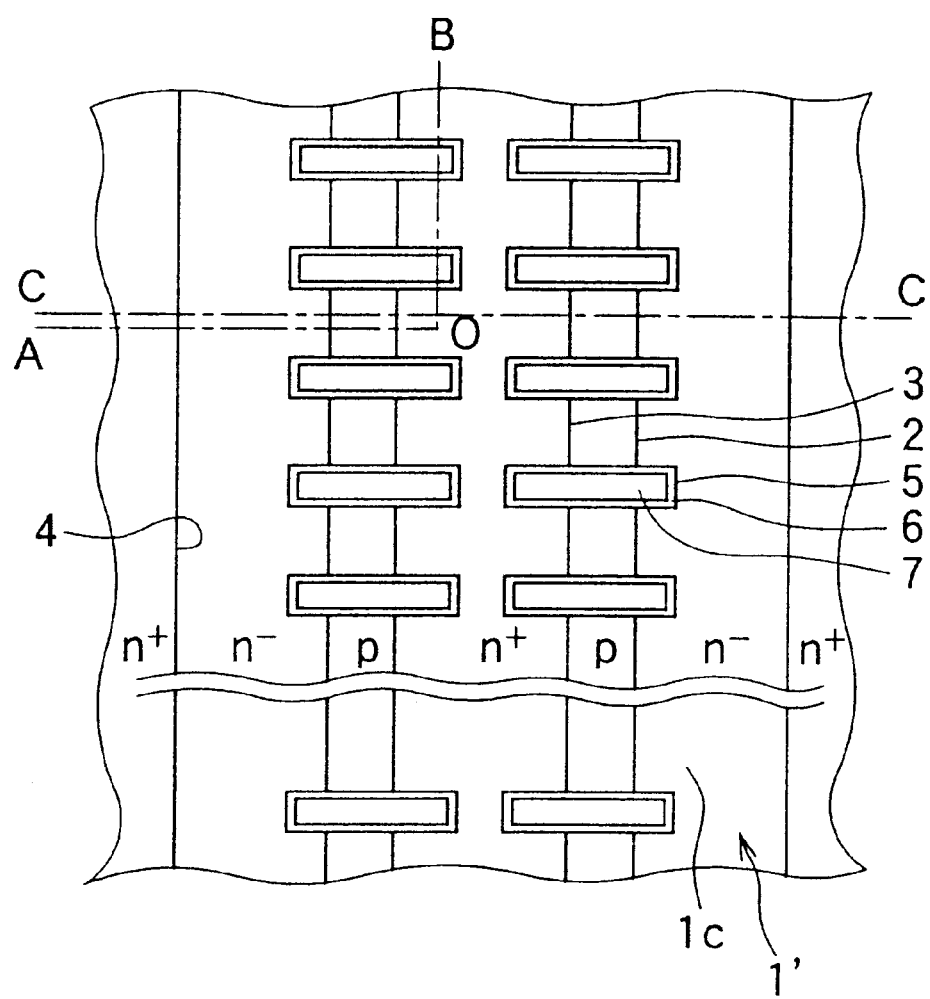
FIG. 21 is a schematic view showing a layout of the power MOSFET shown in FIG. 20.

As shown in FIG. 21, the power MOSFETs each being thus constructed are arranged in substantially the same layout as in the first embodiment. Incidentally, FIG. 20 corresponds to section A–O–B indicated in FIG. 21 as seen in perspective.

Also in the power MOSFET of such a construction, a channel width can be set in accordance with the depth of the trench 5, so that a channel resistance, a drift resistance, etc. per unit area can be lowered and decrease a normalized ON resistance (ON resistance per mm-square).

Figure 22:
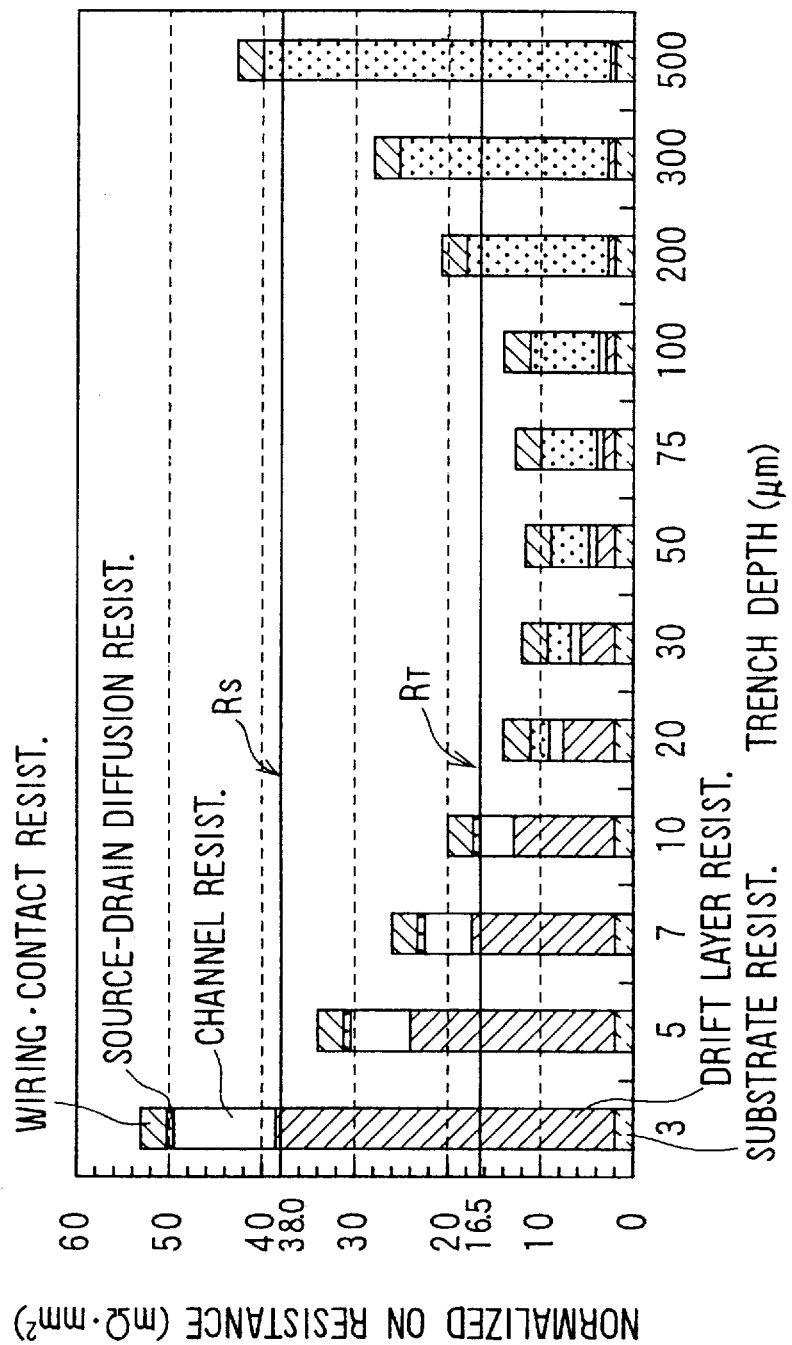
FIG. 22 is a graph showing a relation between a normalized ON resistance and a trench depth.

Regarding the power MOSFET in this embodiment, the depth of the trench 5 was changed, and the normalized ON resistances of respective samples were investigated. The results are shown in FIG. 22. As seen from this figure, the normalized ON resistance of the power MOSFET lowers as the trench 5 is deepened more, but it rises when the trench 5 is deepened excessively. The reason therefor is that the internal resistances of the n$^+$-type drain region 4, etc. enlarge with increase in the trench depth. More specifically, in the X-direction, the internal resistances of the n$^+$-type drain region 4, etc. enlarge in a relationship equivalent to the series connection of the resistances. Therefore, notwithstanding that a resistance value in the Y-direction diminishes in the relationship of the parallel connection of the resistances with the spread of the channel width, the overall impedance rises to enlarge the normalized ON resistance.

On calculations, when the trench depth is set at about 5 $\mu$m to 300 $\mu$m, it is possible to realize a normalized ON resistance that is lower than the limit value $R_s$ (supposed to be 38.0 m$\Omega\cdot$mm$^2$) of a lowered ON resistance based on micrifying in the MOSFET of the prior-art structure shown in FIG. 52C. Besides, in order to realize a normalized ON resistance which is lower than a theoretical limit value $R_T$ (16.5 m$\Omega\cdot$mm$^2$) of the normalized ON resistance in the MOSFET of the prior-art structure, the trench depth should desirably be set at about 20 to 100 $\mu$m. Further, considering a design margin and a process margin, the trench depth should optimally be set at about 30 to 50 $\mu$m.

Moreover, another effect can be attained by the contrivance in the power MOSFET of this embodiment that the drain electrode that is electrically connected with the n$^+$-type drain region 4 is arranged on the back side of the substrate as mentioned in the fourth embodiment. The effect will be explained with reference to FIGS. 23A and 23B.

Figure 23A:
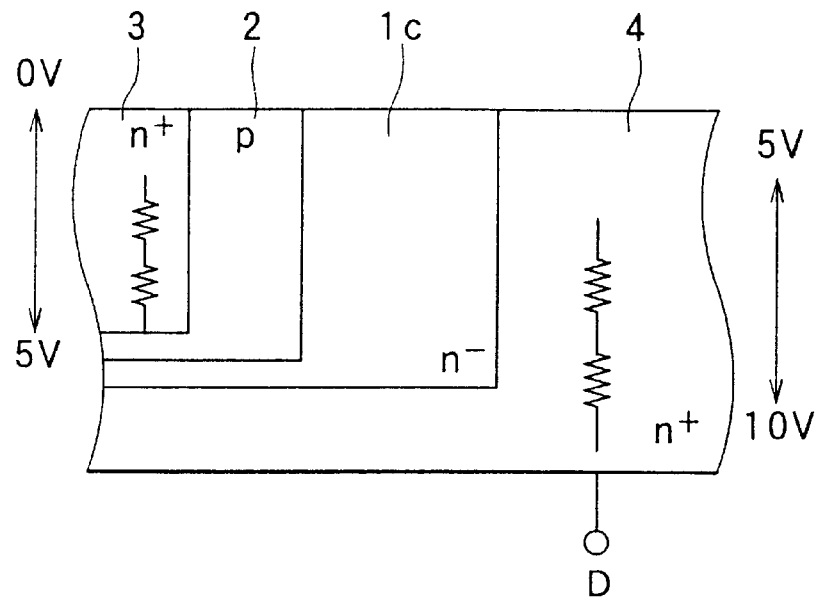
FIGS. 23A and 23B are explanatory views for comparing the power MOSFET shown in FIG. 20 and a conventional MOSFET.
Figure 23B:
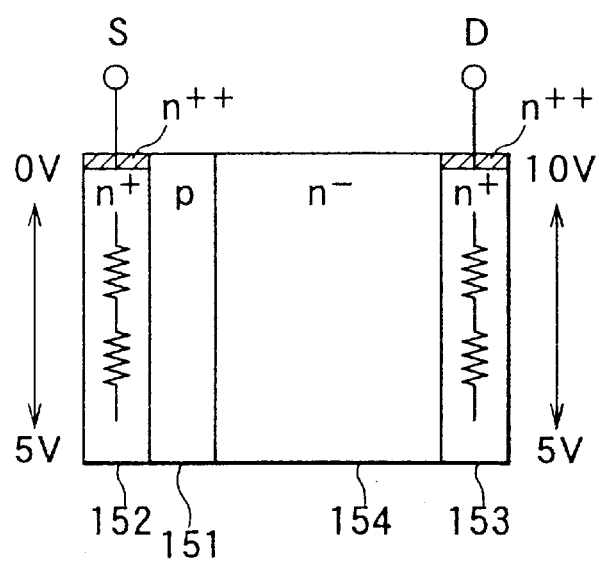
Figure 53:
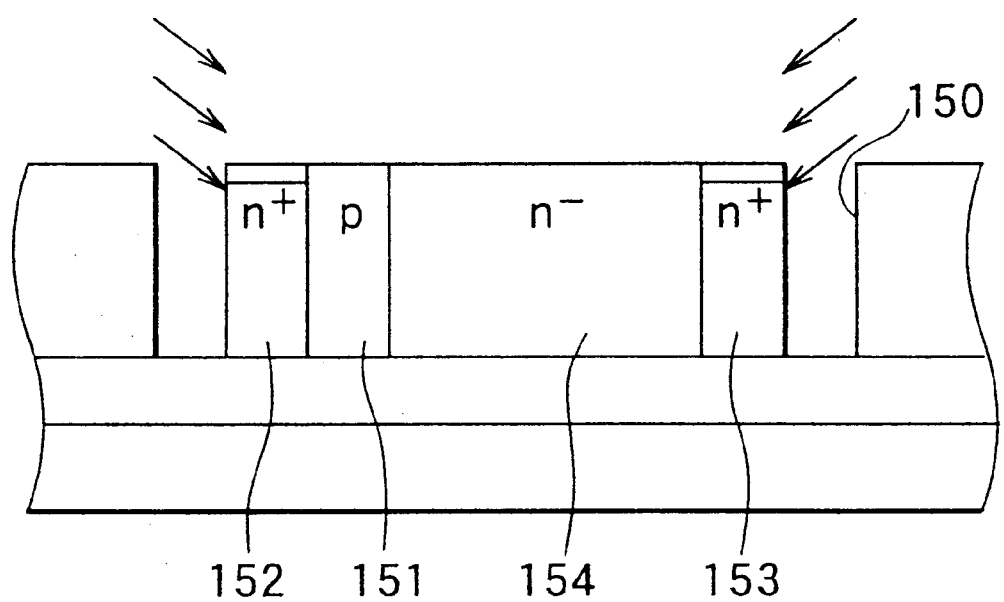
FIG. 53 is a sectional view showing another conventional power MOSFET.

FIG. 23A schematically depicts the sectional construction of the power MOSFET in this embodiment, while FIG. 23B schematically depicts the sectional construction of the prior-art device shown in FIG. 53.

As shown in FIGS. 23A and 23B, when the n$^+$-type source region 3 and n$^+$-type drain region 4 and the source layer 152 and drain layer 153 are deepened, potential differences corresponding to the depths are developed by the internal resistances of the regions and the layers during the operations of the power MOSFETs.

In the case of the power MOSFET of this embodiment as shown in FIG. 23A, when 0 V and 10 V are respectively applied to the source electrode connected with the n$^+$-type source region 3 and to the drain electrode connected with the n$^+$-type drain region 4, the potential differences ascribable to the internal resistances bring the deepest part (nearest the back surface side of the substrate) of the n$^+$-type source region 3 to, for example, 5 V and the uppermost part (nearest the principal surface side of the substrate) of the n$^+$-type drain region 4 to, for example, 5 V. On the other hand, in the case of the prior-art device as shown in FIG. 23B, a source electrode and drain electrode, which are respectively connected to the source layer 152 and drain layer 153 can be arranged only on the principal surface side of the substrate, and hence, even when 0 V and 10 V are respectively applied to the source electrode and drain electrode, the potential differences ascribable to the internal resistances arise to bring the deepest parts of the source layer 152 and drain layer 153 to, for example, about 5 V.

As understood from these situations, in the case of the prior-art device, even when a source/drain potential difference is 10 V on the principal surface side of the substrate, it diminishes with the depth from the principal surface of the substrate, and it becomes almost null at the deepest parts of the source layer 152 and drain layer 153. Therefore, a channel uniform in the depth direction is not formed, and a uniform current path is not formed. Especially in the case where the source layer 152 and drain layer 153 have concentration distributions in the width direction as in the prior-art device, the quantities of increases in the internal resistances on the occasion of deepening the source layer 152 and drain layer 153 are large, and hence, the decrease of the ON resistance cannot be sufficiently achieved.

In contrast, in the power MOSFET of this embodiment, the potential difference between the n$^+$-type source region 3 and the n$^+$-type drain region 4 becomes substantially constant from the principal surface side of the substrate to the back surface side thereof. Therefore, the uniform channel can be formed, and the uniform current path can be formed. Thus, the decrease of the ON resistance can be sufficiently achieved.

Next, manufacturing steps for the power MOSFET in this embodiment are illustrated in FIGS. 24A through 24F, FIGS. 25A through 25F, and FIGS. 26A through 26D, and a method of manufacturing the power MOSFET will be described with reference to these figures. By the way, in these figures, the states of section C—C in FIG. 21 are shown on the left sides of sheets of paper, and the states of section O–B in FIG. 21 are shown on the right sides of the sheets of paper.

Steps Shown in FIGS. 24A and 24B

First, an n$^+$-type substrate 60 to form an n$^+$-type drain region 4 is prepared. Besides, a silicon oxide film 61 is formed on the n$^+$-type substrate 60 by thermal oxidation, CVD or the like. In addition, the region of the silicon oxide film 61 scheduled to form a drift region 1c is etched into an opening by photolithography. On this occasion, the width of the opening in the direction of section C—C in FIG. 21 is set at, for example, 10 to 100 μm.

Step Shown in FIGS. 24C and 24D

At the next step, using the silicon oxide film 61 as a mask, trench etching is performed at a depth of, for example, 10 to 100 μm. Thus, the part of the n$^+$-type substrate 60 other than the area thereof to become the n$^+$-type drain region 4 is removed, and a trench 62 is formed. The trench etching on this occasion may be either of dry etching and wet etching.

Steps Shown in FIGS. 24E and 24F

Subsequently, an n$^-$-type film 63 is formed on the inner wall surface of the trench 62. The n$^-$-type film 63 corresponds to the drift region 1c. On this occasion, the n$^-$-type film 63 is formed by, for example, epitaxial growth, so that the drift region 1c is formed having a substantially uniform thickness and a substantially uniform concentration distribution. Further, a p-type film 64 is formed so as to cover the n$^-$-type film 63. The p-type film 64 corresponds to a p-type base region 2. Since this p-type film 64 is also formed by, for example, epitaxial growth, it is formed having a substantially uniform thickness and a substantially uniform concentration distribution.

Figures 25A, 25B:
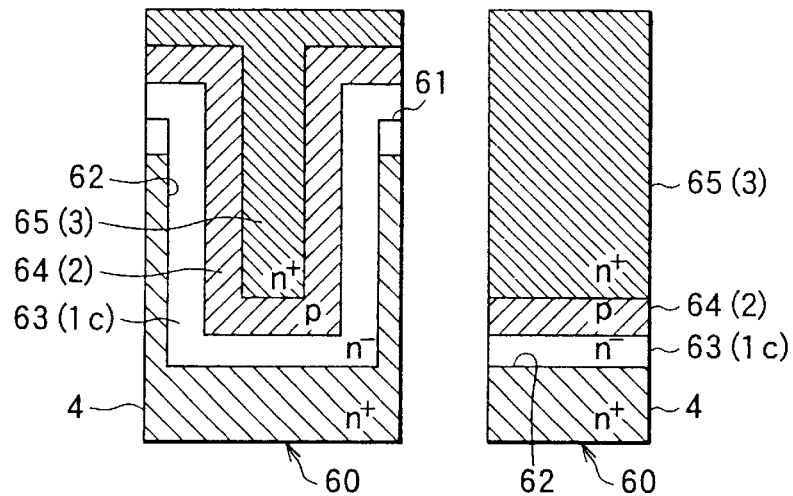
FIGS. 25A to 25F are sectional views showing steps for manufacturing the power MOSFET shown in FIG. 20, performed following the steps shown in FIGS. 24A to 24F.

Step Shown in FIGS. 25A and 25B

Next, an n$^+$-type film 65 is formed so as to cover the p-type film 64 and to fully fill the trench 62. The n$^+$-type film 65 corresponds to an n$^+$-type source region 3. Since this n$^+$-type film 65 is also formed by, for example, epitaxial growth, the n$^+$-type source region 3 is formed having a substantially uniform thickness and a substantially uniform concentration distribution. Incidentally, on this occasion, the n$^+$-type film 65 may well be formed by depositing a poly-silicon film doped with an n-type impurity.

In this way, the drift region 1c, p-type base region 2 and n$^+$-type source region 3 each having the substantially uniform thickness and the substantially uniform concentration distribution are formed, so that the positional relationships of these regions are determined in self-alignment fashion.

Figures 25C, 25D:
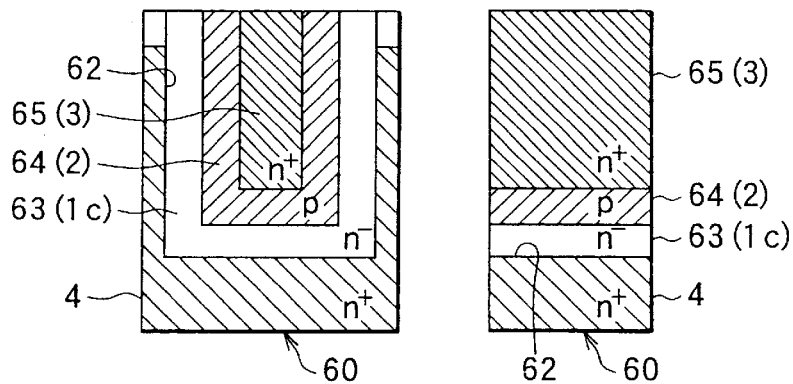

Step Shown in FIGS. 25C and 25D

A polishing treatment for flattening is carried out on the front surface side of the substrate until the n$^+$-type film 65, p-type film 64 and n$^-$-type film 63 are flattened using, for example, the silicon oxide film 61 as an etching stopper.

Figures 25E, 25F:
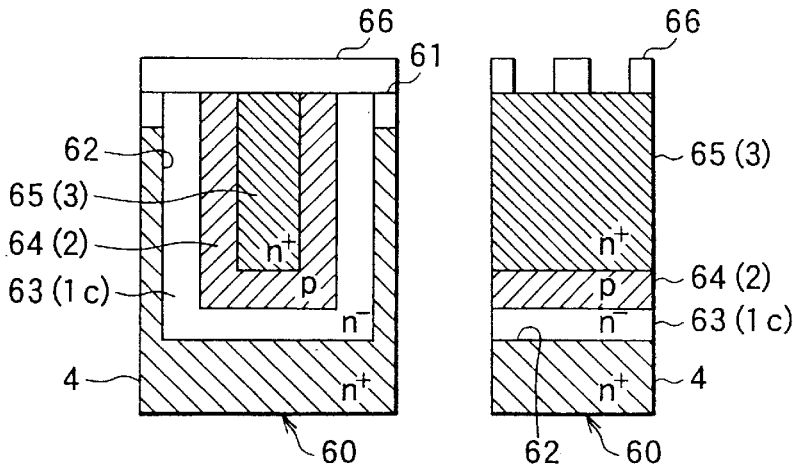

Steps Shown in FIGS. 25E and 25F

Subsequently, a silicon oxide film 66 is formed on the whole front surface of the substrate by CVD or the like. Thereafter, openings are provided in the areas of the silicon oxide film 66 scheduled to form trenches 5, by photolithography.

Figure 26A:
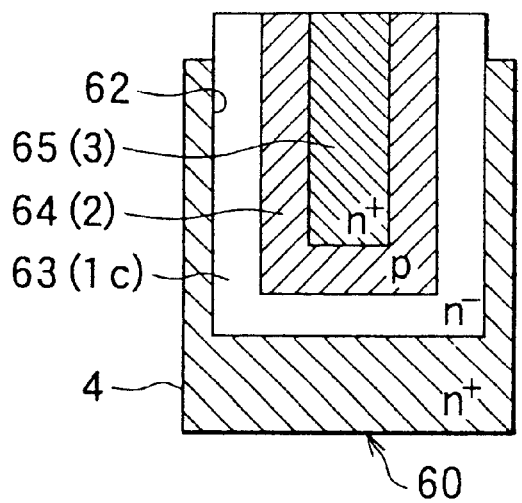
FIGS. 26A to 26D are sectional views showing steps for manufacturing the power MOSFET shown in FIG. 20, performed following the steps shown in FIGS. 25A to 25F.
Figure 26B:
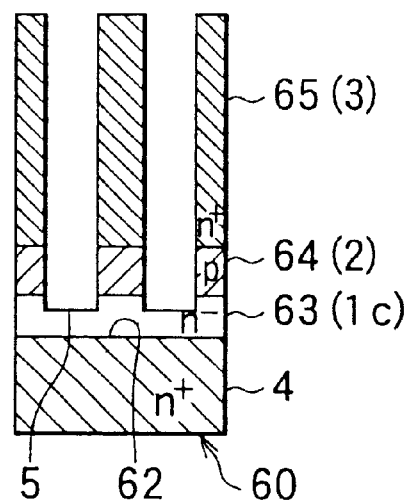

Steps Shown in FIGS. 26A and 26B

Using the silicon oxide films 66 and 61 as a mask, trench etching is performed at a depth of, for example, 10 to 100 μm. The trench etching on this occasion may be either of dry etching and wet etching. Thus, the trenches 5 each of which penetrates the p-type base region 2 from the n$^+$-type source region 3 and reaches the drain region 1c are formed. Thereafter, the silicon oxide films 66 and 61 are removed.

Figure 26C:
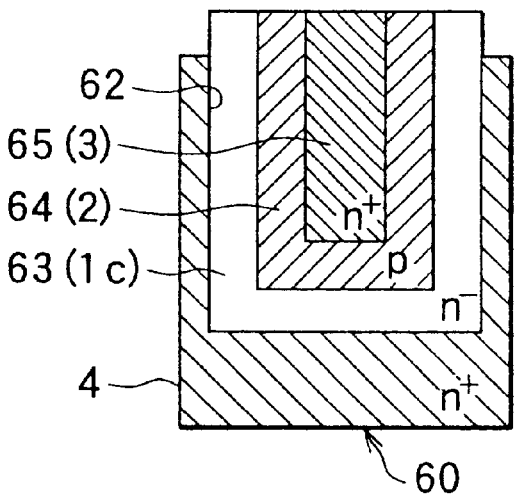
Figure 26D:
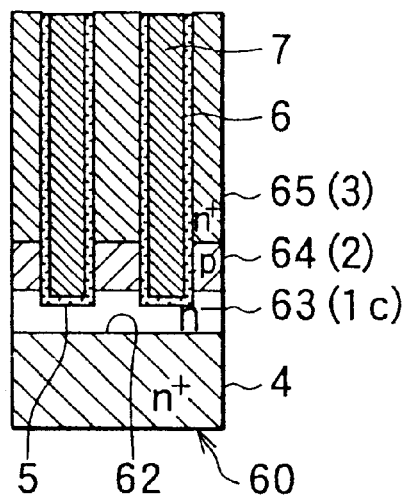

Steps Shown in FIGS. 26C and 26D

Besides, gate oxide films 6 are formed on the inner walls of the trenches 5 by gate oxidation. Further, the interiors of the gate oxide films 6 are filled up with n$^+$-type poly-silicon, thereby to form gate electrodes 7. At this step of burying the n$^+$-type poly-silicon, the film thereof needs to be deposited thick because of the necessity of fully filling the interiors of the trenches 5. Therefore, the deposited film is subsequently etched back to thin that part of the n$^+$-type poly-silicon that lies above the front surface of the substrate.

Further, the thinned film of the n$^+$-type poly-silicon is subjected to photolithography so that the necessary parts thereof are covered with a photoresist, and the resulting n$^+$-type poly-silicon film is thereafter patterned by dry or wet etching. Thus, wiring layers (not shown) which are respectively connected to the plurality of gate electrodes 7 are formed, and the gate electrodes 7 are simultaneously formed to the extent of being flush with the front surface of the substrate or being somewhat depressed therefrom.

Lastly, although no illustration is made, known processes are carried out to form a source electrode that lies in contact with the n$^+$-type source region 3 and also with the p-type base region 2, on the front side of the substrate, and a drain electrode that lies in contact with the n$^+$-type drain region 4, on the back side of the substrate. Thereafter, electric wiring lines for establishing the electrical conductions of the gate electrodes 7 and the source electrode with the exterior are patterned. Further, the front side of the substrate is covered with a protective film. Then, the power MOSFET in this embodiment is finished up.

According to such a manufacturing method, trenches need not be formed successively on the respective occasions of the step of forming the drift region 1c, the step of forming the p-type base region 2, and the step of forming the n$^+$-type source region 3. That is, one time of trench etching is performed, and the drift region 1c, p-type base region 2 and n$^+$-type source region 3 are deposited in succession, whereby they can be formed in self-alignment fashion. Therefore, only one time of trench etching suffices. Thus, it is permitted to simplify the manufacturing process of the power MOSFET and to curtail the manufacturing cost thereof.

Incidentally, although the case of applying the embodiment of the present invention to the power MOSFET has been described in this embodiment, the embodiment may well be adopted for any other structure.

Figure 27:
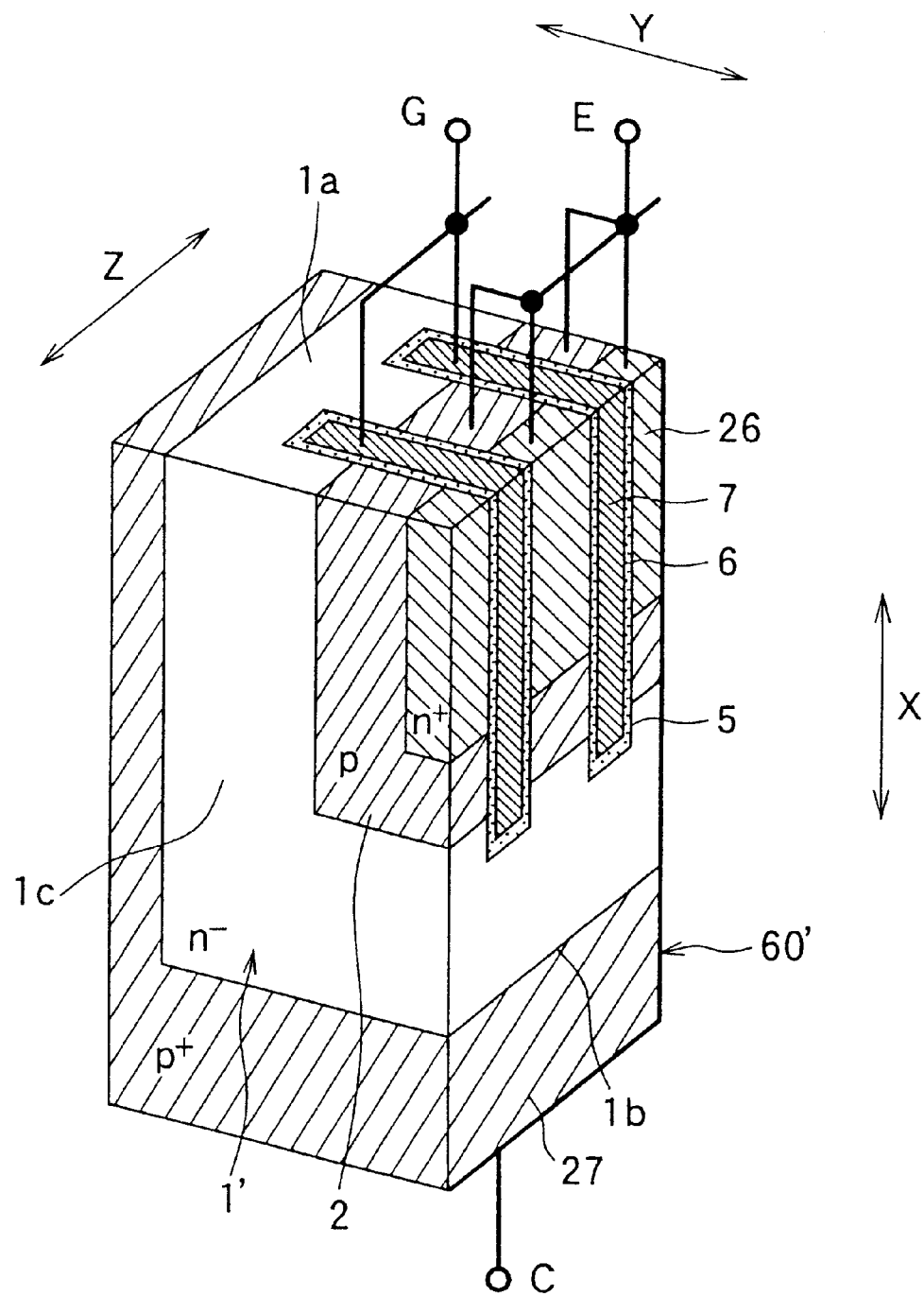
FIG. 27 is a perspective sectional view showing an IGBT adopting the structure of the fifteenth embodiment.

For example, this embodiment may well be applied to an IGBT as shown in FIG. 27. In this case, as shown in FIG. 27, the n$^+$-type source region 3 and the n$^+$-type drain region 4 in FIG. 20 may well be respectively altered into an n$^+$-type emitter region. 26 and a p$^+$-type collector region 27. Herein, the IGBT of the structure shown in FIG. 27 can be manufactured in such a way that a manufacturing process similar to the above process of the power MOSFET is performed using a p$^+$-type substrate 60' which forms the p$^+$-type collector region 27.

Figure 28:
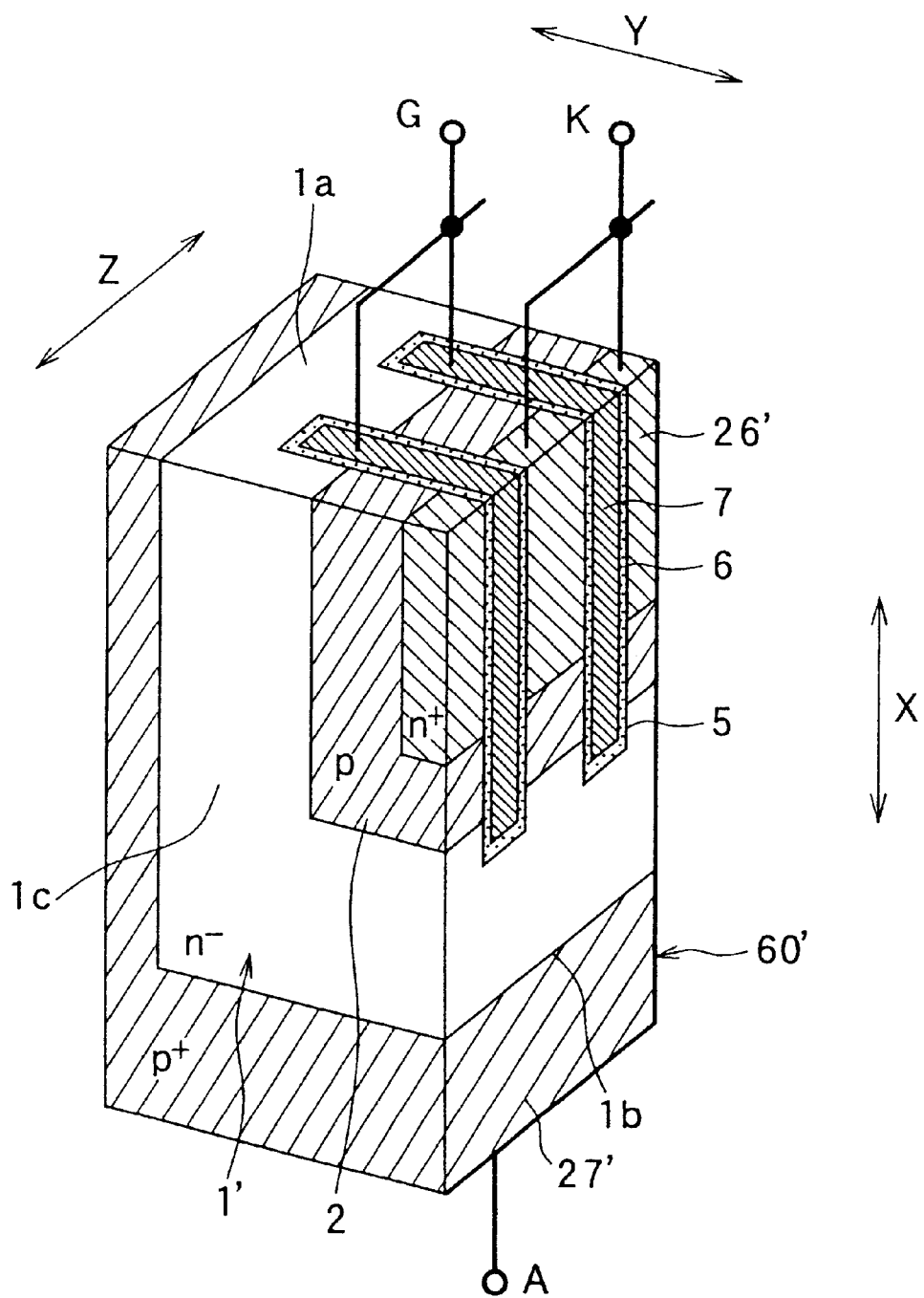
FIG. 28 is a perspective sectional view showing an MCT adopting the structure of the fifteenth embodiment.

Besides, this embodiment may well be applied to an MCT (Mos Controlled Thyristor) shown in FIG. 28. In this case, the structure of the MCT is similar to that of the IGBT shown in FIG. 27. In this case, the n$^+$-type emitter region 26 functions as an n$^+$-type cathode region 26', and the p$^+$-type collector region 27 as a p$^+$-type anode region 27'. Since, however, a p-type base region 2 in the MCT needs to be held in a floating state, it is not electrically connected with the n$^+$-type cathode region 26'. In such an MCT, channel regions can be turned ON/OFF by controlling an applied voltage to gate electrodes 7. Incidentally, the structure as stated above can be manufactured by a method which is similar to that of the IGBT shown in FIG. 27. Since, however, the p-type base region 2 needs to be held in the floating state, a wiring pattern by which the p-type base region 2 and the n$^+$-type cathode region 26' are not electrically connected needs to be formed at the formation of wiring lines performed last (after the steps shown in FIGS. 26C and 26D).

Figure 29:
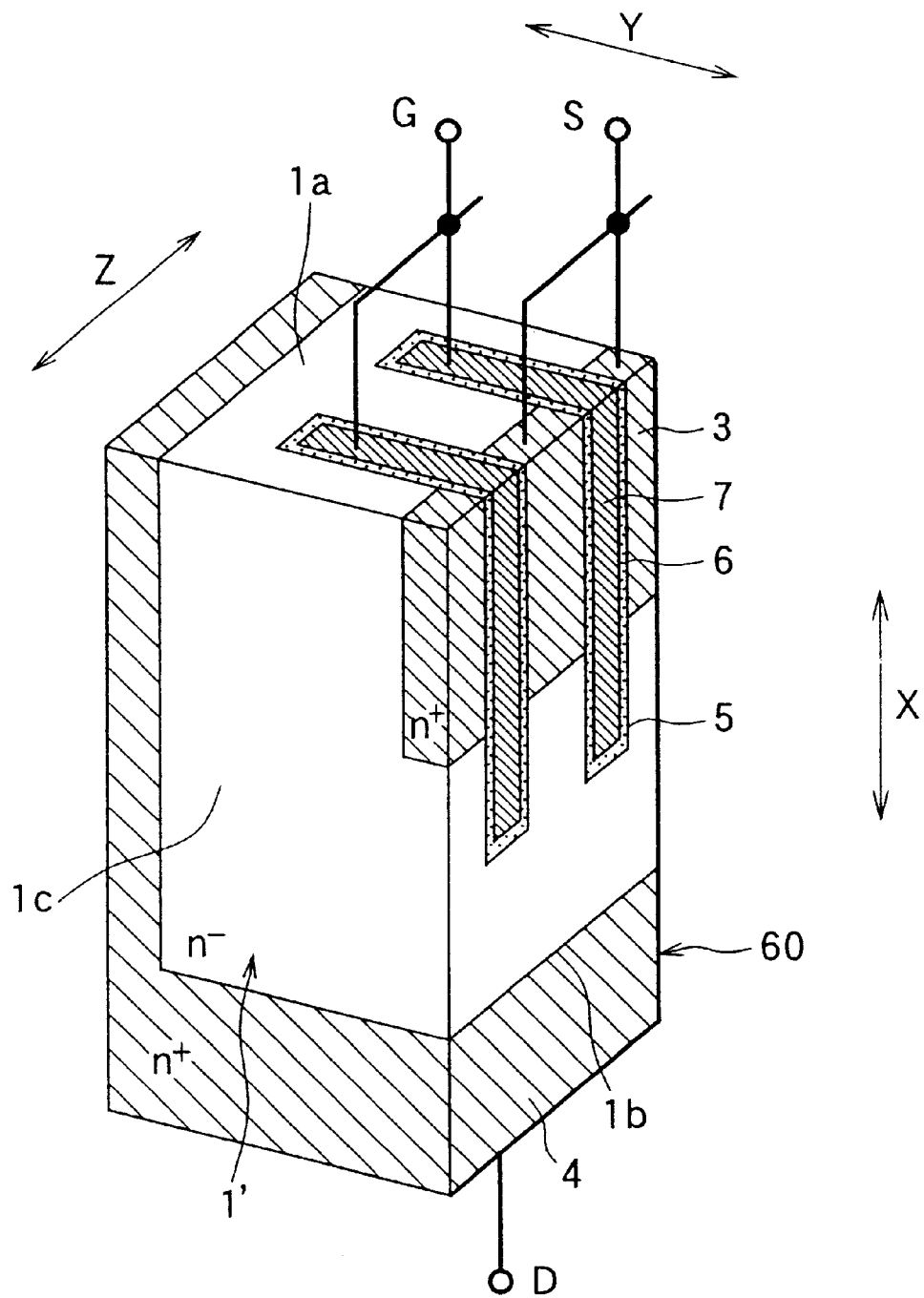
FIG. 29 is a perspective sectional view showing an ACCUFET adopting the structure of the fifteenth embodiment.

Further, this embodiment may well be applied to an ACCUFET shown in FIG. 29. In this case, the structure of the ACCUFET is substantially the same as that of the power MOSFET shown in FIG. 20, but it does not include the p-type base region 2 in the power MOSFET. In such an ACCUFET, for example, when a voltage is applied to gate electrodes 7, a depletion layer spreads onto the side of a drift region 1c between the adjacent gate electrodes 7, and the quantity of the spread of the depletion layer is changed by controlling the applied voltage, so as to control channel regions. Such a structure can be manufactured by omitting the step of forming the p-type base region 2 from the process of the power MOSFET shown in FIG. 20.

Sixteenth Embodiment

Figure 30:
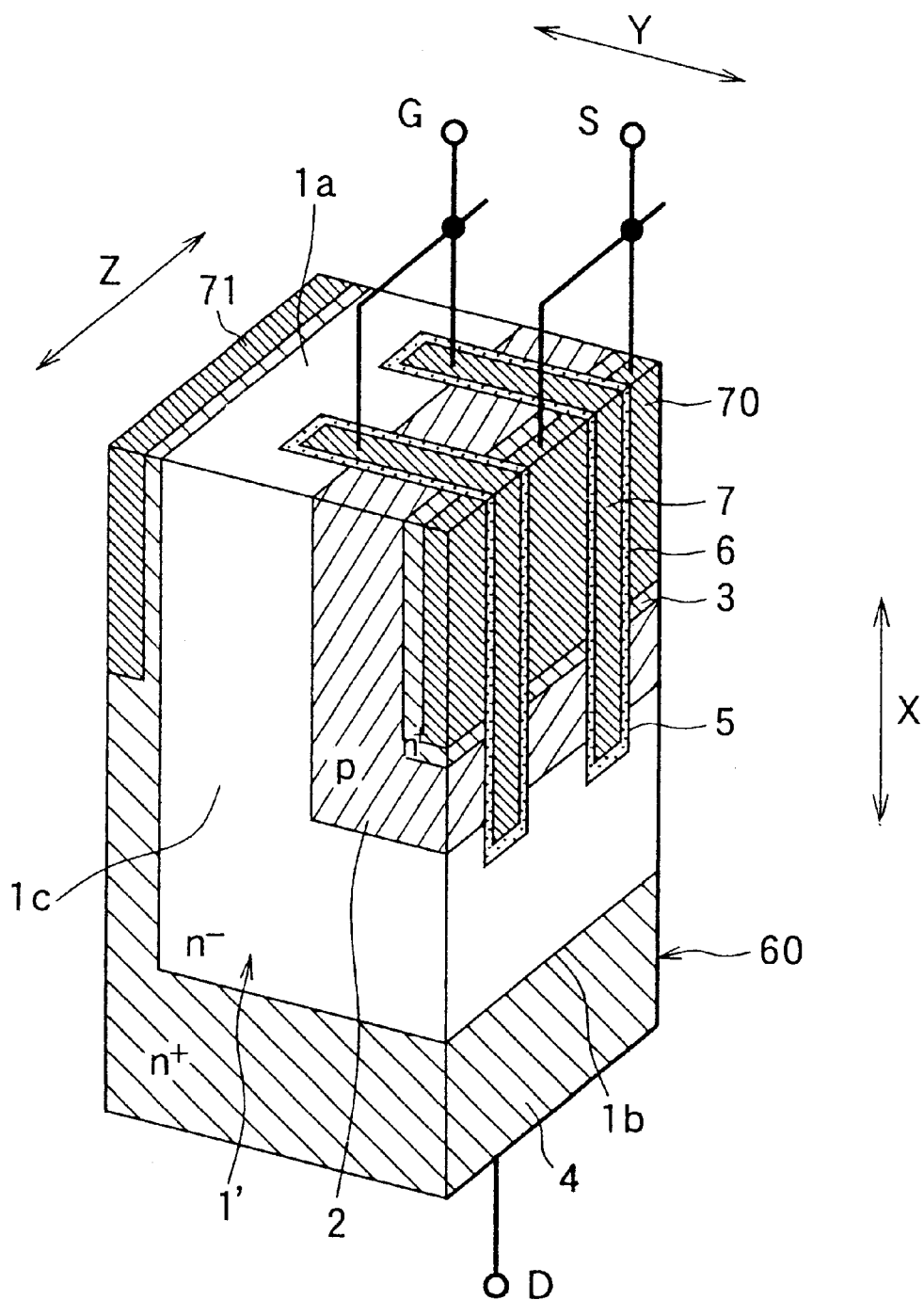
FIG. 30 is a perspective sectional view showing a power MOSFET in a sixteenth preferred embodiment.

FIG. 30 illustrates a perspective sectional view of a power MOSFET in the sixteenth embodiment of the present invention. In this embodiment, as compared to the power MOSFET of the fifteenth embodiment, the internal resistances of the $n^+$-type source region 3, etc. in the X-direction are lowered.

As shown in FIG. 30, resistance lowering layers 70, 71 extended from the front surface of the substrate in the X-direction are respectively provided in the $n^+$-type source region 3 and $n^+$-type drain region 4. The resistance lowering layers 70, 71 are made of a material which is lower in resistivity than semiconductor materials, and which is, for example, a metal such as Al, Cu, W or Ti, or a refractory metal silicide such as $WSi_2$, $TiSi_2$ or $CoSi_2$. In this embodiment, the resistance lowering layers 70, 71 are formed at equal depths, which are shallower than the $n^+$-type source region 3.

Owing to the resistance lowering layers 70, 71 thus formed, the contact between the $n^+$-type source region 3 and the electric wiring becomes a substantially three-dimensional structure, whereby increases in the resistances of the $n^+$-type source region 3 and $n^+$-type drain region 4 in the X-direction can be suppressed.

As already indicated in the experimental result of the fifteenth embodiment (refer to FIG. 22), the internal resistances of the $n^+$-type source region 3, etc. increase more as the trench depth becomes greater, in the fifteenth embodiment. In contrast, the increase of the ON resistance attributed to a trench depth being excessively great can be suppressed by the contrivance of the sixteenth embodiment. Therefore, the trench depth can be increased more than in the case of the fifteenth embodiment, and the normalized ON resistance can be decreased still further.

Incidentally, the power MOSFET in this embodiment is manufactured by performing steps to be explained below with reference to FIGS. 31A through 31D, after the steps shown in FIGS. 26C and 26D have been performed as in the fifteenth embodiment.

Figures 31A, 31B:
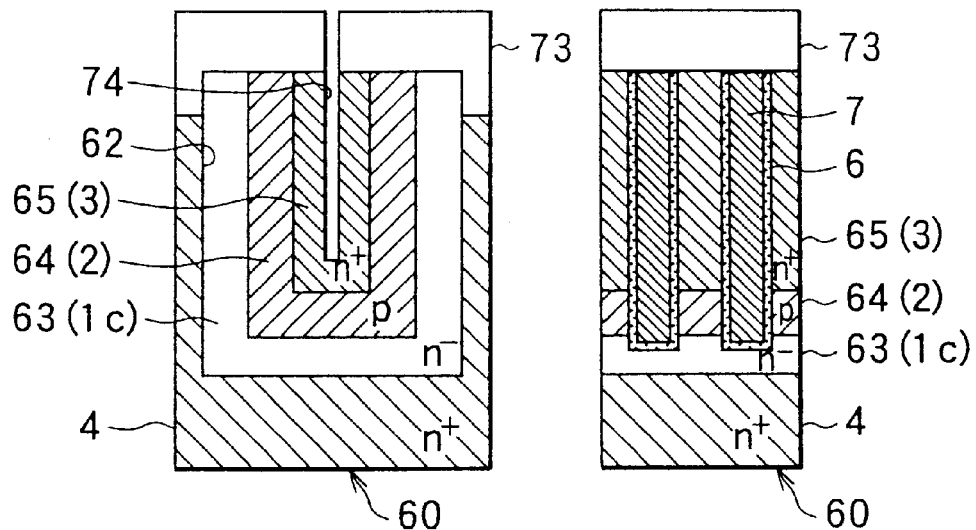
FIGS. 31A to 31D are sectional view showing steps, as an example, for manufacturing the power MOSFET shown in FIG. 30.
Figures 31C, 31D:
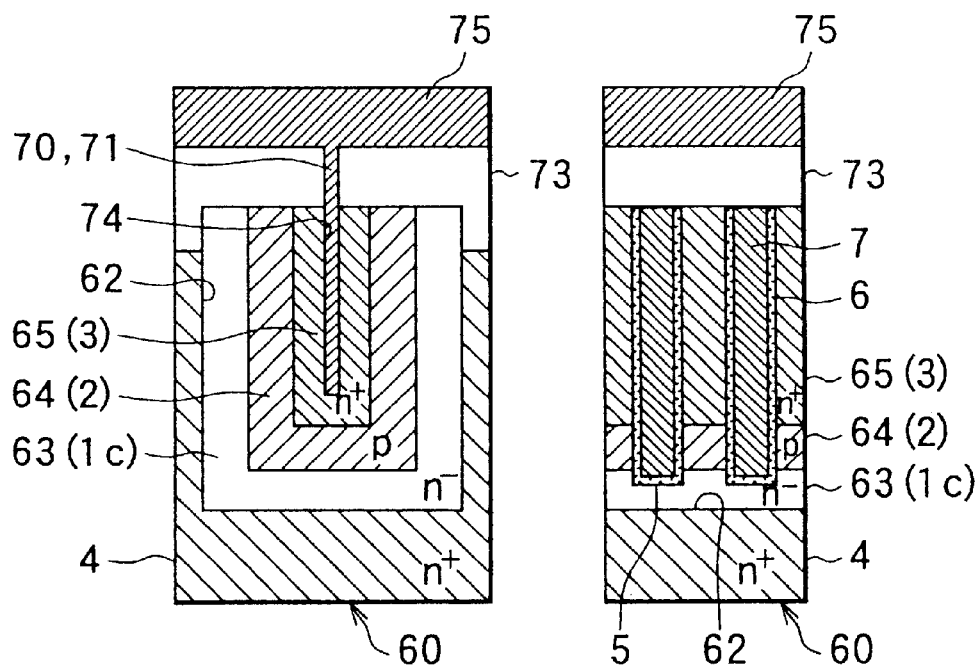

First, as shown in FIGS. 31A and 31B, the front surface of the substrate is covered with an interlayer insulating film 73 of BPSG or the like, and openings are thereafter provided in the interlayer insulating film 73 over regions which are scheduled to form the resistance lowering layers 70, 71. Besides, trenches 74 are formed in the regions scheduled to form the resistance lowering layers 70, 71, by dry or wet etching. Subsequently, as shown in FIGS. 31C and 31D, an Al film 75 as the electric wiring is deposited so as to fill up the interiors of the trenches 74. Those parts of the Al film 75 which fill up the trenches 74 correspond to the resistance lowering layers 70, 71. Thereafter, although no illustration is made, a drain electrode is formed on the back side of the substrate, and the front surface of the substrate is covered with a protective film. Then, the power MOSFET in this embodiment is finished up.

Figures 32A, 32B:
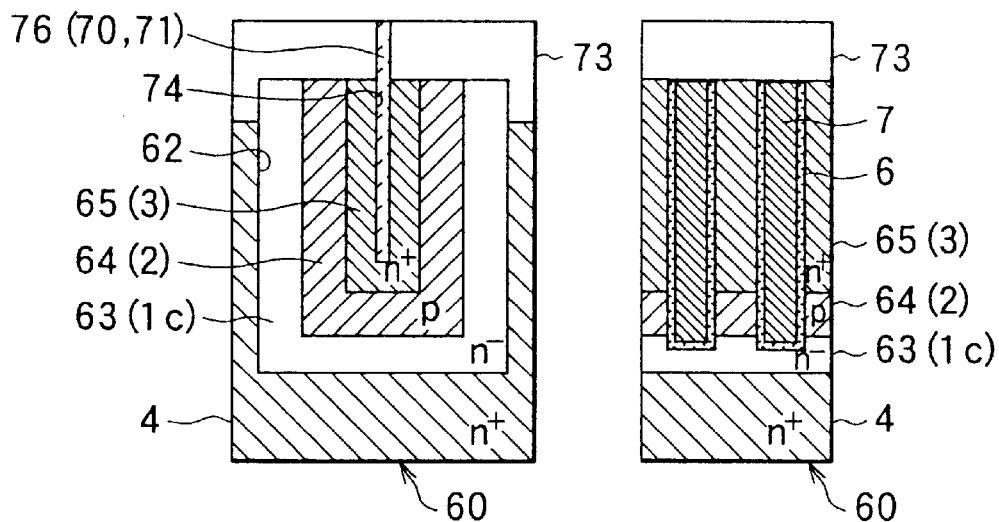
FIGS. 32A to 32D are sectional view showing steps, as another example, for manufacturing the power MOSFET shown in FIG. 30.
Figures 32C, 32D:
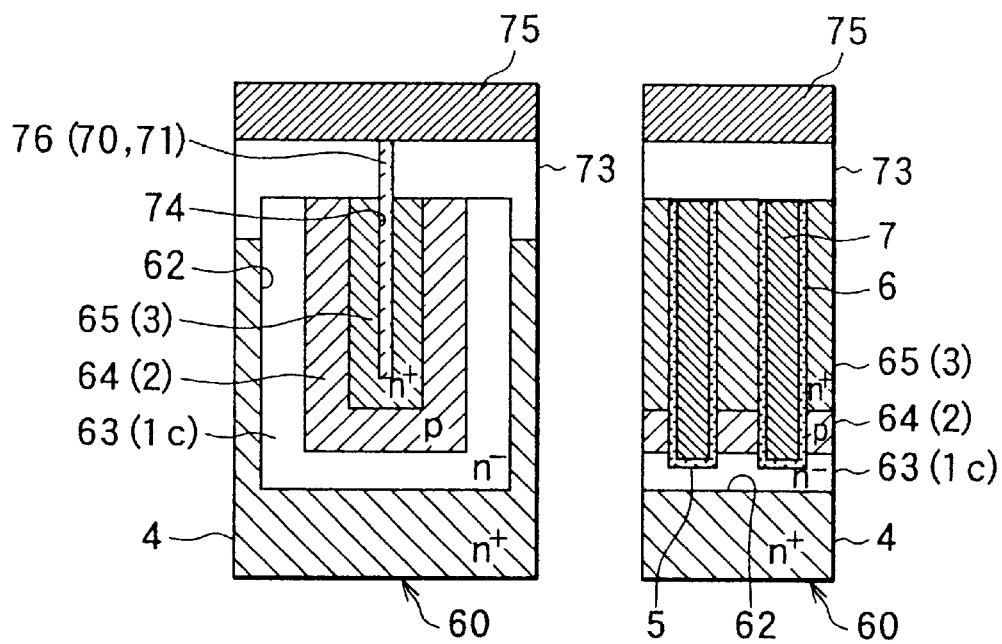

In the above, the trenches 74 are filled up with the Al film 75 at the step shown in FIGS. 31C and 31D. It is also allowed, however, that as shown in FIGS. 32A and 32B, the trenches 74 are filled up with a refractory metal silicide 76, not with the Al film 75, followed by flattening the refractory metal silicide 76, and that as shown in FIGS. 32C and 32D, the Al film 75 is thereafter deposited.

Seventeenth Embodiment

Figure 33:
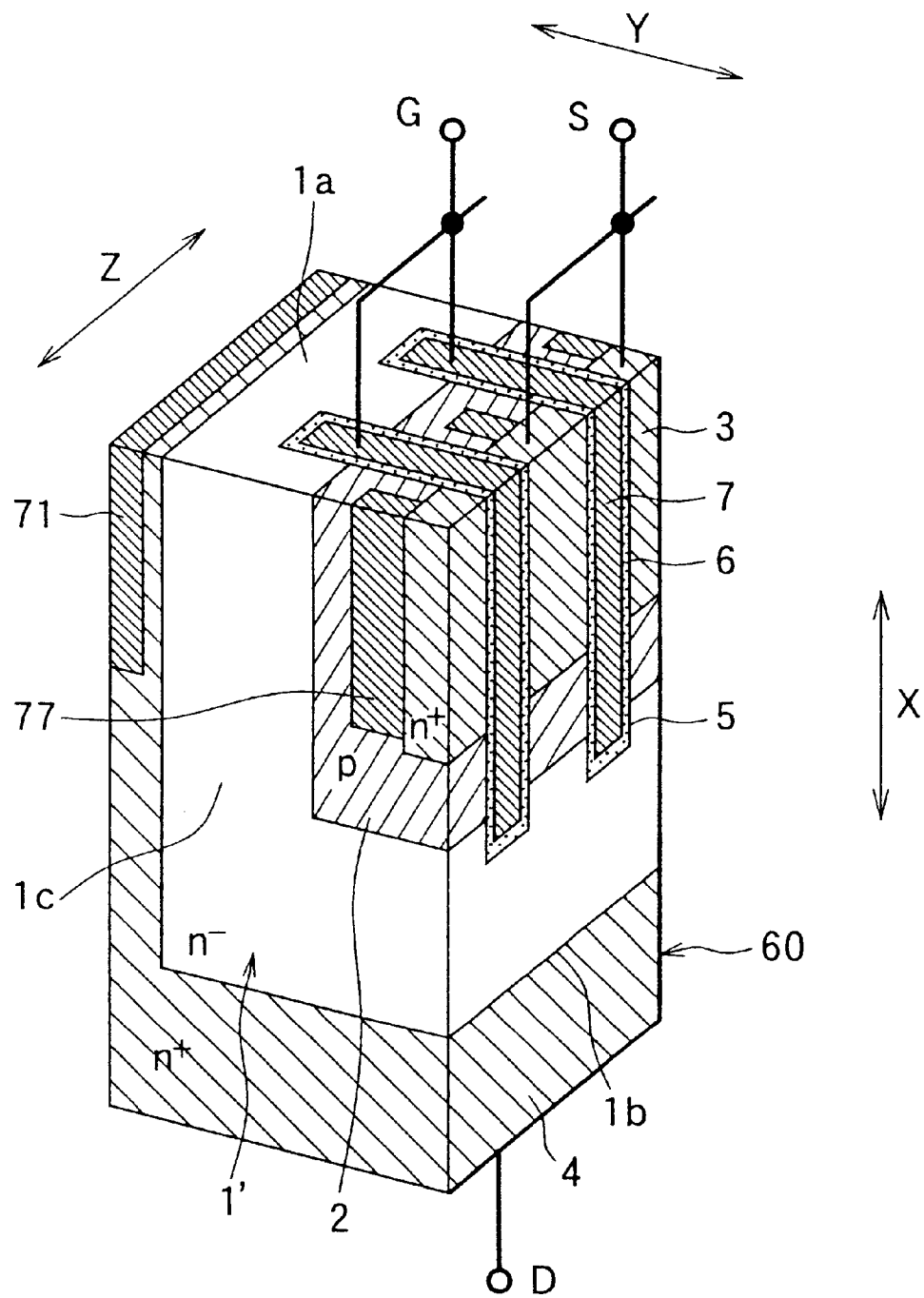
FIG. 33 is a perspective sectional view showing a power MOSFET in a seventeenth preferred embodiment.

FIG. 33 illustrates a perspective sectional view of a power MOSFET in the seventeenth embodiment of the present invention. In this embodiment, as compared to the power MOSFET of the fifteenth embodiment, the potential of the p-type base region 2 can be appropriately fixed.

As shown in FIG. 33, contact layers 77 extended in the X-direction are provided in the p-type base region 3. The contact layers 77 are made of, for example, poly-silicon doped with a p-type impurity and are formed shallower than the p-type base region 2. By the way, a resistance lowering layer 71 plays the same role as in the sixteenth embodiment. Owing to the contact layers 77 thus formed, the contact between the p-type base region 2 and the electric wiring becomes a substantially three-dimensional structure.

The p-type base region 2 is formed at a comparatively low concentration. In the case of the structure of the fifteenth embodiment, therefore, the potential fixation becomes difficult when the p-type base region 2 is formed deep. Consequently, a parasitic transistor which is constructed of the drift region 1c, p-type base region 2 and $n^+$-type source region 3 might be brought into an ON state by static electricity or the like.

In contrast, the potential fixation of the p-type base region 2 can be reliably done by forming the contact layers 77 in the p-type base region 2 as in this embodiment. Thus, the potential fluctuation of the p-type base region 2 attributed to the internal resistance thereof can be prevented. Incidentally, the contact layers 77 are formed in such a way that, after the steps shown in FIGS. 26C and 26D have been performed as in the fifteenth embodiment, trenches are formed by photolithography in the parts of the p-type base region 2 scheduled to form the contact layers 77 and are filled up with poly-silicon of p-type.

Eighteenth Embodiment

Figure 34:
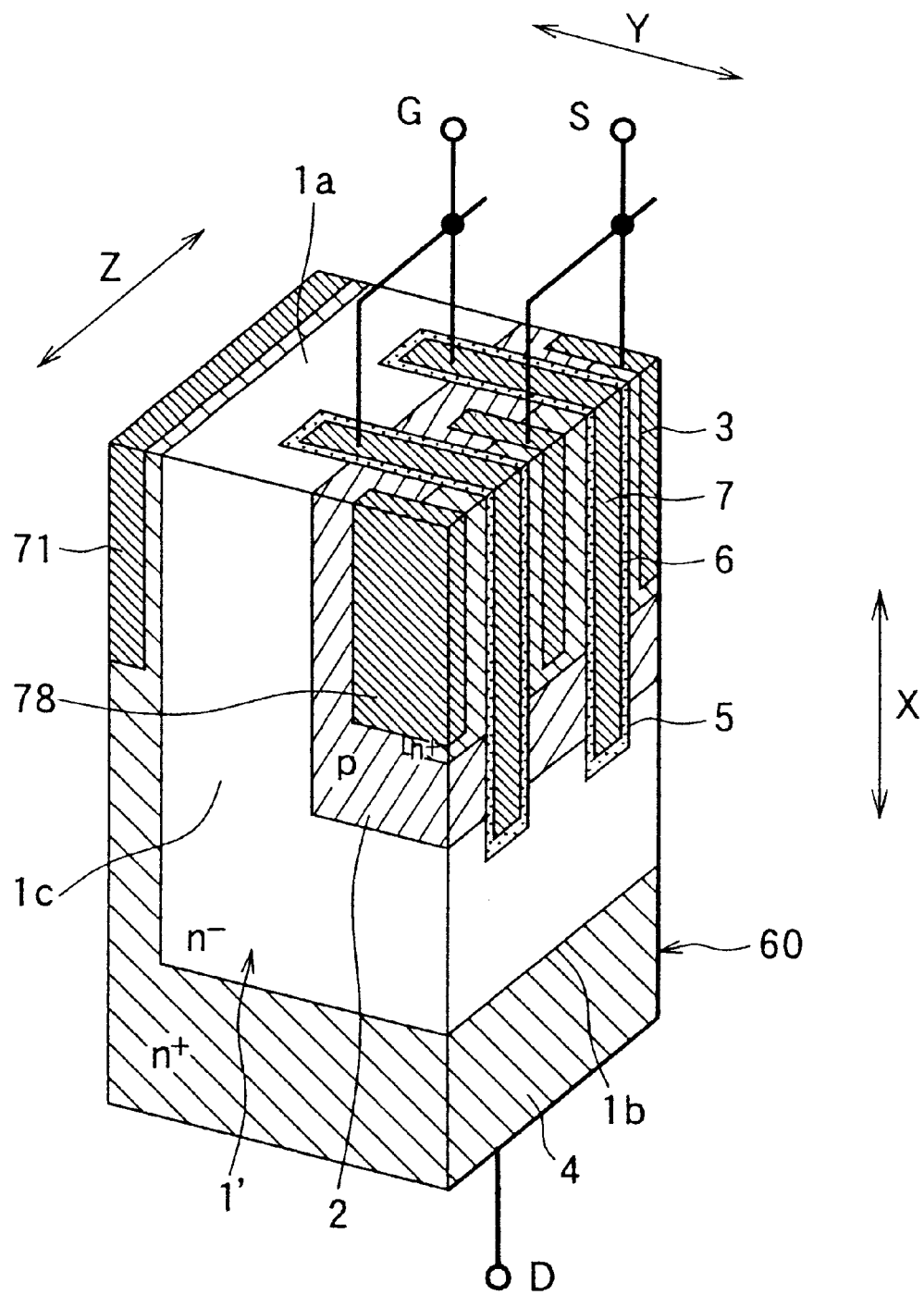
FIG. 34 is a perspective sectional view showing a power MOSFET in an eighteenth preferred embodiment.

FIG. 34 illustrates a perspective sectional view of a power MOSFET in the eighteenth embodiment of the present invention. This embodiment consists in the combination of the sixteenth and seventeenth embodiments.

As shown in FIG. 34, resistance lowering layers 78 constructed similarly to the resistance lowering layer 70 in the sixteenth embodiment are formed so as to couple the $n^+$-type source region 3 and the p-type base region 2. Therefore, the resistance lowering layers 78 function also as contact layers with the p-type base region 2 similarly to the contact layers 77 in the seventeenth embodiment. In this manner, when the resistance lowering layers 78 are formed as in this embodiment, the role of lowering the internal resistance of the $n^+$-type source region 3 and the role of fixing the potential of the p-type base region 2 can be fulfilled compatibly.

Nineteenth Embodiment

Figure 35:
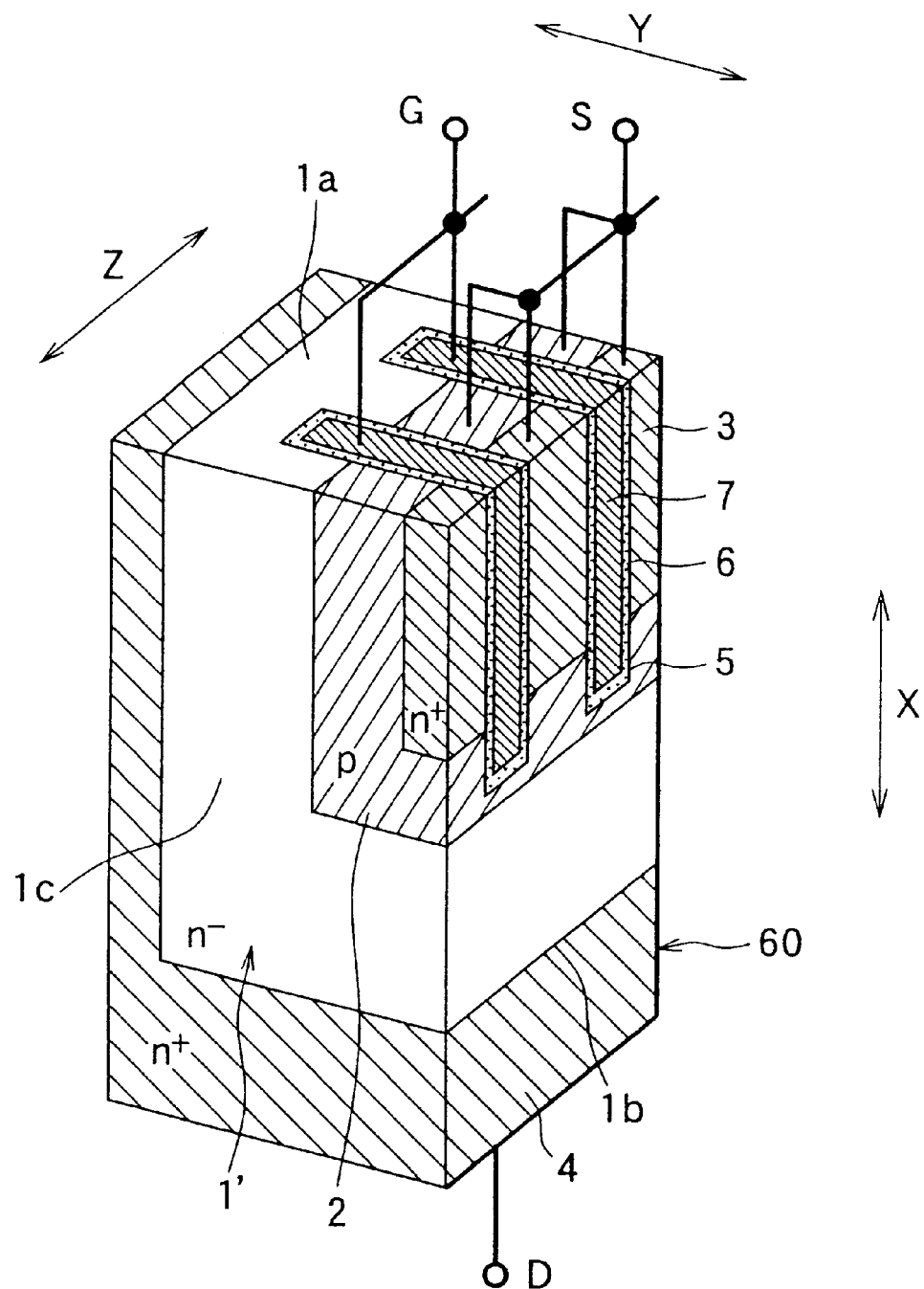
FIG. 35 is a perspective sectional view showing a power MOSFET in a nineteenth preferred embodiment.

FIG. 35 illustrates a perspective sectional view of a power MOSFET in the nineteenth embodiment of the present invention. This embodiment consists in altering the depth of the trenches 5 of the power MOSFET in the fifteenth embodiment.

As shown in FIG. 35, the bottom parts of the trenches 5 are shallower than the bottom part of the p-type base region 2, and the gate electrodes 7 terminate in the interior of the p-type base region 2 in the X-direction. In this manner, the gate electrodes 7 are formed so as to terminate in the interior of the p-type base region 2, whereby the channel regions can be prevented from appearing in the X-direction. Thus, a gate controllability can be prevented from worsening for the reason that a threshold voltage by which the channel regions are formed in the X-direction becomes lower than one by which the channel regions are formed in the Y-direction.

Figure 36:
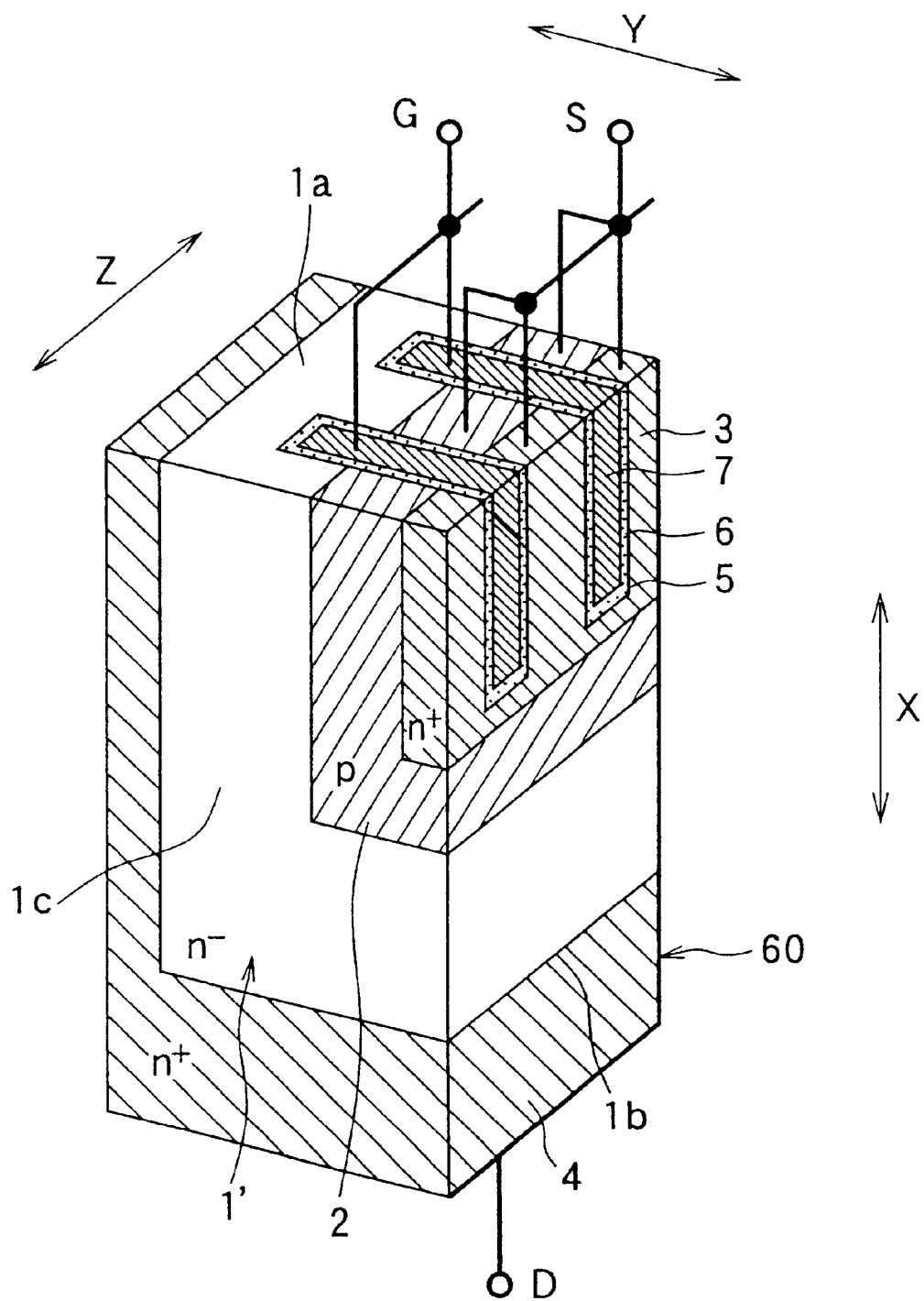
FIG. 36 is a perspective view showing another power MOSFET in the nineteenth embodiment.

Incidentally, the power MOSFET of such a construction is manufactured merely by shallowing the depth of the trenches 5 in the fifteenth embodiment. Besides, although the gate electrodes 7 have been formed so as to terminate in the interior of the p-type base region 2 in this embodiment, they may well terminate in the interior of the n+-type source region 3 as shown in FIG. 36.

Twentieth Embodiment

In this embodiment, there will be described a case where the power MOSFET in FIGS. 20 and 21 as mentioned in the fifteenth embodiment is manufactured by a method which is different from the steps shown in FIG. 24A through FIG. 26D.

Manufacturing steps for the power MOSFET in this embodiment are illustrated in FIGS. 37A through 37F, and the method of manufacturing the power MOSFET will be described on the basis of these figures. By the way, in these figures, the states of section C—C in FIG. 21 are shown on the left side of a sheet of paper, and the states of section O–B in FIG. 21 are shown on the right side of the sheet of paper. In addition, the same steps as shown in FIG. 24A through FIG. 26D will be explained with reference to these figures.

First, the steps shown in FIGS. 24A through 24D are carried out to form a trench 62 in a n+-type substrate 60. Besides, the steps shown in FIGS. 37A through 37C are performed as stated below.

Figure 37A:
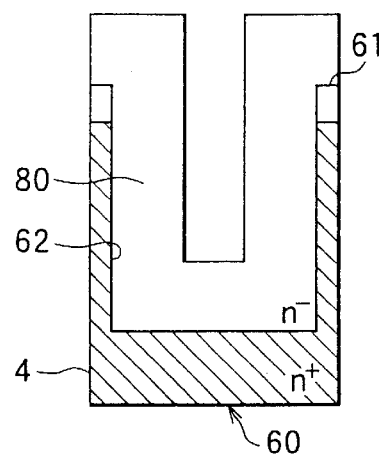
FIGS. 37A to 37F are sectional views showing steps for manufacturing the power MOSFET shown in FIG. 20, which are explained in a twentieth preferred embodiment.
Figure 37B:
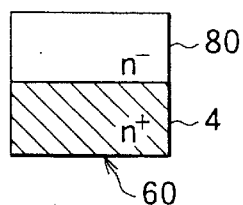

Step Shown in FIGS. 37A and 37B

An n−-type film 80 is formed on the inner wall surface of the trench 62 by, for example, epitaxial growth. On this occasion, the thickness of the n−-type film 80 is set nearly equal to the sum of the thicknesses of the n−-type film 63 and the p-type film 64 shown in FIGS. 24E and 24F.

Figure 37C:
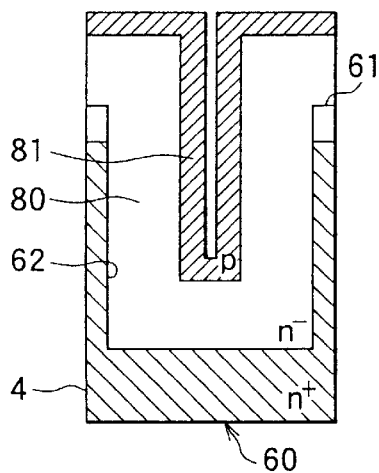
Figure 37D:
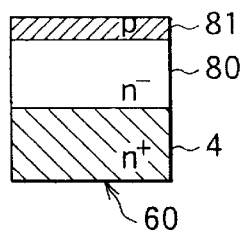

Step Shown in FIGS. 37C and 37D

Next, a p-type film 81, for example, BSG film containing a p-type impurity is deposited so as to cover the n−-type film 80.

Figure 37E:
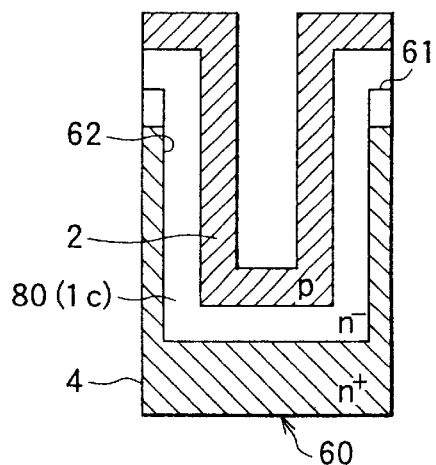
Figure 37F:
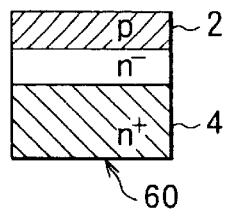

Steps Shown in FIGS. 37E and 37F

Subsequently, a driving heat treatment is performed. For example, a heat treatment at 950 to 1150° C. is performed in an N$_2$ atmosphere. Thus, the p-type impurity in the p-type film 81 is thermally diffused (as solid-phase diffusion) in to the n−-type film 80, and the conductivity type of the part of the n−-type film 80 having a predetermined thickness from the front surface of this film 80 is inverted. The inverted region of the n−-type film 80 corresponds to a p-type base region 2. Incidentally, the quantity of the thermal diffusion is substantially uniform, so that the concentration distribution of the inverted region becomes substantially uniform. Therefore, the positional relation between a drift region 1c and the p-type base region 2 are determined in self-alignment fashion. Thereafter, the p-type film 81 is removed.

Besides, the steps shown in FIGS. 25A, 25B et seq. are performed, and the power MOSFET shown in FIG. 20 is finished up. As stated above, the p-type base region 2 can also be formed by the thermal diffusion. Incidentally, although the p-type base region 2 has been formed by the solid-phase diffusion in this embodiment, it can also be formed by vapor-phase diffusion or liquid-phase diffusion.

Twenty-first Embodiment

In this embodiment, as in the twentieth embodiment, there will be described a case where the power MOSFET in FIGS. 20 and 21 is manufactured by a method which is different from the steps shown in FIG. 24A through FIG. 26D.

Manufacturing steps for the power MOSFET in this embodiment are illustrated in FIGS. 38A through 38F, and the method of manufacturing the power MOSFET will be described on the basis of these figures. By the way, in these figures, the states of section C—C in FIG. 21 are shown on the left side of a sheet of paper, and the states of section O–B in FIG. 21 are shown on the right side of the sheet of paper. In addition, the same steps as shown in FIG. 24A through FIG. 26D will be explained with reference to these figures.

Figure 38A:
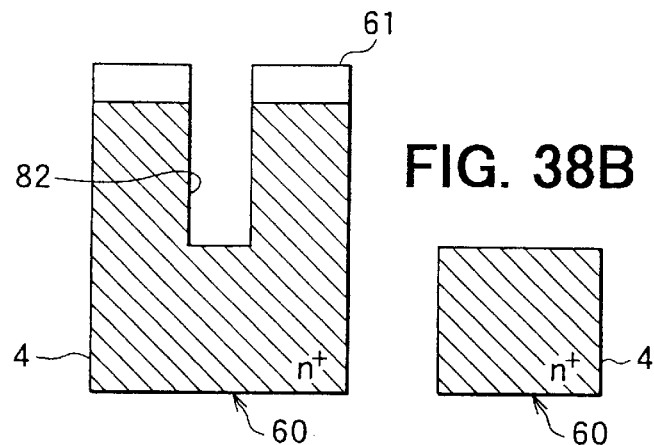
FIGS. 38A to 38F are sectional views showing steps for manufacturing the power MOSFET shown in FIG. 20, which are explained in a twenty-first preferred embodiment.
Figure 38B:
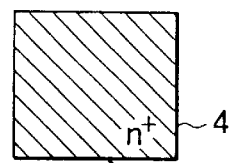

Step Shown in FIGS. 38A and 38B

First, the steps shown in FIGS. 24A to 24D are carried out to form a trench 82 in an n+-type substrate 60. Here, only the part of the n+-type substrate 60 scheduled to form an n+-type source region 3 is etched into the trench 82.

Figure 38C:
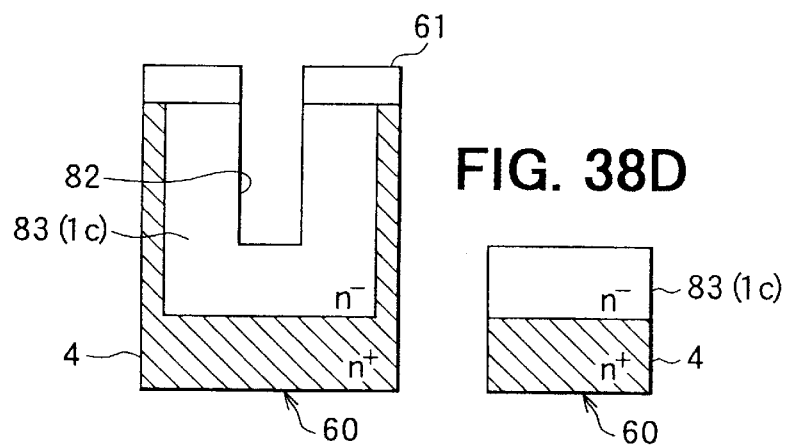
Figure 38D:
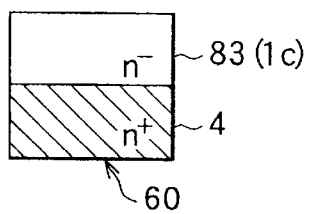

Steps Shown in FIGS. 38C and 38D

Subsequently, a p-type film, for example, BSG film containing a p-type impurity is deposited so as to cover the inner wall of the trench 82. Besides, a driving heat treatment is performed. For example, a heat treatment at 1000 to 1150° C. is performed in an N$_2$ atmosphere. Thus, the p-type impurity in the p-type film is thermally diffused (as solid-phase diffusion) into the n+-type substrate 60, and the part of the n+-type substrate 60 having a predetermined thickness from the front surface of this substrate 60 has its conductivity type compensated to become a high resistance region 83. The high resistance region 83 corresponds to a drift region 1c. Thereafter, the p-type film is removed.

Figure 38E:
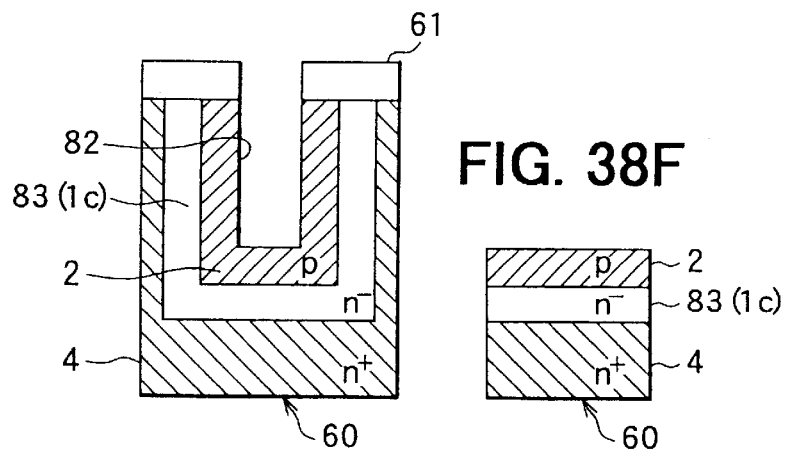
Figure 38F:
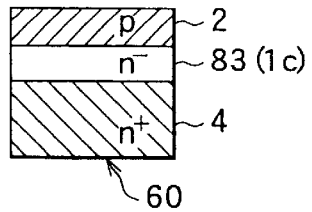

Steps Shown in FIGS. 38E and 38F

Next, a p-type film, for example, BSG film containing a p-type impurity is deposited so as to cover the trench 82 again. The p-type film, which is formed on this occasion, should desirably have an impurity concentration higher than that of the p-type film formed at the step shown in FIGS. 38C and 38D.

In addition, a driving heat treatment is performed. For example, a heat treatment at 950 to 1150° C. is performed in an N$_2$ atmosphere. Thus, the p-type impurity in the p-type film is thermally diffused (as solid-phase diffusion) into the high resistance region 83, and the conductivity type of the part of the high resistance region 83 having a predetermined thickness from the front surface of this region 83 is inverted. The inverted region of the high resistance region 83 corresponds to a p-type base region 2. Thereafter, the p-type film is removed.

Incidentally, the quantities of the thermal diffusion at steps shown in FIGS. 38C to 38F are substantially uniform, so that the concentration distributions of the compensated region and inverted region become substantially uniform. Therefore, the positional relation between the drift region 1c and the p-type base region 2 are determined in self-alignment fashion.

Besides, the steps shown in FIGS. 25A, 25B et seq. are performed, and the power MOSFET shown in FIG. 20 is finished up. As stated above, the drift region 1c and p-type base region 2 can also be formed by the thermal diffusion. Incidentally, although the p-type base region 2 and drift region 1c have been formed by the solid-phase diffusion in this embodiment, they can also be formed by vapor-phase diffusion or liquid-phase diffusion.

Twenty-second Embodiment

In this embodiment, as in the twentieth and twenty-first embodiments, there will be described a case where the power MOSFET in FIGS. 20 and 21 is manufactured by a method which is different from the steps shown in FIG. 24A through FIG. 26D.

Manufacturing steps for the power MOSFET in this embodiment are illustrated in FIGS. 39A through 39F, and the method of manufacturing the power MOSFET will be described on the basis of these figures. By the way, in these figures, the states of section C—C in FIG. 21 are shown on the left side of a sheet of paper, and the states of section O–B in FIG. 21 are shown on the right side of the sheet of paper. In addition, the same steps as shown in FIG. 24A–FIG. 26D will be explained with reference to these figures.

Figure 39A:
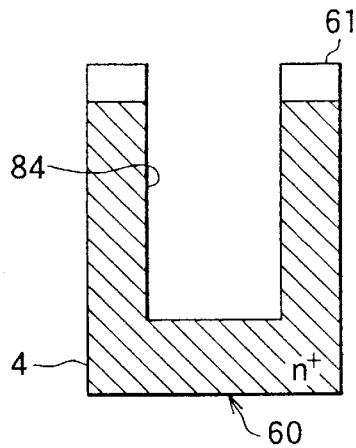
FIGS. 39A to 39F are sectional views showing steps for manufacturing the power MOSFET shown in FIG. 20, which are explained in a twenty-second preferred embodiment.
Figure 39B:
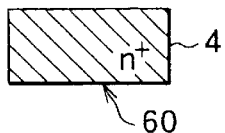

Step Shown in FIGS. 39A and 39B

First, the steps shown in FIGS. 24A to 24D are carried out to form a trench 84 in an n$^+$-type substrate 60. Here, only the part of the n$^+$-type substrate 60 scheduled to form a p-type base region 2 is etched into the trench 84.

Figure 39C:
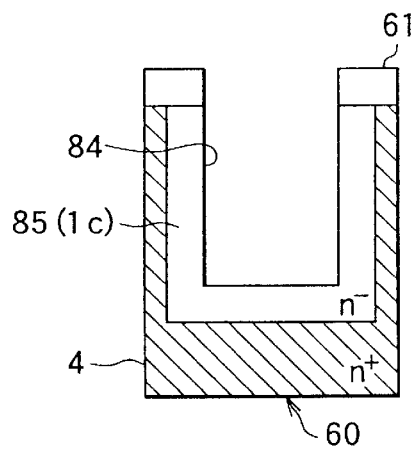
Figure 39D:
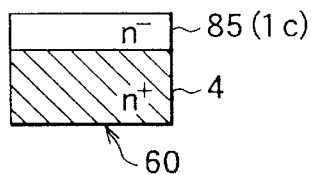

Steps Shown in FIGS. 39C and 39D

Subsequently, a p-type film, for example, BSG film containing a p-type impurity is deposited so as to cover the inner wall of the trench 84. Besides, a driving heat treatment is performed. For example, a heat treatment at 950 to 1150° C. is performed in an N$_2$ atmosphere. Thus, the p-type impurity in the p-type film is thermally diffused (as solid-phase diffusion) into the n$^+$-type substrate 60, and the part of the n$^+$-type substrate 60 having a predetermined thickness from the front surface of this substrate 60 has its conductivity type compensated to become a high resistance region 85. The high resistance region 85 corresponds to a drift region 1c. Thereafter, the p-type film is removed.

Figure 39E:
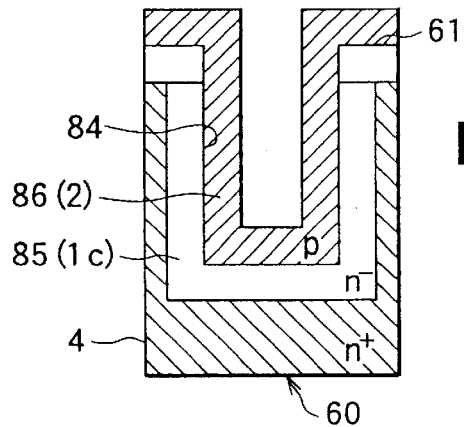
Figure 39F:
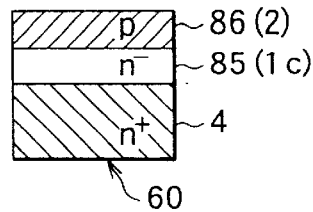

Steps Shown in FIGS. 39E and 39F

Next, a p-type film 86 is formed by, for example, epitaxial growth so as to cover the trench 84 again. The p-type film 86 corresponds to the p-type base region 2. Besides, the steps shown in FIGS. 25A, 25B et seq. are performed, and the power MOSFET shown in FIG. 20 is finished up. As stated above, the drift region 1c can also be formed by the thermal diffusion. Incidentally, although the drift region 1c has been formed by the solid-phase diffusion in this embodiment, it can also be formed by vapor-phase diffusion or liquid-phase diffusion.

Twenty-third Embodiment

Figure 40:
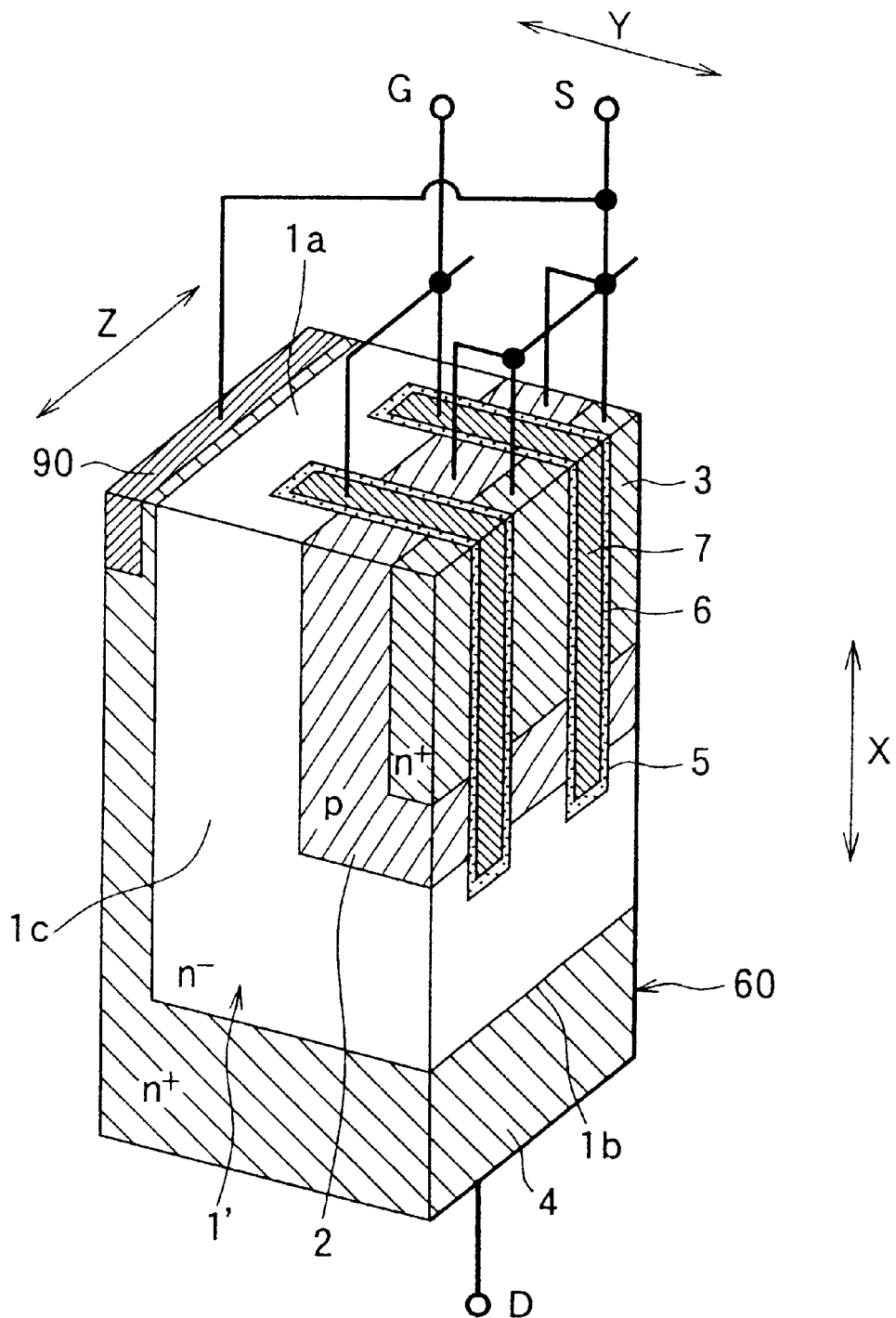
FIG. 40 is a perspective sectional view showing a power MOSFET in a twenty-third preferred embodiment.

FIG. 40 illustrates a perspective sectional view of a power MOSFET in the twenty-third embodiment of the present invention. This embodiment is different from the power MOSFET of the fifteenth embodiment, in point that a p$^+$-type impurity diffusion layer 90 which is electrically connected with the n$^+$-type source region 3 is provided in the surface layer part of the n$^+$-type drain region 4. The p$^+$-type impurity diffusion layer 90 is formed by, for example, implanting ions into the selected part after the formation of the gate electrodes 7.

Owing to the provision of such a p$^+$-type impurity diffusion layer 90, when a surge current is developed, a P-N junction formed by this p$^+$-type impurity diffusion layer 90 and the n$^+$-type drain region 4 can break down to diffuse the surge current before the turn-ON of a parasitic n-p-n transistor which is constructed of the n$^+$-type drain region 4 (drift region 1c), p-type base region 2 and n$^+$-type source region 3. Thus, it is possible to prevent the surge current from flowing through the parasitic transistor and to prevent, for example, the gate oxide films 6 from being destroyed by the generation of heat attributed to the operation of the parasitic transistor.

Other Embodiments

Although, in the foregoing embodiments, the power MOSFETs etc. have been formed using the n$^-$-type substrate 1, power MOSFETs etc. may well be formed using a p-type substrate. In this case, the power MOSFET comes to have a construction shown in FIG. 41, in which the p-type base region 2 is formed of the p-type substrate 40, and the drift region 1c is formed by trenching etc.

Although the power MOSFETs etc. of n-channel type have been exemplified in the foregoing embodiments, the present invention is also applicable to power MOSFETs etc. of p-channel type. Further, although the foregoing embodiments have mentioned the power MOSFETs etc. of inversion type in each of which the p-type base region 2 made of the p-type semiconductor is arranged sideward of the trench 5 so as to form the channel regions by inverting the p-type base region 2, the present invention is also applicable to power MOSFETs etc. of accumulation type in each of which an n-type layer being a thin film is arranged between the p-type base region 2 and the trench 5 so as to form channel regions on the basis of carriers accumulated in the n-type layer.

According to the first embodiment, in the manufacture of the power MOSFET, the three times of trenching steps need to be performed in order to form the trench for arranging the p-type base region 2, the trenches for arranging the n$^+$-type source region 3 and the n$^+$-type drain region 4, and the trench for arranging the gate electrode 7, respectively. It is troublesome that the trenching steps must be repeated three times. Therefore, manufacturing methods to be described below may well be adopted.

(1) First, an n$^-$-type substrate 1 is prepared, and trenches are formed in those parts of the n$^-$-type substrate 1 which are scheduled to form an n$^+$-type source region 3 and an n$^+$-type drain region 4, followed by forming a mask oxide film on the whole front surface of the n$^-$-type substrate 1 as includes the interiors of the trenches. Subsequently, that part of the mask oxide film which is formed inside the trench scheduled to form the n$^+$-type source region 3 is removed. Besides, a p-type impurity is diffused from the trench scheduled to form the n$^+$-type source region 3, into the n$^-$-type substrate 1 by vapor-phase diffusion. On this occasion, the p-type impurity is diffused only from the trench which is scheduled to form the n$^+$-type source region 3 and which is not covered with the mask oxide film, whereby a p-type base region 2 is formed. Incidentally, on this occasion, the p-type base region 2 can also be formed by solid-phase diffusion which differs from the above vapor-phase diffusion, and by which a p-type impurity is diffused from a p-type impurity layer buried in the trench beforehand.

Thereafter, the mask oxide film is entirely removed, and the respective trenches scheduled to form the n$^+$-type source region 3 and the n$^+$-type drain region 4 are filled up with a poly-silicon layer of n-type. Besides, the n-type poly-silicon layer is flattened to be left behind only in the trenches, followed by the thermal diffusion of an n-type impurity contained in the poly-silicon layers, whereby the n$^+$-type source region 3 and the n$^+$-type drain region 4 are formed. By the way, in the case of filling up the trenches with the poly-silicon layers, junctions are formed by silicon and poly-silicon. Since, however, the n-type impurity in the poly-silicon layers is diffused by a heat treatment as stated above, P-N junctions can be formed by n-type layers resulting from the diffusion.

Subsequently, as in the manufacturing method of the first embodiment, a trench 5 is formed, and a gate oxide film 6 and a gate electrode 7 are thereafter formed. Thus, the power MOSFET shown in FIG. 1 can be manufactured. According to such a process, the power MOSFET can be manufactured by performing the trenching steps only twice, so that the manufacturing process can be simplified.

Moreover, the p-type base region 2 is formed by diffusing the p-type impurity from the trench scheduled to form the n+-type source region 3 as stated above, so that the p-type base region 2 and the n+-type source region 3 can be formed in self-alignment fashion. Thus, the dimensions of the p-type base region 2 interposed between the n+-type source region 3 and a drift region 1c are exactly defined, and a uniform MOS operation can be carried out.

Figure 41:
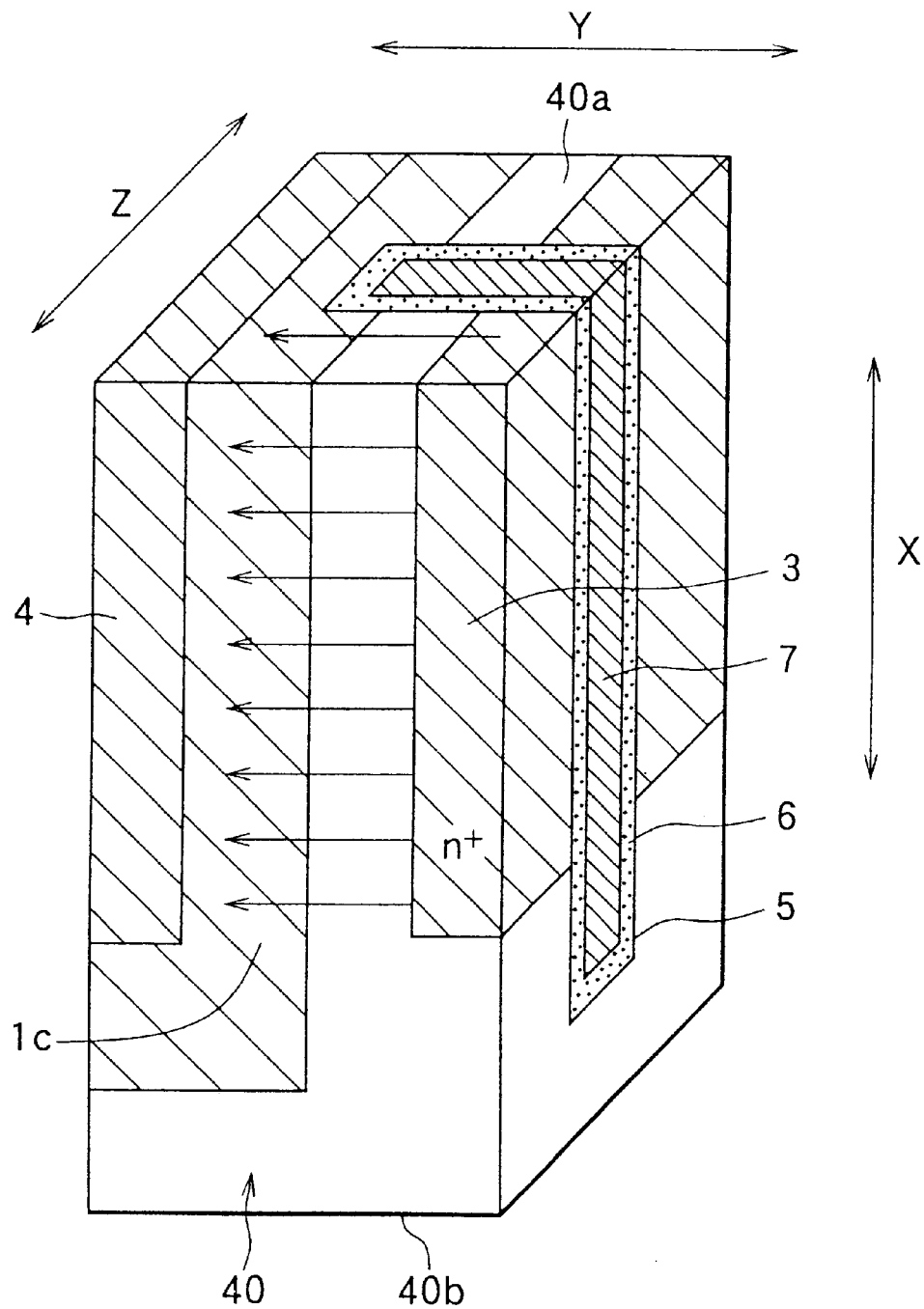
FIG. 41 is a perspective sectional view showing a power MOSFET in another embodiment.

(2) Besides, in the case of employing a p-type substrate 40, the manufacturing method of a power MOSFET becomes as described with reference to FIG. 41 below.

First, the p-type substrate 40 having a principal surface 40a and a back surface 40b is prepared. Trenches are formed in those parts of the p-type substrate 40 which are scheduled to form an n+-type source region 3 and an n+-type drain region 4, followed by forming a mask oxide film on the whole front surface of the p-type substrate 40 as includes the interiors of the trenches. Subsequently, that part of the mask oxide film which is formed inside the trench scheduled to form the n+-type drain region 4 is removed. Besides, an n-type impurity is diffused from the trench scheduled to form the n+-type drain region 4, into the p-type substrate 40 by vapor-phase diffusion. On this occasion, the n-type impurity is diffused only from the trench which is scheduled to form the n+-type drain region 4 and which is not covered with the mask oxide film, whereby a drift region 1c is formed.

Thereafter, the mask oxide film is entirely removed, and the respective trenches scheduled to form the n+-type source region 3 and the n+-type drain region 4 are filled up with a poly-silicon layer of n-type. Besides, the n-type poly-silicon layer is flattened to be left behind only in the trenches, followed by the thermal diffusion of an n-type impurity contained in the poly-silicon layers, whereby the n+-type source region 3 and the n+-type drain region 4 are formed.

Subsequently, as in the manufacturing method of the first embodiment, a trench 5 is formed, and a gate oxide film 6 and a gate electrode 7 are thereafter formed. Thus, the power MOSFET shown in FIG. 41 can be manufactured. In this manner, even in the case of employing the p-type substrate 40, the power MOSFET can be manufactured by performing the trenching steps only twice, so that the manufacturing process can be simplified.

Meanwhile, the layout scheme. (refer to FIGS. 2A and 2B) of the power MOSFET to which the present invention is applied has been exemplified in the first embodiment. However, this layout scheme is not restrictive, but other layout schemes, for example, ones shown in FIG. 43 through FIG. 51 may well be adopted.

Figure 43:
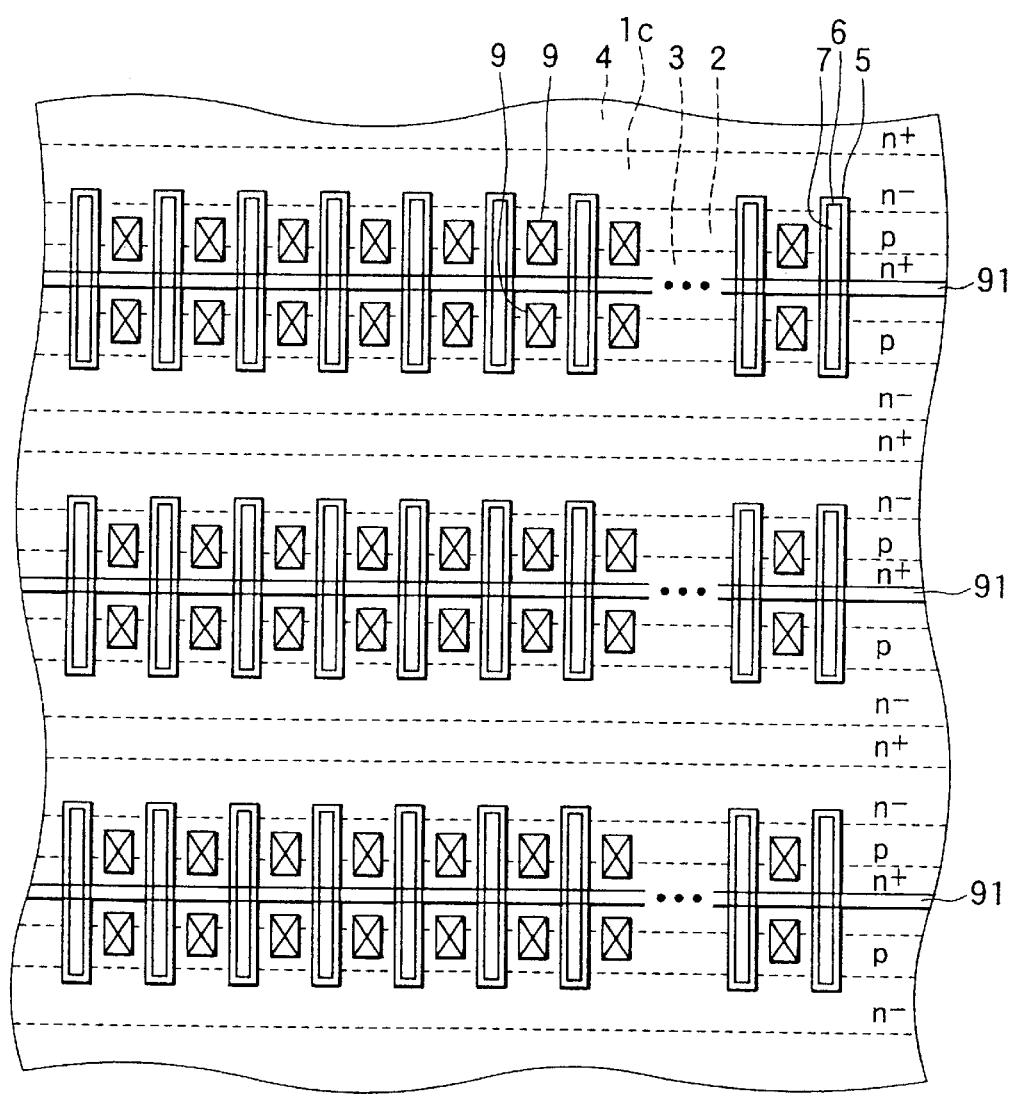
FIGS. 43 through 51 are schematic views showing layout constitutions of power MOSFETs explained as other embodiments.

A power MOSFET shown in FIG. 43 has the layout scheme that one unit cell is formed by the sectional construction shown in FIG. 1, that another unit cell is arranged in line symmetry to the first-mentioned unit cell, and that a plurality of sets of unit cells, one set consisting of the two unit cells, are arrayed in one direction. Besides, a gate wiring line 91 which is connected to gate electrodes 7 is extended on the line of the symmetry of each set of unit cells, and source electrodes 9 each of which is connected to both a p-type base region 2 and an n+-type source region 3 disposed between adjacent trenches 5 are arranged on both the sides of the gate wiring line 91. Such a layout scheme can be employed for the present invention.

Figure 44:
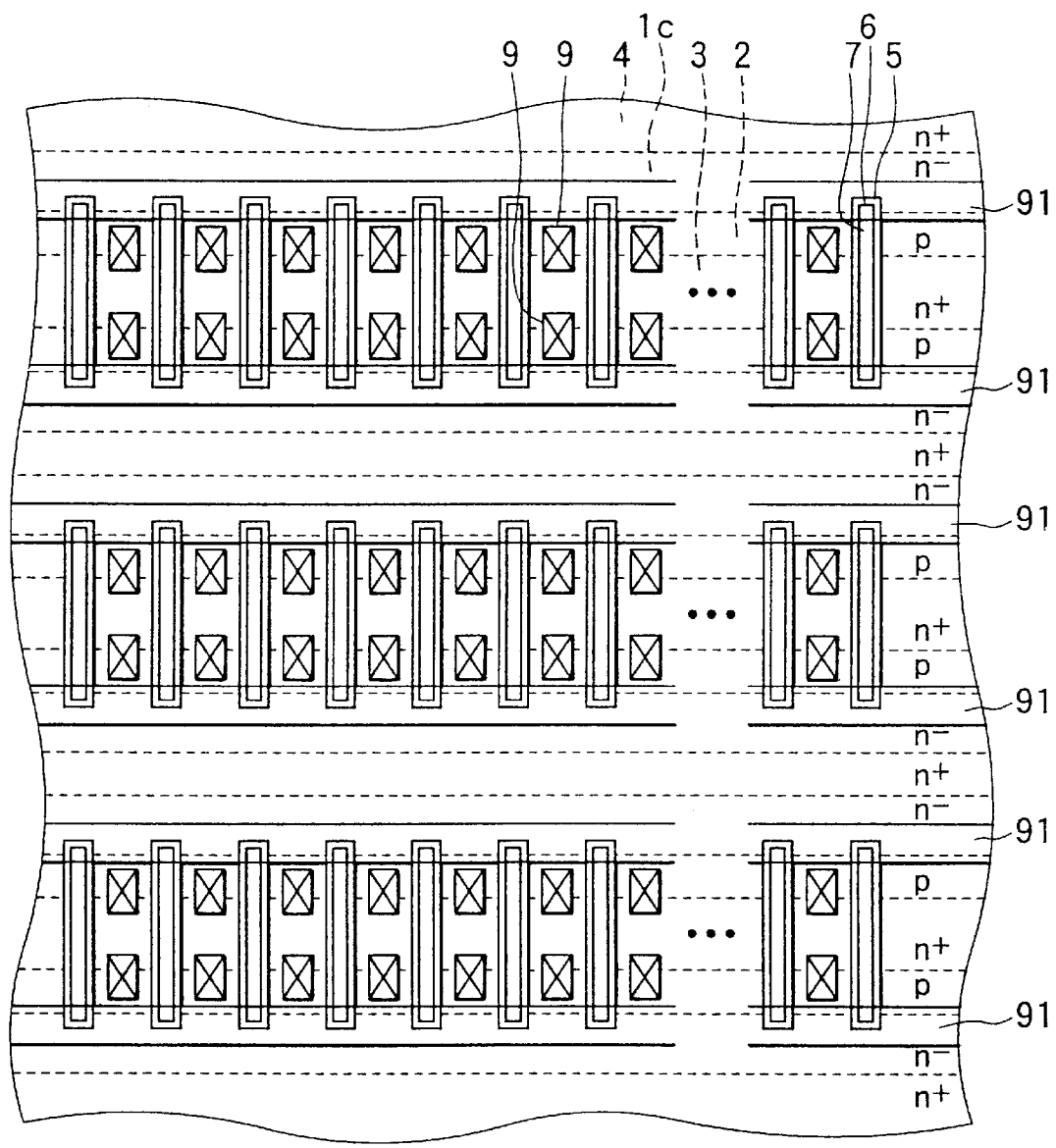

Also, a power MOSFET shown in FIG. 44 has substantially the same layout scheme as that of the power MOSFET shown in FIG. 43, except the point that a gate wiring line 91 is laid so as to overlap a p-type base region 2 and a drift region 1c in which channel regions are formed. Concretely, gate electrodes 7 are arranged through a LOCOS oxide film (not shown) that is formed on the drift region 1c.

According to such a layout scheme, the gate wiring line is laid over a P-N junction which determines the withstand voltage of the power MOSFET, that is, a P-N junction which is formed by the p-type base region 1 and the drift region 1c. Therefore, electric field concentration is moderated by a field plate effect, and the power MOSFET can be endowed with a higher withstand voltage.

Figure 45:
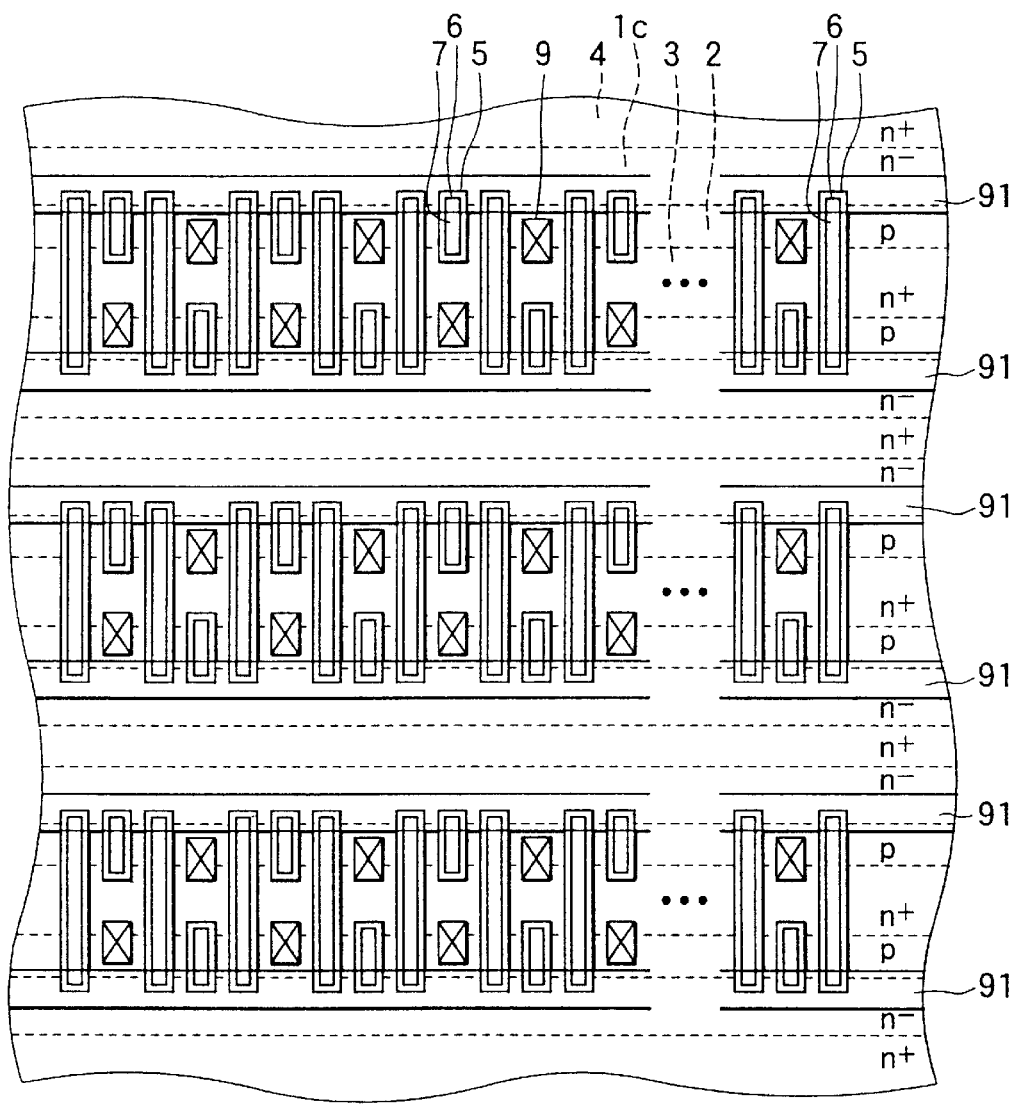

Besides, a power MOSFET shown in FIG. 45 has substantially the same layout scheme as that of the power MOSFET shown in FIG. 44, except the points that a source electrode 9 is arranged every second set, and that a trench gate structure which consists of a trench 5, a gate oxide film 6 and a gate electrode 7 is formed instead of the source electrode 9 at a position where the source electrode 9 is omitted. According to such a layout scheme, a channel resistance per unit area can be lowered, with the result that an ON resistance can be decreased still further.

Figure 46:
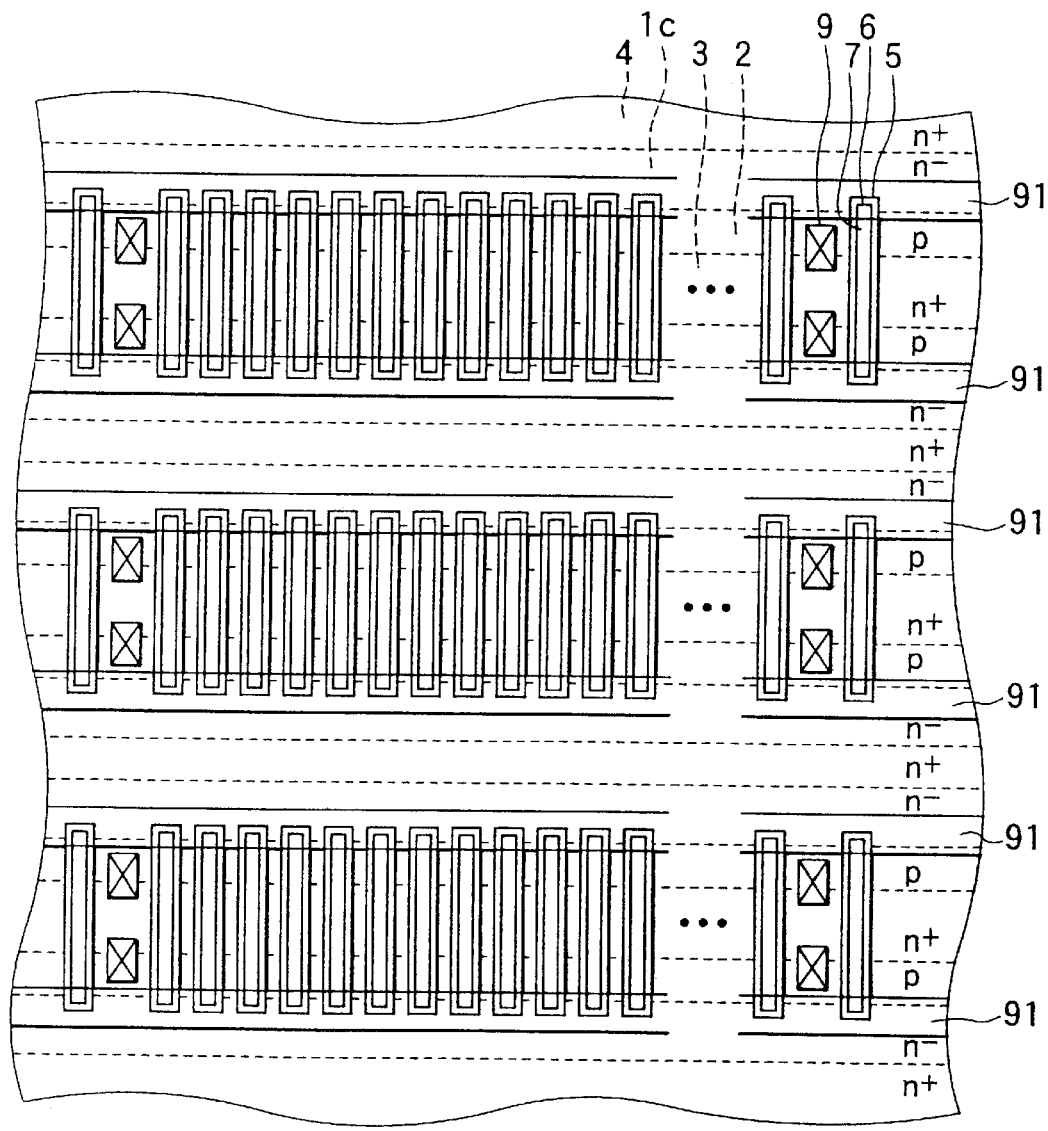

In addition, a power MOSFET shown in FIG. 46 has substantially the same layout scheme as that of the power MOSFET shown in FIG. 44. The layout scheme in FIG. 46, however, differs in the point that, whereas source electrodes 9 are arranged in all the interspaces between the adjacent sets of unit cells in FIG. 44, source electrodes 9 are arranged in only desired ones of the interspaces between the adjacent sets of unit cells in FIG. 46 (in this figure, at only both the ends of trench gate structures arrayed in one direction). According to such a layout scheme, a channel resistance per unit area can be lowered, and an ON resistance can be decreased still further.

Figure 47:
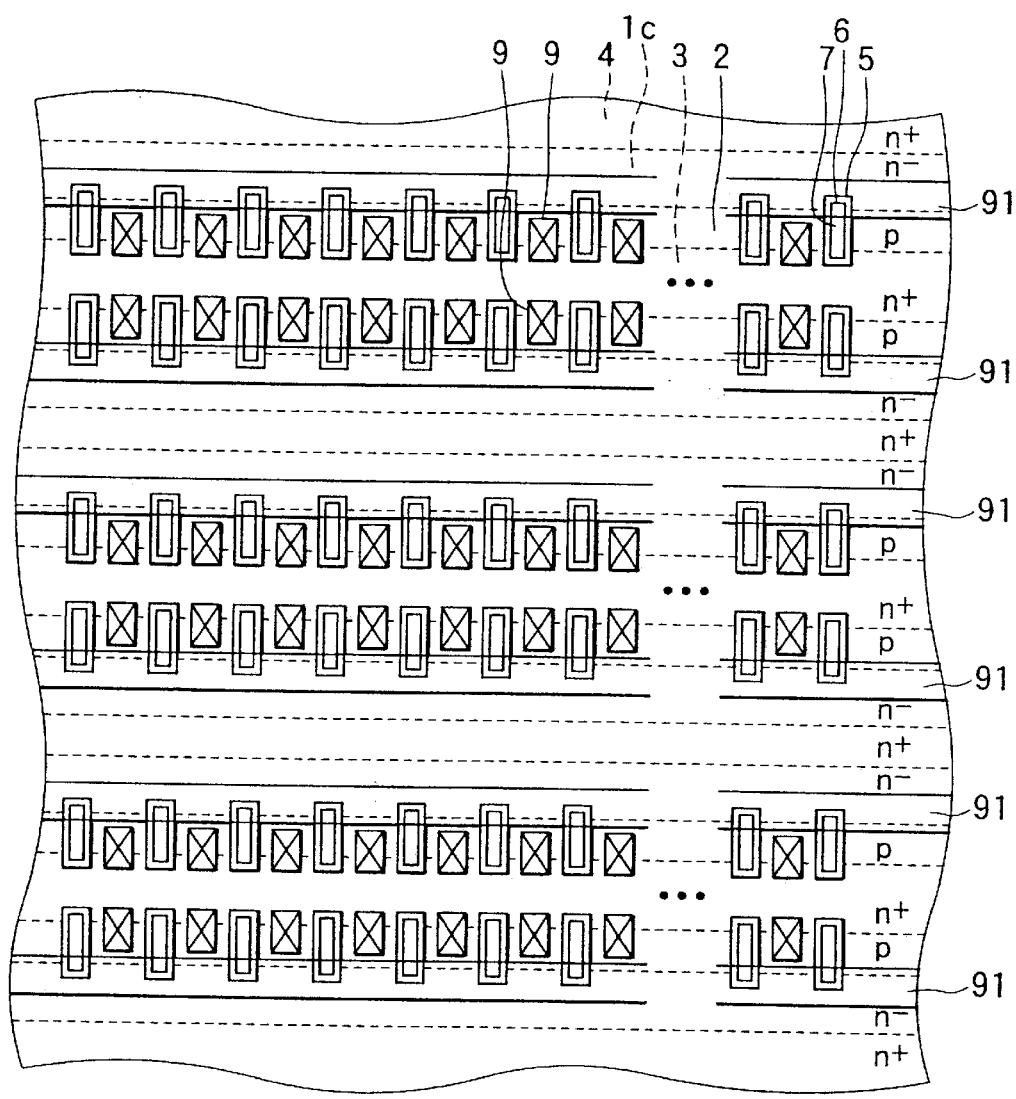

Still in addition, a power MOSFET shown in FIG. 47 has substantially the same layout scheme as that of the power MOSFET shown in FIG. 44, except the point that a divided trench gate structure is provided every unit cell. It is also possible to adopt such a layout scheme. Especially in the case where the p-type base region 2, the n+-type source region 3, etc. are formed by filling up the interior of the trench with the epitaxial layer as explained before, cavity-like crystal defects called "blowholes" might be formed centrally of the trench in burying the epitaxial layer. In contrast, owing to the layout scheme shown in FIG. 47, the trench gate structure can be formed so as to avoid the "blowhole". By the way, although an example in which a gate wiring line is formed over the p-type base region 2 and the drift layer 1c has been mentioned in FIG. 47, the gate wiring line may well be laid on the line of the symmetry lying centrally of each set of unit cells as shown in FIG. 43.

Incidentally, the layout schemes shown in FIGS. 43 through 47 are, of course, applicable not only to the first embodiment, but also to the other embodiments. Drain electrodes are not shown in the layout schemes exemplified in FIGS. 43 through 47; however, for example, the drain electrodes may be disposed on the principal surface side of the substrate in the case of the power MOSFET mentioned in the first embodiment, and they may be disposed on either of the principal surface side of the substrate and the back surface side thereof in the case of the power MOSFET mentioned in the fifteenth embodiment. Also, in each of FIGS. 44, 46 and 47, the source electrodes 9 intervening between the adjacent trench gate structures are in a state where they are divided with respect to the line of the symmetry, they may well be connected to each other.

Figure 48:
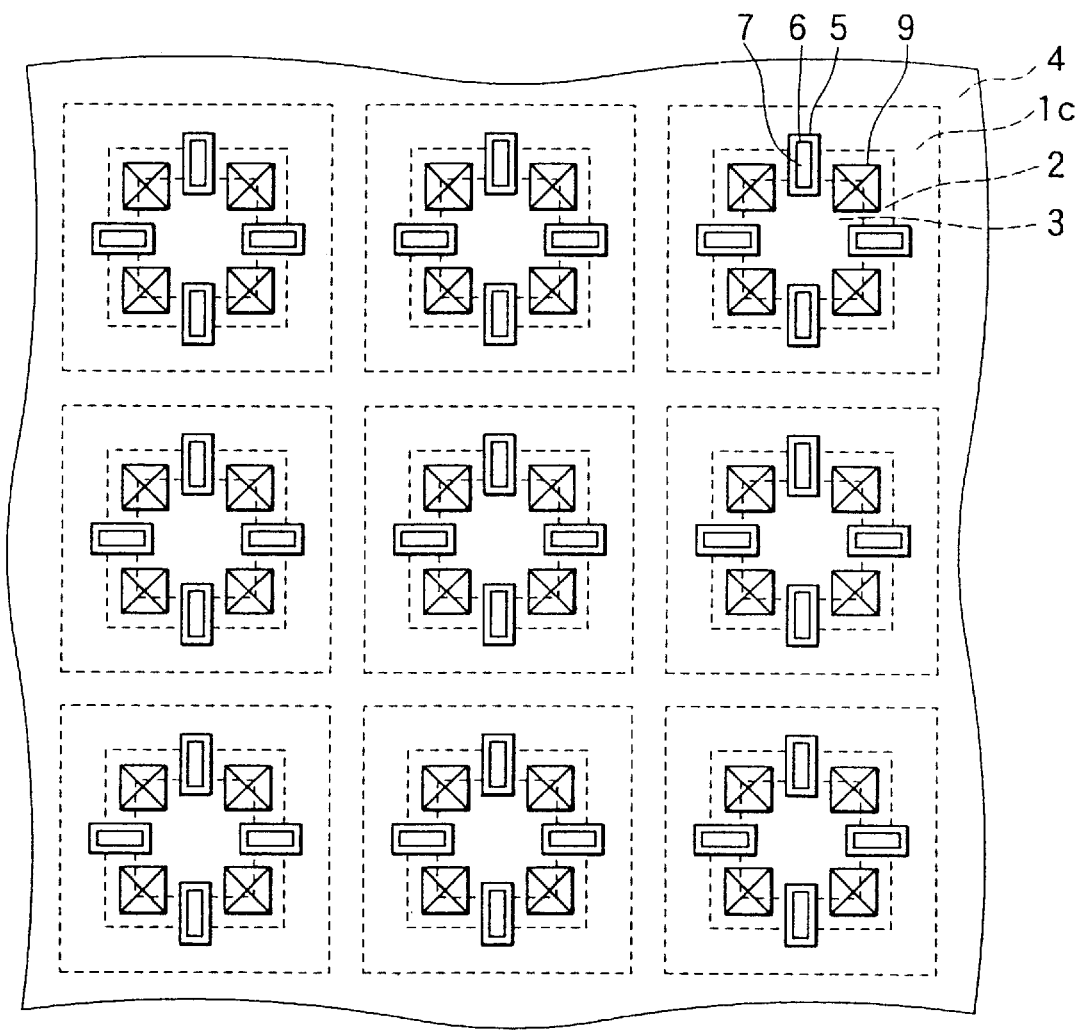
Figure 49:
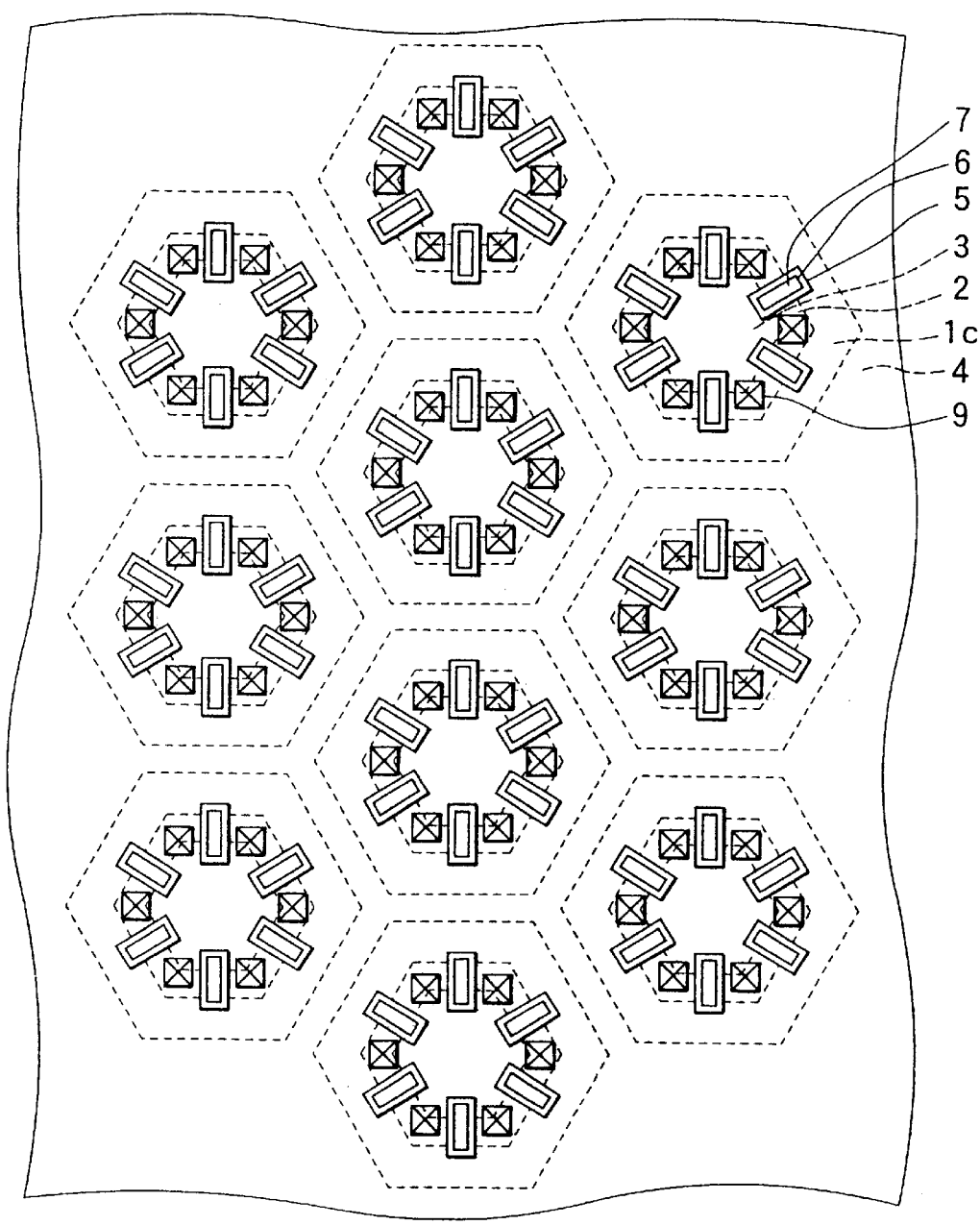
Figure 50:
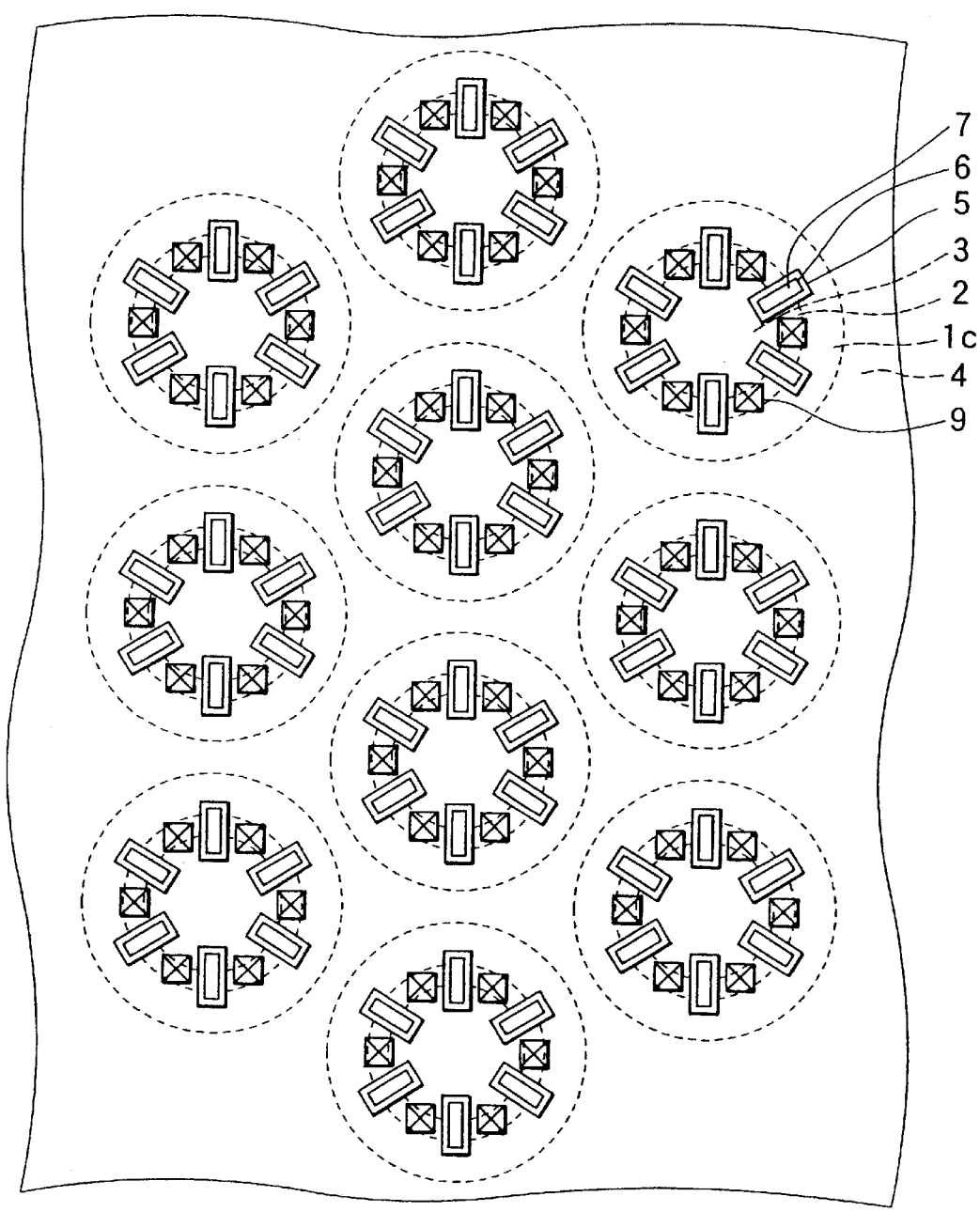
Figure 51:
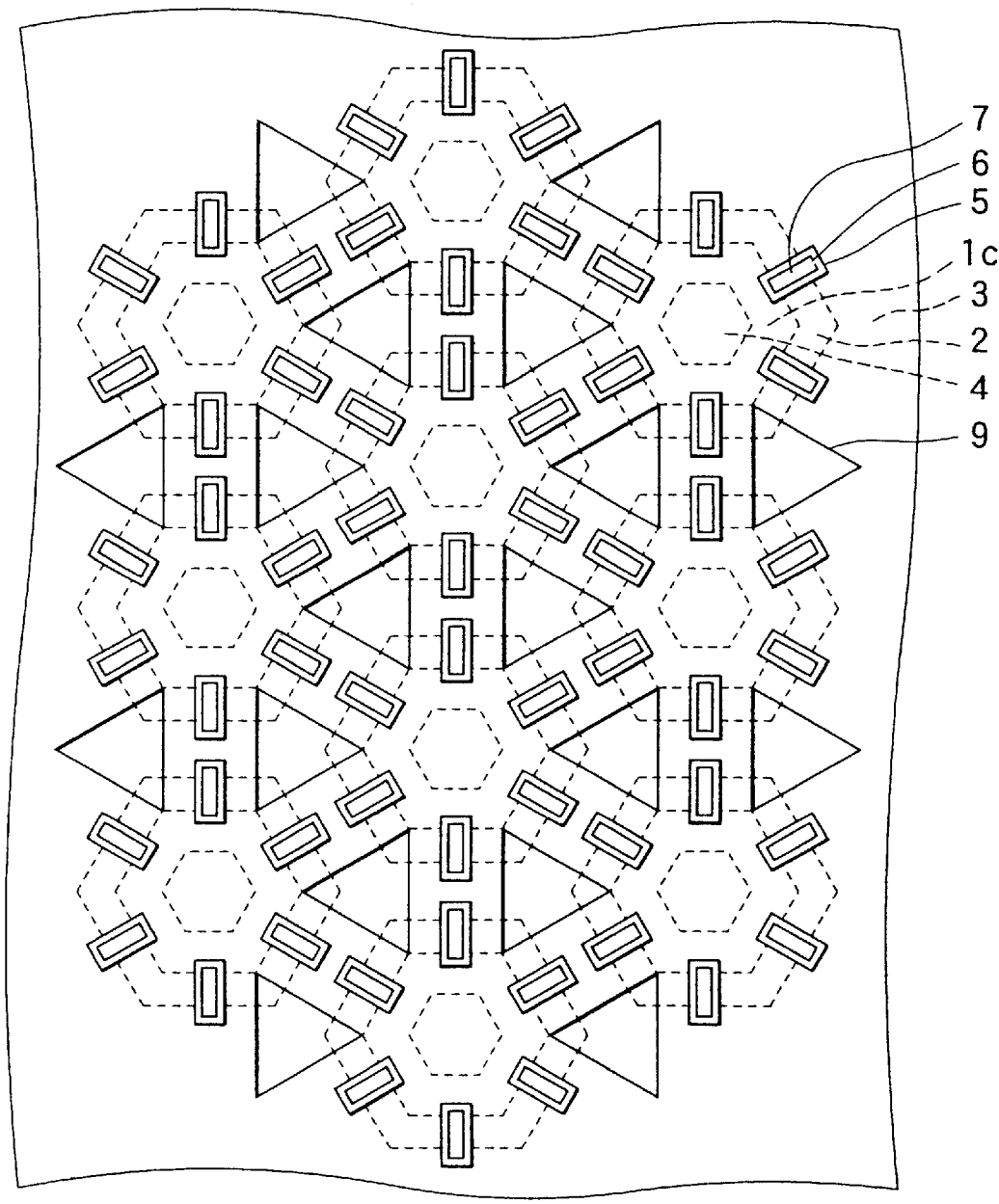

Yet in addition, a power MOSFET shown in FIG. 48 has a layout scheme in which each of tetragonal basic units is constructed in such a way that trench gate structures are arranged on four sides around an n+-type source region 3, and that each of the n+-type source region 3, a p-type base region 2, a drift region 1c and an n+-type drain region 4 is formed in a tetragonal shape. Further, a power MOSFET shown in FIG. 49 has a layout scheme in which each of hexagonal basic units is constructed in such a way that trench gate structures are arranged on six sides around an n$^+$-type source region 3, and that each of the n$^+$-type source region 3, a p-type base region 2, a drift region 1c and an n$^+$-type drain region 4 is formed in a hexagonal shape. Still further, a power MOSFET shown in FIG. 50 has a layout scheme in which each of circular basic units is constructed in such a way that trench gate structures are arranged on six sides around an n$^+$-type source region 3, and that each of the n$^+$-type source region 3, a p-type base region 2, a drift region 1c and an n$^+$-type drain region 4 is formed in a circular shape. It is also possible to adopt the layout schemes as shown in these modified embodiments.

It is also possible to form layout schemes in which, contrariwise to the above, an n$^+$-type drain region 4 is located centrally. For example, as in a power MOSFET shown in FIG. 51, a layout scheme in which each of hexagonal basic units is constructed with the n$^+$-type drain region 4 located centrally can be formed in such a way that trench gate structures are arranged on six sides around the n$^+$-type drain region 4, and that each of the n$^+$-type drain region 4, a drift region 1c, a p-type base region 2 and an n$^+$-type source region 3 is formed in a hexagonal shape.

Further, in each of the thirteenth and fourteenth embodiments, the gate electrodes 7 and the injection layers are electrically connected, and the carriers are injected from the injection layers only when the MOSFET falls into its ON state. Such a structure can be adopted also in any of the other embodiments described before. Of course, the gate electrodes may well be electrically connected with the injection layers through the resistor as in the fourteenth embodiment, whereby the potential difference can be provided between the applied voltage of the gate electrodes and that of the injection layers.

Besides, although each of the sixteenth to eighteenth embodiments has been described concerning the case of providing the resistance lowering layers 70, 71 in the power MOSFET, the same effects as in these embodiments can be attained even when the structure is applied to an IGBT, an MCT or an ACCUFET. Also, the method of forming the constituents by the diffusion as mentioned in each of the twentieth to twenty-second embodiments can be applied to the IGBT, MCT or ACCUFET.

Figure 42:
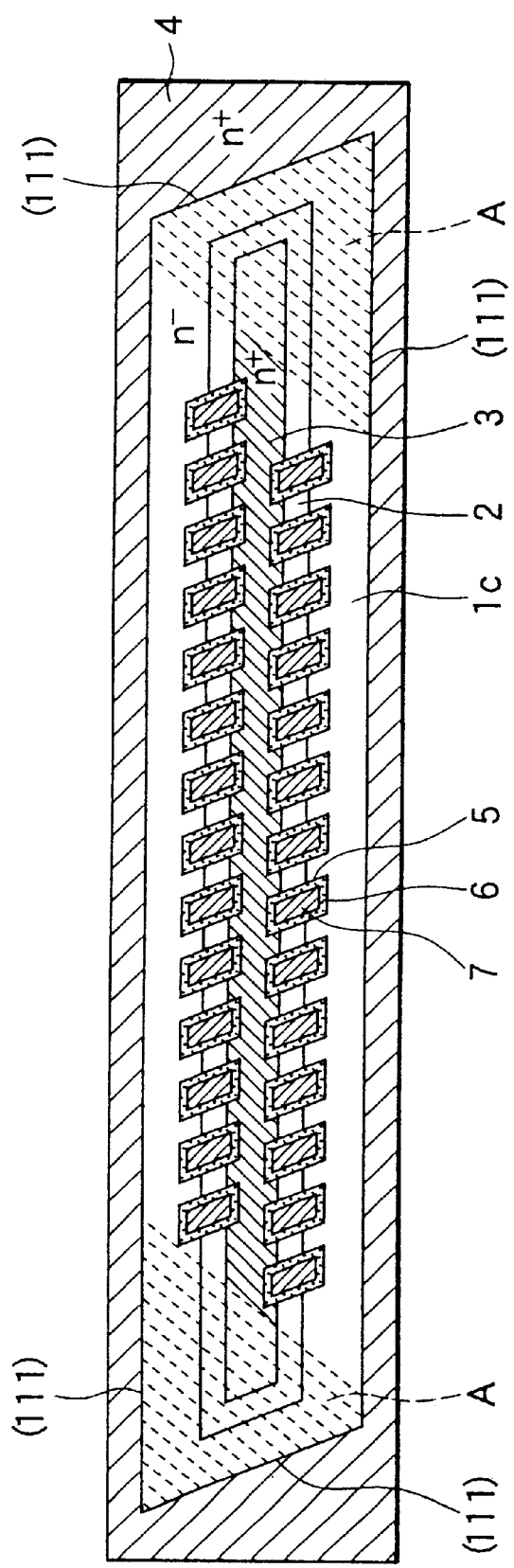
FIG. 42 is a schematic view showing a power MOSFET in another embodiment.

In addition, although each of the fifteenth to twenty-second embodiments has not especially mentioned the face orientation of the n$^+$-type substrate 60 of which the n$^+$-type drain region 4 is made, a (110) substrate, for example, is well suited for the n$^+$-type substrate 60. In case of employing such a (110) substrate, the side surfaces of the trench 62 become (111) faces as shown in FIG. 42. Since such (111) faces can afford anisotropy, the grooves can be formed by, for example, wet etching using TMAH. By the way, regions A indicated by broken-line hatching in FIG. 42 are parts which remain in tapering shapes at the etching in the case of employing the (110) substrate, and gate electrodes 7, etc. are formed avoiding these regions A.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device, comprising:

preparing a first conductivity type semiconductor substrate having a principal surface and a back surface at an opposite side of the principal surface;

forming a first trench in the semiconductor substrate, the first trench extending in the semiconductor substrate from the principal surface in a perpendicular direction with respect to the principal surface;

forming a second conductivity type base region by filling up the first trench with a second conductivity type semiconductor;

forming a second trench within the base region and a third trench in the semiconductor substrate at a location remote from the base region, each of the second trench and the third trench extending from the principal surface in the perpendicular direction;

forming a first conductivity type source region by filling up the second trench with a first conductivity type semiconductor, and forming a first conductivity type drain region by filling up the third trench with the first conductivity type semiconductor;

forming a fourth trench penetrating the base region from the source region, the fourth trench extending form the principal surface in the perpendicular direction;

forming a gate insulating film in the fourth trench;

forming a gate electrode on a surface of the gate insulating film;

forming a source electrode electrically connected to the source region and the base region; and forming drain electrode electrically connected to the drain region.

2. A method for manufacturing a semiconductor device, comprising:

preparing a semiconductor substrate having a principal surface and a back surface being an opposite surface of the principal surface;

forming a first trench at a first region of the semiconductor substrate and a second trench at a second region of the semiconductor substrate remote from the first region, each of the first trench and the second trench extending in the semiconductor substrate form the principal surface in a perpendicular direction with respect to the principal surface;

covering the principal surface of the semiconductor substrate with a mask exposing the first trench from an opening of the mask while covering the second trench;

forming a second conductivity type base region in the first trench by diffusing a second conductivity type impurity into the semiconductor substrate from the first trench, through the mask;

removing the mask;

forming a first conductivity type source region by filling up the first trench with a first conductivity type semiconductor, and forming a first conductivity type drain region by filling up the second trench with the first conductivity type semiconductor;

forming a third trench in the semiconductor substrate to penetrate the base region from the source region and to extend from the principal surface in the perpendicular direction;

forming a gate insulating film in the third trench;

forming a gate electrode on the gate insulating film to fill up the third trench;

forming a source electrode electrically connected to the source region and the base region; and forming a drain electrode electrically connected to the drain region.

3. A method for manufacturing a semiconductor device, comprising:

preparing a semiconductor substrate having a principal surface and a back surface being an opposite surface of the principal surface;

forming a first trench at a first region of the semiconductor substrate and a second trench at a second region of the semiconductor substrate remote from the first region, each of the first trench and the second trench extending in the semiconductor substrate form the principal surface in a perpendicular direction with respect to the principal surface;

covering the principal surface of the semiconductor substrate with a mask exposing the second trench from an opening of the mask while covering the first trench;

forming a first conductivity type drift region in the semiconductor substrate by diffusing a first conductivity type impurity into the semiconductor substrate from the second trench, through the mask;

removing the mask;

forming a first conductivity type source region by filling up the first trench with a first conductivity type semiconductor, and forming a first conductivity type drain region by filling up the second trench with the first conductivity type semiconductor;

forming a third trench in the semiconductor substrate to penetrate the base region from the source region and to extend from the principal surface in the perpendicular direction;

forming a gate insulating film in the third trench;

forming a gate electrode on the gate insulating film to fill up the third trench;

forming a source electrode electrically connected to the source region and the base region; and forming a drain electrode electrically connected to the drain region.

4. A method for manufacturing a semiconductor device, comprising:

preparing a first conductivity type semiconductor substrate having a principal surface and a back surface at an opposite side of the principal surface;

forming a first trench in the semiconductor substrate, the first trench extending in the semiconductor substrate from the principal surface in a perpendicular direction with respect to the principal surface;

forming a drift formation film constituting a first conductivity type drift region, in the first trench such that the drift formation film covers an inner wall of the first trench and has a recess;

forming a base formation film constituting a second conductivity type base region in the recess of the drift formation film such that the base formation film covers the drift region in the trench and has a recess;

forming a source formation film constituting a first conductivity type source region such that the source formation film covers the base region in the trench;

flattening the drift formation film, the base formation film, and the source formation film;

forming a second trench in the semiconductor substrate, the second trench passing through the base region from the source region and extending from the principal surface in the perpendicular direction;

forming a gate insulating film in the second trench;

forming a gate electrode on a surface of the gate insulating film;

forming a source electrode electrically connected to the source region and the base region; and forming drain electrode electrically connected to the drain region.

5. A method for manufacturing a semiconductor device, comprising:

preparing a first conductivity type semiconductor substrate having a principal surface and a back surface at an opposite side of the principal surface;

forming a first trench in the semiconductor substrate, the first trench extending in the semiconductor substrate from the principal surface in a perpendicular direction with respect to the principal surface;

forming a drift formation film constituting a first conductivity type drift region, in the first trench such that the drift formation film covers an inner wall of the first trench and has a recess;

forming a second conductivity type base region at a surface portion of the drift region by doping a second conductivity type impurity into the surface portion of the drift region in the trench;

forming a source formation film constituting a first conductivity type source region such that the source formation film covers the base region in the trench;

flattening the drift formation film and the source formation film;

forming a second trench in the semiconductor substrate, the second trench passing through the base region from the source region base and extending from the principal surface in the perpendicular direction;

forming a gate insulating film in the second trench;

forming a gate electrode on a surface of the gate insulating film;

forming a source electrode electrically connected to the source region and the base region; and forming drain electrode electrically connected to the drain region.

6. A method for manufacturing a semiconductor device, comprising:

preparing a first conductivity type semiconductor substrate having a principal surface and a back surface at an opposite side of the principal surface;

forming a first trench in the semiconductor substrate, the first trench extending in the semiconductor substrate from the principal surface in a perpendicular direction with respect to the principal surface;

forming a drift region by doping a second conductivity type impurity into the semiconductor substrate from an inner wall of the first trench;

forming a base region in the drift region by doping the second conductivity type impurity from the inner wall of the first trench;

forming a source formation film constituting a first conductivity type source region such that the source formation film covers the base region in the trench;

flattening the source formation film;

forming a second trench in the semiconductor substrate, the second trench passing through the base region from the source region base and extending from the principal surface in the perpendicular direction;

forming a gate insulating film in the second trench;

forming a gate electrode on a surface of the gate insulating film;

forming a source electrode electrically connected to the source region and the base region; and forming drain electrode electrically connected to the drain region.

7. A method for manufacturing a semiconductor device, comprising:

preparing a first conductivity type semiconductor substrate having a principal surface and a back surface at an opposite side of the principal surface;

forming a first trench in the semiconductor substrate, the first trench extending in the semiconductor substrate from the principal surface in a perpendicular direction with respect to the principal surface;

forming a drift region by doping a second conductivity type impurity into the semiconductor substrate from an inner wall of the first trench;

forming a base formation film constituting a second conductivity base region, the base formation film covering the drift region in the first trench and having a recess corresponding to the first trench;

forming a source formation film constituting a first conductivity type source region such that the source formation film covers the base region in the trench;

flattening the base formation film and the source formation film;

forming a second trench in the semiconductor substrate, the second trench passing through the base region from the source region base and extending from the principal surface in the perpendicular direction;

forming a gate insulating film in the second trench;

forming a gate electrode on a surface of the gate insulating film;

forming a source electrode electrically connected to the source region and the base region; and forming drain electrode electrically connected to the drain region.

8. The method according to any one of claims 4 to 7, wherein the semiconductor substrate is a (110) substrate.

9. The method according to any one of claims 4 to 7, further comprising:

forming a third trench in one of the source region and the drain region, the third trench extending from the principal surface of the semiconductor substrate in the perpendicular direction; and forming a resistance lowering layer in the third trench.

* * * * *